(12) United States Patent
Tochishita et al.

(10) Patent No.: US 11,333,723 B2
(45) Date of Patent: May 17, 2022

(54) MAGNETIC SENSOR

(71) Applicant: Murata Manufacturing Co., Ltd., Nagaokakyo (JP)

(72) Inventors: Hikari Tochishita, Nagaokakyo (JP); Masashi Tsubokawa, Nagaokakyo (JP); Hiroki Tsutsumi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 85 days.

(21) Appl. No.: 16/891,243

(22) Filed: Jun. 3, 2020

(65) Prior Publication Data

US 2020/0292637 A1 Sep. 17, 2020

Related U.S. Application Data

(63) Continuation of application No. PCT/JP2018/043607, filed on Nov. 27, 2018.

(30) Foreign Application Priority Data

Dec. 4, 2017 (JP) .............................. JP2017-232855

(51) Int. Cl.
*G01R 33/09* (2006.01)
*G01R 33/00* (2006.01)

(52) U.S. Cl.
CPC ....... *G01R 33/096* (2013.01); *G01R 33/0023* (2013.01)

(58) Field of Classification Search
CPC .............. G01R 33/096; G01R 33/0023; G01R 33/011; G01R 33/0076; G01R 33/0082; G01R 33/09; H01L 43/08
See application file for complete search history.

(56) References Cited

U.S. PATENT DOCUMENTS

2009/0309590 A1 12/2009 Kataoka et al.
2016/0276577 A1 9/2016 Ebihara
(Continued)

FOREIGN PATENT DOCUMENTS

JP 2003-130895 A 5/2003
JP 2007-263951 A 10/2007
(Continued)

OTHER PUBLICATIONS

Official Communication issued in International Patent Application No. PCT/JP2018/043607, dated Feb. 12, 2019.

*Primary Examiner* — Tung X Nguyen
*Assistant Examiner* — Feba Pothen
(74) *Attorney, Agent, or Firm* — Keating & Bennett, LLP

(57) ABSTRACT

A first conductor includes a first base section and a first narrow section. The area of the exterior surface of the first narrow section as viewed from a direction perpendicular or substantially perpendicular to an insulating layer is smaller than that of the first base section. The first base section and the first narrow section are provided side by side in the direction perpendicular or substantially perpendicular to the insulating layer. A stress relaxer including a material different from that of the first conductor is provided in a region which is surrounded by the exterior surface of the first narrow section and also by the exterior surface of the first base section, as viewed from the direction perpendicular or substantially perpendicular to the insulating layer.

19 Claims, 30 Drawing Sheets

(56) References Cited

U.S. PATENT DOCUMENTS

| | | | |
|---|---|---|---|
| 2017/0074947 A1* | 3/2017 | Mori | G01R 33/09 |
| 2017/0108558 A1* | 4/2017 | Mori | G01R 33/09 |
| 2017/0271401 A1 | 9/2017 | Kishi et al. | |
| 2017/0341934 A1 | 11/2017 | Stringer et al. | |
| 2017/0343622 A1 | 11/2017 | Mazotti et al. | |
| 2018/0351083 A1* | 12/2018 | Sasaki | H01L 29/82 |

FOREIGN PATENT DOCUMENTS

| | | |
|---|---|---|
| JP | 2010-159982 A | 7/2010 |
| JP | 2013-044641 A | 3/2013 |
| JP | 2015-118067 A | 6/2015 |
| JP | 2016-125901 A | 7/2016 |
| JP | 2016-173317 A | 9/2016 |
| JP | 2017-166925 A | 9/2017 |
| WO | 2007/119569 A1 | 10/2007 |
| WO | 2015/182365 A1 | 12/2015 |
| WO | 2016/013345 A1 | 1/2016 |

* cited by examiner

MAGNETIC SENSOR

CROSS REFERENCE TO RELATED APPLICATIONS

This application claims the benefit of priority to Japanese Patent Application No. 2017-232855 filed on Dec. 4, 2017 and is a Continuation Application of PCT Application No. PCT/JP2018/043607 filed on Nov. 27, 2018. The entire contents of each application are hereby incorporated herein by reference.

BACKGROUND OF THE INVENTION

1. Field of the Invention

The present invention relates to a magnetic sensor, and more particularly, to a magnetic sensor including magnetoresistance elements.

2. Description of the Related Art

Examples of the related art that disclose a magnetic sensor are Japanese Unexamined Patent Application Publication No. 2013-44641, International Publication No. 2015/182365, International Publication No. 2016/013345, International Publication No. 2007/119569, and Japanese Unexamined Patent Application Publication No. 2017-166925.

The magnetic sensor disclosed in Japanese Unexamined Patent Application Publication No. 2013-44641 includes first through fourth magnetoresistance elements formed in a meandering shape and connected with each other to form a bridge circuit. The surfaces of the first through fourth magnetoresistance elements are covered with an insulating film. A magnetic-flux converging film including a magnetic material is formed on the surfaces of the third and fourth magnetoresistance elements, which are fixed resistors, with the insulating film provided therebetween.

The magnetic sensors disclosed in International Publication No. 2015/182365 and International Publication No. 2016/013345 each include first and second magnetoresistance elements. The rate of a change in the resistance of the second magnetoresistance element is smaller than that of the first magnetoresistance element. The first magnetoresistance element, which is a magneto-sensitive element, includes concentrically provided patterns.

The magnetic sensor disclosed in International Publication No. 2007/119569 includes a semiconductor substrate and a magnet. The semiconductor substrate includes multiple Hall elements. The magnet has a magnetism amplifying function provided on the semiconductor substrate. An underlying layer, which serves as a base of the magnet, is provided on the semiconductor substrate. The coefficient of thermal expansion of the underlying layer is different from that of the multiple Hall elements. The underlying layer is large enough to at least partially cover a region where the multiple Hall elements are provided. The area of the magnet is larger than that of the underlying layer.

The magnetic sensor disclosed in Japanese Unexamined Patent Application Publication No. 2017-166925 includes a semiconductor substrate and a magnet. The semiconductor substrate includes multiple Hall elements. The magnet has a magnetic-flux converging function provided on the semiconductor substrate. An outer peripheral section of the magnet on the semiconductor substrate defines the exterior surface of the magnet in a longitudinal section. The outer peripheral section at least partially includes a curved portion and a portion substantially parallel with the semiconductor substrate. At least a portion of a structure including a non-magnetic material is embedded in the magnet.

In the magnetic sensor disclosed in Japanese Unexamined Patent Application Publication No. 2013-44641, each of the first and second magnetoresistance elements, which are magneto-sensitive elements, includes a meandering pattern. This decreases the isotropic characteristics in detecting a horizontal magnetic field.

In each of the magnetic sensors disclosed in International Publication No. 2015/182365 and International Publication No. 2016/013345, the first magnetoresistance element includes concentrically provided patterns. Because of this configuration, the magnetic sensors exhibit high isotropic characteristics in detecting a horizontal magnetic field. However, they are unable to detect a weak vertical magnetic field.

The magnetic sensors disclosed in International Publication No. 2007/119569 and Japanese Unexamined Patent Application Publication No. 2017-166925 are magnetic sensors including Hall elements, and are not intended to detect a horizontal magnetic field and a vertical magnetic field by using magnetoresistance elements.

SUMMARY OF THE INVENTION

Preferred embodiments of the present invention provide magnetic sensors each of which provide high isotropic characteristics in detecting a horizontal magnetic field and are also able to detect a weak vertical magnetic field by using magnetoresistance elements and also to regulate a decrease in the output accuracy, which would be caused by a stress applied to the magnetoresistance elements from a structure provided above the magnetoresistance elements.

A magnetic sensor according to a preferred embodiment of the present invention includes a magneto-sensitive element, an insulating layer, a first conductor, a first magnet, and a member. The insulating layer covers the magneto-sensitive element. The first conductor is provided on the insulating layer. The first magnet is provided on the first conductor and covers the first conductor, as viewed from a direction perpendicular or substantially perpendicular to the insulating layer. The member is provided along a portion of the first conductor and includes a material different from that of the first conductor. The first conductor includes a first base section and a first narrow section. The area of the exterior surface of the first narrow section as viewed from the direction perpendicular or substantially perpendicular to the insulating layer is smaller than that of the first base section. The first base section and the first narrow section are provided side by side in the direction perpendicular or substantially perpendicular to the insulating layer. The member, which includes a material different from that of the first conductor, is provided in a region which is surrounded by the exterior surface of the first narrow section and also by the exterior surface of the first base section, as viewed from the direction perpendicular or substantially perpendicular to the insulating layer.

In a preferred embodiment of the present invention, in the direction perpendicular or substantially perpendicular to the insulating layer, the first narrow section of the first conductor is provided at an end portion of the first conductor closer to the insulating layer. The member, which includes a material different from that of the first conductor, is provided between the first base section and the insulating layer.

In a preferred embodiment of the present invention, in the direction perpendicular or substantially perpendicular to the insulating layer, the first narrow section of the first conductor is provided at an end portion of the first conductor closer to the first magnet. The member, which includes a material different from that of the first conductor, is provided between the first base section and the first magnet.

In a preferred embodiment of the present invention, in the direction perpendicular or substantially perpendicular to the insulating layer, the first base section of the first conductor is provided at an end portion of the first conductor closer to the insulating layer and is also provided at an end portion of the first conductor closer to the first magnet. In the direction perpendicular or substantially perpendicular to the insulating layer, the first narrow section of the first conductor is sandwiched between the first base sections of the first conductor. The member, which includes a material different from that of the first conductor, is sandwiched between the first base sections.

In a preferred embodiment of the present invention, the member, which includes a material different from that of the first conductor, is a stress relaxer.

In a preferred embodiment of the present invention, a first magnetoresistance element is provided as the magneto-sensitive element. The magnetic sensor further includes a second magnetoresistance element that is electrically connected to the first magnetoresistance element to define a bridge circuit. The second magnetoresistance element is covered by the insulating layer.

In a preferred embodiment of the present invention, the magneto-sensitive element has an outer peripheral edge. The first magnet is provided in a region farther inward than the outer peripheral edge of the magneto-sensitive element, as viewed from the direction perpendicular or substantially perpendicular to the insulating layer.

In a preferred embodiment of the present invention, the first magnetoresistance element also has an inner peripheral edge. The second magnetoresistance element is provided in a region farther inward than the inner peripheral edge of the first magnetoresistance element and is covered by the first magnet, as viewed from the direction perpendicular or substantially perpendicular to the insulating layer.

In a preferred embodiment of the present invention, the magnetic sensor further includes a second conductor and a second magnet. The second conductor is provided on the insulating layer and is different from the first conductor, as viewed from the direction perpendicular or substantially perpendicular to the insulating layer. The second magnet is provided on the second conductor and covers the second conductor, as viewed from the direction perpendicular or substantially perpendicular to the insulating layer. The second magnet is different from the first magnet. The second magnetoresistance element is provided in a region farther outward than the outer peripheral edge of the first magnetoresistance element and is covered by the second magnet.

In a preferred embodiment of the present invention, the second conductor includes a second base section and a second narrow section. The area of the exterior surface of the second narrow section as viewed from the direction perpendicular or substantially perpendicular to the insulating layer is smaller than that of the second base section. In the second conductor, the second base section and the second narrow section are provided side by side in the direction perpendicular or substantially perpendicular to the insulating layer.

In a preferred embodiment of the present invention, in the direction perpendicular or substantially perpendicular to the insulating layer, the second narrow section of the second conductor is provided at an end portion of the second conductor closer to the insulating layer.

In a preferred embodiment of the present invention, in the direction perpendicular or substantially perpendicular to the insulating layer, the second narrow section of the second conductor is provided at an end portion of the second conductor closer to the second magnet.

In a preferred embodiment of the present invention, in the direction perpendicular or substantially perpendicular to the insulating layer, the second base section of the second conductor is provided at an end portion of the second conductor closer to the insulating layer and is also provided at an end portion of the second conductor closer to the second magnet. In the direction perpendicular or substantially perpendicular to the insulating layer, the second narrow section of the second conductor is sandwiched between the second base sections of the second conductor.

A magnetic sensor according to a preferred embodiment of the present invention includes a magneto-sensitive element, an insulating layer, a first magnet, and a stress relaxer. The insulating layer covers the magneto-sensitive element. The first magnet is provided on the insulating layer. The stress relaxer is provided along a portion of the first magnet and includes a material different from that of the first magnet. The magneto-sensitive element has an outer peripheral edge. The first magnet is provided in a region farther inward than the outer peripheral edge of the magneto-sensitive element, as viewed from a direction perpendicular or substantially perpendicular to the insulating layer. The first magnet includes a first base section and a first narrow section. The area of the exterior surface of the first narrow section as viewed from the direction perpendicular or substantially perpendicular to the insulating layer is smaller than that of the first base section. In the first magnet, the first base section and the first narrow section are provided side by side in the direction perpendicular or substantially perpendicular to the insulating layer. In the direction perpendicular or substantially perpendicular to the insulating layer, the first narrow section of the first magnet is provided at an end portion of the first magnet closer to the insulating layer. As viewed from the direction perpendicular or substantially perpendicular to the insulating layer, the stress relaxer is provided in a region which is surrounded by the exterior surface of the first narrow section and also by the exterior surface of the first base section, and is provided between the first base section and the insulating layer.

In a preferred embodiment of the present invention, a first magnetoresistance element is provided as the magneto-sensitive element. The magnetic sensor further includes a second magnetoresistance element. The second magnetoresistance element is electrically connected to the first magnetoresistance element to define a bridge circuit. The second magnetoresistance element is covered by the insulating layer.

In a preferred embodiment of the present invention, the first magnetoresistance element also has an inner peripheral edge. As viewed from the direction perpendicular or substantially perpendicular to the insulating layer, the second magnetoresistance element is provided in a region farther inward than the inner peripheral edge of the first magnetoresistance element and is covered by the first magnet.

In a preferred embodiment of the present invention, the magnetic sensor further includes a second magnet. The second magnet is provided on the insulating layer and is different from the first magnet. The second magnetoresistance element is provided in a region farther outward than the outer peripheral edge of the first magnetoresistance element and is covered by the second magnet.

In a preferred embodiment of the present invention, as viewed from the direction perpendicular or substantially perpendicular to the insulating layer, at least a portion of the first magnetoresistance element is located in at least a portion of the area from a position separated inward from the outer peripheral edge of the first magnet by about 2 μm to a position separated outward from the outer peripheral edge of the first magnet by y μm defined by the following expression (I):

$$y=-0.0008x^2+0.2495x+6.6506 \qquad (I)$$

where the thickness of the first magnetoresistance element is x μm.

In a preferred embodiment of the present invention, the first magnet is provided concentrically with the outer peripheral edge of the first magnetoresistance element, as viewed from the direction perpendicular or substantially perpendicular to the insulating layer.

In a preferred embodiment of the present invention, the second magnetoresistance element is provided in a region farther inward than the inner peripheral edge of the first magnetoresistance element and is covered by the first magnet, as viewed from the direction perpendicular or substantially perpendicular to the insulating layer. The first magnet is provided in a region including the inner peripheral edge of the first magnetoresistance element and the area inward of the inner peripheral edge, as viewed from the direction perpendicular or substantially perpendicular to the insulating layer.

In a preferred embodiment of the present invention, the second magnetoresistance element is provided in a region farther inward than the inner peripheral edge of the first magnetoresistance element and is covered by the first magnet, as viewed from the direction perpendicular or substantially perpendicular to the insulating layer. The first magnet does not cover the first magnetoresistance element, but covers the second magnetoresistance element, as viewed from the direction perpendicular or substantially perpendicular to the insulating layer.

In a preferred embodiment of the present invention, the second magnetoresistance element is located in the area from the center of the first magnet to the position separated inward from the outer peripheral edge of the first magnet by about 7 μm, as viewed from the direction perpendicular or substantially perpendicular to the insulating layer.

In a preferred embodiment of the present invention, the second magnetoresistance element is provided in a region farther outward than the outer peripheral edge of the first magnetoresistance element and is covered by the second magnet, as viewed from the direction perpendicular or substantially perpendicular to the insulating layer. The first magnet covers only a portion of the first magnetoresistance element among the first and the second magnetoresistance elements, as viewed from the direction perpendicular or substantially perpendicular to the insulating layer.

In a preferred embodiment of the present invention, the second magnet does not cover the first magnetoresistance element, but covers the second magnetoresistance element, as viewed from the direction perpendicular or substantially perpendicular to the insulating layer.

In a preferred embodiment of the present invention, the second magnetoresistance element is located in the area from the center of the second magnet to the position separated inward from the outer peripheral edge of the second magnet by about 7 μm, as viewed from the direction perpendicular or substantially perpendicular to the insulating layer.

In a preferred embodiment of the present invention, the first magnetoresistance element includes multiple first patterns that are concentrically provided and are connected with each other, as viewed from the direction perpendicular or substantially perpendicular to the insulating layer.

According to preferred embodiments of the present invention, high isotropic characteristics in detecting a horizontal magnetic field are able to be provided, a weak vertical magnetic field is able to be detected by magnetoresistance elements, and also a decrease in the output accuracy of a magnetic sensor, which would be caused by a stress applied to the magnetoresistance elements from a structure provided above the magnetoresistance elements, is able to be regulated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
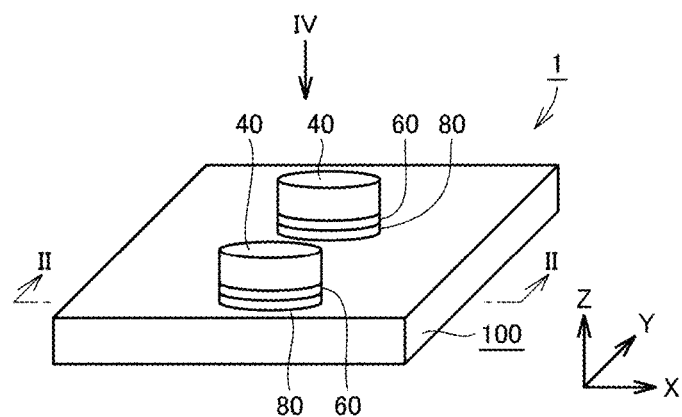
FIG. 1 is a perspective view showing a magnetic sensor according to a first preferred embodiment of the present invention.

Magnetic sensors according to preferred embodiments of the present invention will be described below with reference to the drawings. In the following description of the preferred embodiments, the same element or associated elements shown in the drawings are designated by like reference numeral, and an explanation thereof will not be repeated.

First Preferred Embodiment

Figure 2:
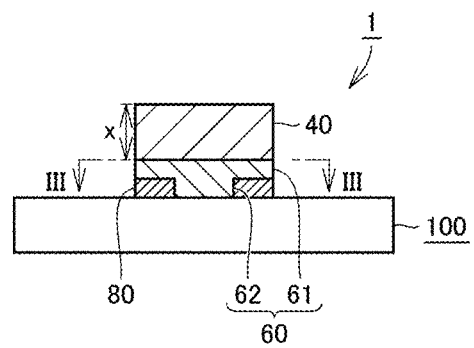
FIG. 2 is a sectional view of the magnetic sensor in FIG. 1, as viewed from the direction indicated by the arrow of line II-II in FIG. 1.
Figure 3:
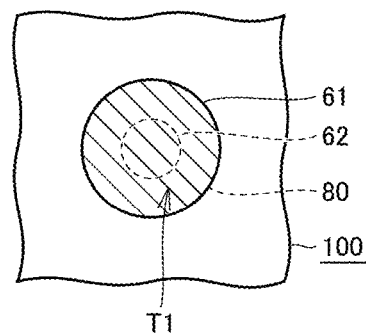
FIG. 3 is a sectional view of the magnetic sensor in FIG. 2, as viewed from the direction indicated by the arrow of line in FIG. 2.
Figure 4:
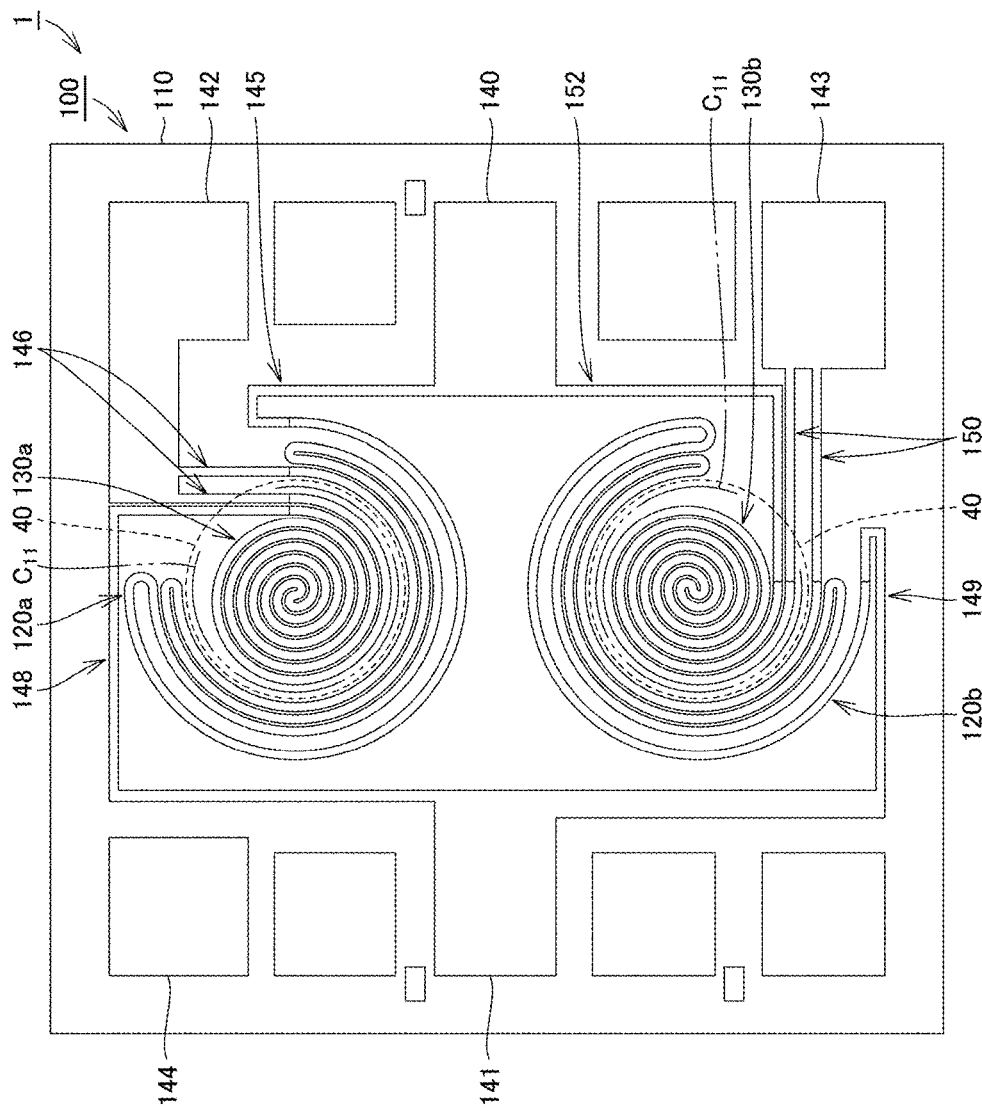
FIG. 4 is a plan view of the magnetic sensor in FIG. 1, as viewed from the direction indicated by the arrow IV in FIG. 1.
Figure 5:
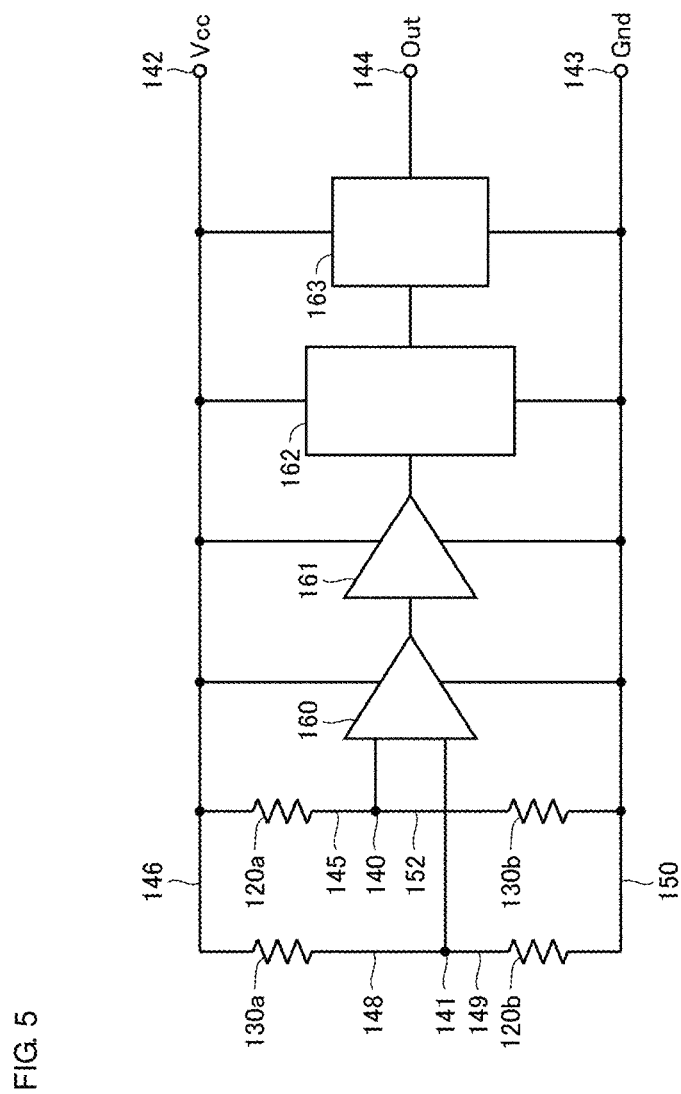
FIG. 5 is an equivalent circuit diagram of the magnetic sensor according to the first preferred embodiment of the present invention.

FIG. 1 is a perspective view showing a magnetic sensor according to a first preferred embodiment of the present invention. FIG. 2 is a sectional view of the magnetic sensor in FIG. 1, as viewed from the direction indicated by the arrow of line II-II in FIG. 1. FIG. 3 is a sectional view of the magnetic sensor in FIG. 2, as viewed from the direction indicated by the arrow of line III-III in FIG. 2. FIG. 4 is a plan view of the magnetic sensor in FIG. 1, as viewed from the direction indicated by the arrow IV in FIG. 1. FIG. 5 is an equivalent circuit diagram of the magnetic sensor according to the first preferred embodiment of the present invention.

In FIG. 1, the widthwise direction of a circuit substrate 100, which will be discussed later, is the X-axis direction, the longitudinal direction thereof is the Y-axis direction, and the thickness direction thereof is the Z-axis direction. In FIG. 4, the outer edges of first magnets, which will be discussed later, are indicated by dotted lines. In FIG. 4, some elements, for example, a differential amplifier and a temperature compensation circuit, which will be discussed later, are not shown.

As shown in FIGS. 1 through 4, a magnetic sensor 1 according to the first preferred embodiment of the present invention includes the circuit substrate 100 and two first magnets 40 provided above the circuit substrate 100. In the magnetic sensor 1 according to the first preferred embodiment of the present invention, two first conductors 60 are provided on the circuit substrate 100. A first stress relaxer 80 is provided along a portion of each of the first conductors 60. An insulating layer 30 is provided on the front layer of the circuit substrate 100, and the two first conductors 60 and the first stress relaxers 80 are located on the insulating layer 30, as will be described. The circuit substrate 100 includes a semiconductor substrate 110.

Each of the first conductors 60 includes a first base section 61 and a first narrow section 62. The area of the exterior surface of the first narrow section 62 as viewed from the Z-axis direction, which is perpendicular or substantially perpendicular to the insulating layer 30, is smaller than that of the first base section 61. In the first conductor 60, the first base section 61 and the first narrow section 62 are provided side by side in the Z-axis direction, which is perpendicular or substantially perpendicular to the insulating layer 30. In the present preferred embodiment, the first narrow section 62 of the first conductor 60 is located at the end portion of the first conductor 60 closer to the insulating layer 30 in the Z-axis direction, which is perpendicular or substantially perpendicular to the insulating layer 30. That is, the first narrow section 62 of the first conductor 60 contacts the insulating layer 30 on the circuit substrate 100.

As viewed from the Z-axis direction, which is perpendicular or substantially perpendicular to the insulating layer 30, the exterior surface of each of the first base section 61 and the first narrow section 62 is circular or substantially circular, for example. The diameter of the exterior surface of the first narrow section 62 is smaller than that of the first base section 61. The first base section 61 and the first narrow section 62 are provided substantially coaxially. The first base section 61 is not restricted to the above-described shape and may have an elliptical or polygonal shape, for example, as viewed from the direction perpendicular or substantially perpendicular to the insulating layer 30. The first narrow section 62 is not restricted to the above-described shape and may have any shape if the area of the exterior surface as viewed from the Z-axis direction, which is perpendicular or substantially perpendicular to the insulating layer 30, is smaller than that of the first base section 61.

The first narrow section 62 in the first conductor 60 defines a gap partially between the first base section 61 and the insulating layer 30. In the first preferred embodiment, the gap is provided between the first base section 61 and the insulating layer 30 all around the outer peripheral portion of the first conductor 60. The first stress relaxer 80 is provided in this gap.

The two first magnets 40 are located on the two first conductors 60 in a one-on-one relationship. The first magnets 40 cover the associated first conductors 60, as viewed from the Z-axis direction, which is perpendicular or substantially perpendicular to the insulating layer 30.

With a view to decreasing the distance between each first magnet 40 and the circuit substrate 100, the thickness of the first conductor 60 in the Z-axis direction, that is, the total thickness of the first base section 61 and the first narrow section 62 in the Z-axis direction, is preferably about 2.0 μm or smaller, for example. As the distance between the first magnet 40 and the circuit substrate 100 is smaller, the magnetic shielding function of the first magnet 40, which will be discussed later, is able to be provided more effectively. To form the first conductor 60, patterning with a resist, for example, may be utilized.

In the first preferred embodiment, the first conductor is positioned on the insulating layer 30 and is preferably defined by, for example, a layer including titanium (Ti) and a layer including gold (Au) in this order from the bottom. The layer including titanium (Ti) is a contact layer. If the first magnet 40 is formed with electrolytic plating, the layer including gold (Au) defines and functions as an electrode reaction layer, that is, a seed layer. The first conductor 60 is not limited to the above-described features, and may include a layer including, for example, at least one of iron (Fe), molybdenum (Mo), tantalum (Ta), platinum (Pt), and copper (Cu), which are materials defining and functioning as a plating seed layer. If the first magnet 40 is formed by a method other than plating, for example, by vapor-deposition, the first conductor 60 may be defined by a conductor including at least one of a metal or a resin, for example.

Each of the first stress relaxers 80 is provided in a region T1 which is surrounded by the exterior surface of the first narrow section 62 and also by the exterior surface of the first base section 61, as viewed from the Z-axis direction, which is perpendicular or substantially perpendicular to the insulating layer 30. In the first preferred embodiment, the first stress relaxer 80 is sandwiched between the first base section 61 and the insulating layer 30. The first stress relaxer 80 is located immediately under the outer peripheral portion of the first base section 61. As viewed from the Z-axis direction, which is perpendicular or substantially perpendicular to the insulating layer 30, the first stress relaxer 80 has a ring shape. The first stress relaxer 80 is not limited to this shape and may have an elliptical ring shape or a polygonal ring shape in horizontal cross section. To form the first stress relaxer 80, patterning with a resist, for example, may be utilized.

The first stress relaxer 80 is made of a material different from that of the first conductor 60. As the material of the first stress relaxer 80, at least one of, for example, a material having a lower adhesiveness, a material having a lower elastic modulus, and a material having a lower tensile strength than the material of the first conductor 60 is able to be used. The adhesiveness is the adhesiveness of the first stress relaxer 80 with an adjacent component or element. In the first preferred embodiment, the adhesiveness is that of the first stress relaxer 80 with the insulating layer 30.

If the first stress relaxer 80 includes a material having a low adhesiveness, a layer including a low-adhesiveness material is provided in contact with the insulating layer 30. The material of the first stress relaxer 80 having a lower adhesiveness than that of the first conductor 60 is preferably, for example, gold (Au) or polyimide. For example, the first conductor 60 may be defined by a layer including titanium (Ti) on the insulating layer 30 and a layer including gold (Au) on the layer including titanium (Ti). The first stress relaxer 80 is defined only by a layer including gold (Au).

The material of the first stress relaxer 80 having an elastic modulus lower than that of the first conductor 60 is preferably a resin, for example, polyimide. The material of the first stress relaxer 80 having a tensile strength lower than that of the first conductor 60 is preferably $SiO_2$ or a low-density resin, for example. To form the first stress relaxer 80 including $SiO_2$, SOG (Spin-on Glass) may be applied onto the insulating layer 30.

As shown in FIGS. 4 and 5, four magnetoresistance elements electrically connected with each other by wiring to define a Wheatstone bridge circuit are provided on the circuit substrate 100 of the magnetic sensor 1 according to the first preferred embodiment of the present invention. The four magnetoresistance elements are defined by two pairs of first magnetoresistance elements and second magnetoresistance elements. More specifically, the magnetic sensor 1 includes first and second magnetoresistance elements 120a and 130a and first and second magnetoresistance elements 120b and 130b. The first and second magnetoresistance elements 120a and 130a define one pair. The first and second magnetoresistance elements 120b and 130b define the other pair.

In the first preferred embodiment, the magnetic sensor preferably includes two pairs of first and second magnetoresistance elements. However, this is only an example. It is sufficient if the magnetic sensor 1 includes at least one pair of first and second magnetoresistance elements. If the magnetic sensor 1 includes one pair of first and second magnetoresistance elements, a half bridge circuit is provided on the circuit substrate 100.

Each of the first magnetoresistance elements 120a and 120b and the second magnetoresistance elements 130a and 130b is preferably an AMR (Anisotropic Magneto Resistance) element, for example. Instead of the AMR element, each of the first magnetoresistance elements 120a and 120b and the second magnetoresistance elements 130a and 130b may be another magnetoresistance element, for example, a GMR (Giant Magneto Resistance) element, a TMR (Tunnel Magneto Resistance) element, a BMR (Ballistic Magneto Resistance) element, or a CMR (Colossal Magneto Resistance) element.

The second magnetoresistance element 130a is magnetically shielded by the first magnet 40 and hardly detects a magnetic field in the Z-axis direction (vertical magnetic field) and a magnetic field in the X-axis and Y-axis directions (horizontal magnetic field). That is, the second magnetoresistance element 130a is a fixed resistor. This will be discussed later. The first magnetoresistance element 120a is a magneto-sensitive resistor whose electrical resistance changes in response to the application of an external magnetic field. That is, the first magnetoresistance element 120a defines and functions as a magneto-sensitive element, and the second magnetoresistance element 130a does not define or function as a magneto-sensitive element. The resistance change rate of the second magnetoresistance element 130a in response to an external magnetic field is preferably lower than that of the first magnetoresistance element 120a, for example.

Similarly, the second magnetoresistance element 130b is magnetically shielded by the first magnet 40 and hardly detects a magnetic field in the Z-axis direction (vertical magnetic field) and a magnetic field in the X-axis and Y-axis directions (horizontal magnetic field). That is, the second magnetoresistance elements 130b is a fixed resistor. This will be discussed later. The first magnetoresistance element 120b is a magneto-sensitive resistor whose electrical resistance changes in response to the application of an external magnetic field. That is, the first magnetoresistance element 120b defines and functions as a magneto-sensitive element, and the second magnetoresistance element 130b does not define or function as a magneto-sensitive element. The resistance change rate of the second magnetoresistance element 130b in response to an external magnetic field is preferably lower than that of the first magnetoresistance element 120b, for example.

The first magnetoresistance elements 120a and 120b and the second magnetoresistance elements 130a and 130b are electrically connected with each other by wiring provided on the semiconductor substrate 110. More specifically, the first and second magnetoresistance elements 120a and 130a are connected in series with each other by wiring 146, while the first and second magnetoresistance elements 120b and 130b are connected in series with each other by wiring 150.

On the semiconductor substrate 110 of the circuit substrate 100, nodes 140 and 141, a power supply terminal (Vcc) 142, a ground terminal (Gnd) 143, and an output terminal (Out) 144 are also provided.

Each of the first and second magnetoresistance elements 120a and 130b is connected to the node 140. More specifically, the first magnetoresistance element 120a is connected to the node 140 by wiring 145, while the second magnetoresistance element 130b is connected to the node 140 by wiring 152.

Each of the first and second magnetoresistance elements 120b and 130a is connected to the node 141. More specifically, the first magnetoresistance element 120b is connected to the node 141 by wiring 149, while the second magnetoresistance element 130a is connected to the node 141 by wiring 148.

The wiring 146 is connected to the power supply terminal (Vcc) 142 into which a current is input. The wiring 150 is connected to the ground terminal (Gnd) 143.

As shown in FIG. 5, the magnetic sensor 1 also includes a differential amplifier 160, a temperature compensation circuit 161, a latch/switch circuit 162, and a CMOS (Complementary Metal Oxide Semiconductor) driver 163. The differential amplifier 160, the temperature compensation circuit 161, the latch/switch circuit 162, and the CMOS driver 163 are provided on the semiconductor substrate 110.

The input terminals of the differential amplifier 160 are connected to the nodes 140 and 141, while the output terminal is connected to the temperature compensation circuit 161. The differential amplifier 160 is also connected to the power supply terminal (Vcc) 142 and the ground terminal (Gnd) 143.

The output terminal of the temperature compensation circuit 161 is connected to the latch/switch circuit 162. The temperature compensation circuit 161 is also connected to the power supply terminal (Vcc) 142 and the ground terminal (Gnd) 143.

The output terminal of the latch/switch circuit 162 is connected to the CMOS driver 163. The latch/switch circuit 162 is also connected to the power supply terminal (Vcc) 142 and the ground terminal (Gnd) 143.

The output terminal of the CMOS driver 163 is connected to the output terminal (Out) 144. The CMOS driver 163 is also connected to the power supply terminal (Vcc) 142 and the ground terminal (Gnd) 143.

With the above-described circuitry of the magnetic sensor 1, a potential difference is generated between the nodes 140 and 141 in accordance with the strength of an external magnetic field. When the potential difference exceeds a preset detection level, a signal is output from the output terminal (Out) 144.

Figure 6:
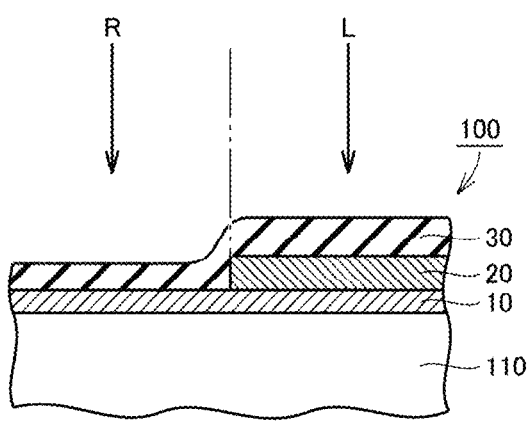
FIG. 6 is a sectional view of a multilayer structure of a connecting portion between magnetoresistance elements and wiring on a circuit substrate of the magnetic sensor according to the first preferred embodiment of the present invention.

FIG. 6 is a sectional view of a multilayer structure of a connecting portion between the magnetoresistance elements and the wiring on the circuit substrate of the magnetic sensor according to the first preferred embodiment of the present invention. In FIG. 6, only the connecting portion between a region R defining and functioning as the magnetoresistance elements and a region L defining and functioning as the wiring is shown.

As shown in FIG. 6, each of the first magnetoresistance elements 120a and 120b and the second magnetoresistance elements 130a and 130b is provided on the semiconductor substrate 110 made of Si, for example, including a $SiO_2$ layer or a $Si_3N_4$ layer on the front surface. The first magnetoresistance elements 120a and 120b and the second magnetoresistance elements 130a and 130b are formed as a result of a magnetic layer 10 including an Ni—Fe alloy provided on the semiconductor substrate 110 being patterned by ion milling. The thickness of the magnetic layer 10 is preferably about 0.04 μm, for example.

The wiring 145, 146, 148, 149, 150, and 152 is formed as a result of a conductive layer 20 including Au or Al, for example, provided on the semiconductor substrate 110 being patterned by wet etching. The conductive layer 20 is positioned immediately on the top of the magnetic layer 10 in the region L defining and functioning as the wiring and is not provided in the region R defining and functioning as the magnetoresistance elements. As shown in FIG. 6, at the connecting portion between the region R defining and functioning as the magnetoresistance elements and the region L defining and functioning as the wiring, the end portion of the conductive layer 20 is positioned immediately on the top of the magnetic layer 10.

The nodes 140 and 141, the power supply terminal (Vcc) 142, the ground terminal (Gnd) 143, and the output terminal (Out) 144 are defined by the conductive layer 20 positioned immediately on the top of the semiconductor substrate 110. That is, each of the nodes 140 and 141, the power supply terminal (Vcc) 142, the ground terminal (Gnd) 143, and the output terminal (Out) 144 is a pad provided on the semiconductor substrate 110.

A Ti layer, for example, which is not shown, is provided immediately on the top of the conductive layer 20. The insulating layer 30 made of $SiO_2$, for example, is provided to cover the magnetic layer 10 and the conductive layer 20. That is, the insulating layer 30 covers the first magnetoresistance elements 120a and 120b and the second magnetoresistance elements 130a and 130b.

Figure 7:
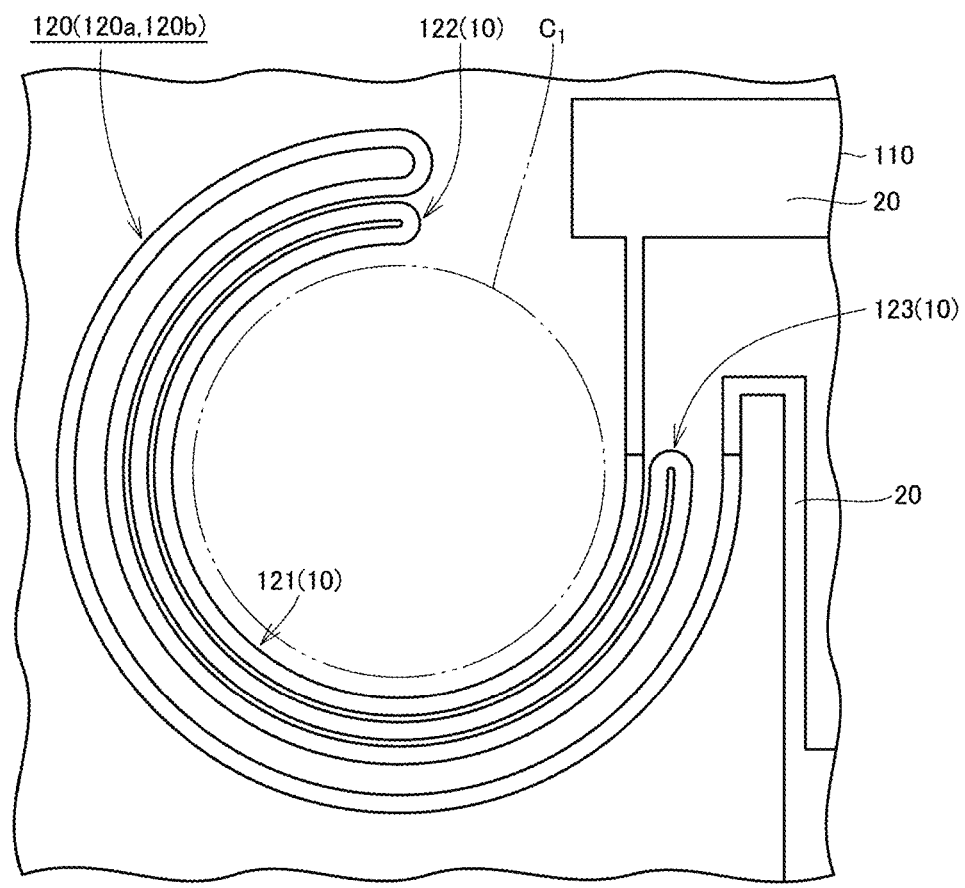
FIG. 7 is a plan view showing a pattern of a first magnetoresistance element of the magnetic sensor according to the first preferred embodiment of the present invention.

FIG. 7 is a plan view showing a pattern of each of the first magnetoresistance elements of the magnetic sensor according to the first preferred embodiment of the present invention. As shown in FIGS. 4 and 7, a pattern 120 of each of the first magnetoresistance elements 120a and 120b includes four first patterns. The four first patterns are provided along the circumference of an imaginary circle $C_1$ and side by side one another in the radial direction of the imaginary circle $C_1$ and are connected with each other, as viewed from a direction perpendicular or substantially perpendicular to the insulating layer 30. The direction perpendicular or substantially perpendicular to the insulating layer 30 is the Z-axis direction and is parallel or substantially parallel with a direction perpendicular or substantially perpendicular to the top surface of the semiconductor substrate 110.

The four first patterns are located along an imaginary C-shaped feature $C_{11}$, which is opened at a portion where the wiring 146, 148, 150, and 152 is positioned, on the circumference of the imaginary circle $C_1$. The four first patterns are C-shaped patterns 121 concentrically provided along the imaginary C-shaped feature $C_{11}$ and side by side one another in the radial direction of the imaginary circle $C_1$.

The four C-shaped patterns 121 are connected with each other alternately at one end and at the other end starting from the central side of the imaginary circle $C_1$. The C-shaped patterns 121 connected with each other at one end are connected with each other by a semi-circular pattern 122. The C-shaped patterns 121 connected with each other at the other end are connected with each other by a semi-circular pattern 123.

The pattern 120 of each of the first magnetoresistance elements 120a and 120b includes two semi-circular patterns 122 and one semi-circular pattern 123. Accordingly, the four C-shaped patterns 121 are connected in series with each other. The semi-circular patterns 122 and 123 do not have any linearly extending portions and are defined only by curved portions.

Among the four C-shaped patterns 121, regarding the C-shaped pattern positioned at the outermost side from the center of the imaginary circle $C_1$, the end portion of this C-shaped pattern which is not connected to the semi-circular pattern 122 is connected to the wiring 145 or 149 defined by the conductive layer 20. Similarly, among the four C-shaped patterns 121, regarding the C-shaped pattern positioned at the innermost side from the center of the imaginary circle $C_1$, the end portion of this C-shaped pattern which is not connected to the semi-circular pattern 122 is connected to the wiring 146 or 150 defined by the conductive layer 20. The position at which the conductive layer 20 is formed, which is the position at which the conductive layer 20 is connected to the end portion of the C-shaped pattern 121, is able to be changed to adjust the electrical resistance of each of the first magnetoresistance elements 120a and 120b.

More specifically, at the connecting portion between the region R defining and functioning as the magnetoresistance elements and the region L defining and functioning as the wiring shown in FIG. 6, the conductive layer 20 extends toward the region R to increase the region L. The electrical resistance of the first magnetoresistance elements 120a and 120b is thus able to be reduced. Conversely, at the connecting portion between the region R defining and functioning as the magnetoresistance elements and the region L defining and functioning as the wiring, the conductive layer 20 retreats toward the region L to decrease the region L. The electrical resistance of the first magnetoresistance elements 120a and 120b is thus able to be increased.

The above-described adjustment of the electrical resistance of the first magnetoresistance elements 120a and 120b is performed by partially removing or adding the conductive layer 20, and is thus preferably done before the insulating layer 30 is formed, for example.

Among the four C-shaped patterns 121, the outer peripheral edge of the C-shaped pattern 121 positioned at the outermost side from the center of the imaginary circle $C_1$ is the outer peripheral edge of each of the first magnetoresistance elements 120a and 120b. Among the four C-shaped patterns 121, the inner peripheral edge of the C-shaped pattern 121 positioned at the innermost side from the center of the imaginary circle $C_1$ is the inner peripheral edge of each of the first magnetoresistance elements 120a and 120b.

As shown in FIG. 4, the orientation of the circumferential direction of the first magnetoresistance element 120a and that of the first magnetoresistance element 120b are different from each other so that the orientations of the two imaginary C-shaped features $C_{11}$ become different. That is, the orientation of the circumferential direction of the pattern 120 of the first magnetoresistance element 120a and that of the first magnetoresistance element 120b are different from each other so that the orientation of the C-shaped patterns 121 of the first magnetoresistance element 120a and that of the first magnetoresistance element 120b become different.

In the first preferred embodiment, the orientation of the circumferential direction of the pattern 120 of the first magnetoresistance element 120a and that of the first magnetoresistance element 120b differ from each other by about 90°, for example, so that the orientation of the C-shaped patterns 121 of the first magnetoresistance element 120a and that of the first magnetoresistance element 120b become different from each other by about 90°.

Figure 8:
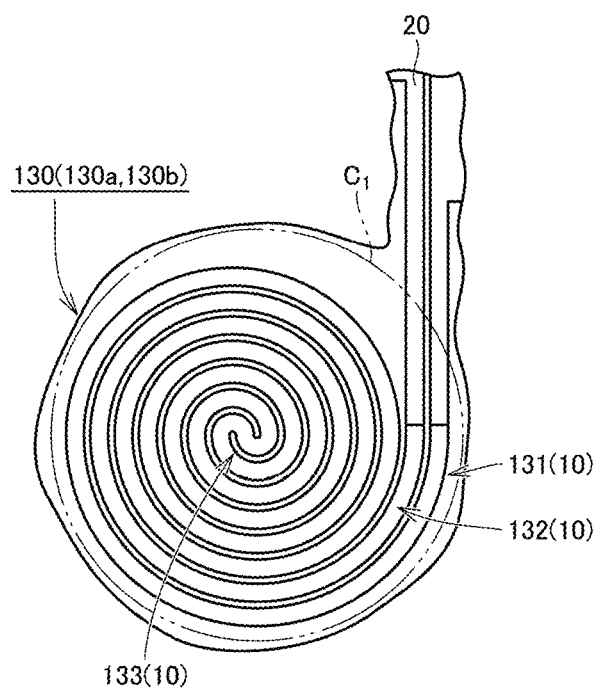
FIG. 8 is a plan view showing a pattern of a second magnetoresistance element of the magnetic sensor according to the first preferred embodiment of the present invention.

FIG. 8 is a plan view showing a pattern of each of the second magnetoresistance elements of the magnetic sensor according to the first preferred embodiment of the present invention. As shown in FIGS. 4 and 8, as viewed from the direction perpendicular or substantially perpendicular to the insulating layer 30, the second magnetoresistance element 130a is positioned at the central side of the imaginary circle $C_1$ and is surrounded by the first magnetoresistance element 120a, while the second magnetoresistance element 130b is positioned at the central side of the imaginary circle $C_1$ and is surrounded by the first magnetoresistance element 120b. That is, as viewed from the direction perpendicular or substantially perpendicular to the insulating layer 30, the second magnetoresistance element 130a is located farther inward than the inner peripheral edge of the first magnetoresistance element 120a, while the second magnetoresistance element 130b is located farther inward than the inner peripheral edge of the first magnetoresistance element 120b.

The second magnetoresistance element 130a is connected to the wiring 146 and 148 defined by the conductive layer 20 provided from the central side of the imaginary circle $C_1$ to the outer side of the imaginary circle $C_1$. The second magnetoresistance element 130b is connected to the wiring 150 and 152 defined by the conductive layer 20 provided from the central side of the imaginary circle $C_1$ to the outer side of the imaginary circle $C_1$.

Each of the second magnetoresistance elements 130a and 130b has a double-spiral pattern 130, as viewed from the direction perpendicular or substantially perpendicular to the insulating layer 30. The double-spiral pattern 130 includes spiral patterns 131 and 132 and a reversed-S-shaped pattern 133. The spiral pattern 131 is one of two second patterns, while the spiral pattern 132 is the other one of the two second patterns. The reversed-S-shaped pattern 133 connects the spiral patterns 131 and 132 at the central portion of the double-spiral pattern 130. The reversed-S-shaped pattern 133 does not have any linearly extending portions and are defined only by curved portions.

The double-spiral pattern 130 has the same or substantially the same thickness as the pattern 120. The spiral patterns 131 and 132 accordingly have the same or substantially the same thickness as each of the four C-shaped patterns 121.

As shown in FIG. 8, the double-spiral pattern 130 is substantially point-symmetrical with respect to the center of the imaginary circle $C_1$. That is, the double-spiral pattern 130 is rotationally symmetrical with respect to the center of the imaginary circle $C_1$ by about 180°.

As shown in FIG. 4, the orientation of the circumferential direction of the double-spiral pattern 130 of the second magnetoresistance element 130a and that of the second magnetoresistance element 130b are different from each other so that the orientation of the reversed-S-shaped pattern 133 of the second magnetoresistance element 130a and that of the second magnetoresistance element 130b become different.

In the first preferred embodiment, the orientation of the circumferential direction of the double-spiral pattern 130 of the second magnetoresistance element 130a and that of the second magnetoresistance element 130b are different from each other by about 90° so that the orientation of the reversed-S-shaped pattern 133 of the second magnetoresistance element 130a and that of the second magnetoresistance element 130b become different from each other by about 90°.

In the magnetic sensor 1 according to the first preferred embodiment, each of the first magnetoresistance elements 120a and 120b has the C-shaped patterns 121. The C-shaped patterns 121 are formed of arcs. The adjacent C-shaped patterns 121 are connected with each other by the semicircular pattern 122 or 123. Accordingly, the first magnetoresistance elements 120a and 120b do not have any linearly extending portions, thus reducing the anisotropic characteristics in detecting a magnetic field.

Additionally, in the magnetic sensor 1 according to present preferred embodiment, the orientation of the circumferential direction of the pattern 120 of the first magnetoresistance element 120a and that of the first magnetoresistance element 120b are different from each other so that the orientation of the C-shaped patterns 121 of the first magnetoresistance element 120a and that of the first magnetoresistance element 120b become different, thus improving the isotropic characteristics in detecting a magnetic field.

In the magnetic sensor 1 according to the first preferred embodiment, each of the second magnetoresistance elements 130a and 130b has the double-spiral pattern 130. The double-spiral pattern 130 is formed principally by winding substantially circular-arc curved portions. The shape of a circular arc approximates a shape having an infinite number of corners of a polygon. Thus, the direction of a current flowing through the double-spiral pattern 130 covers about 360° in the horizontal direction. The horizontal direction is a direction parallel or substantially parallel with the top surface of the semiconductor substrate 110.

In the magnetic sensor 1 according to the first preferred embodiment, the center of the double-spiral pattern 130 is the reversed-S-shaped pattern 133 defined only by curved portions. Accordingly, the second magnetoresistance elements 130a and 130b do not have any linearly extending portions, thus reducing the anisotropic characteristics of the magnetoresistance effect.

In the magnetic sensor 1 according to the first preferred embodiment, the orientation of the circumferential direction of the double-spiral pattern 130 of the second magnetoresistance element 130a and that of the second magnetoresistance element 130b are different from each other so that the orientation of the reversed-S-shaped pattern 133 of the second magnetoresistance element 130a and that of the second magnetoresistance element 130b become different, thus improving the isotropic characteristics of the magnetoresistance effect.

As discussed above, the double-spiral pattern 130 is rotationally symmetrical with respect to the center of the imaginary circle $C_1$ by about 180°. Accordingly, the second magnetoresistance elements 130a and 130b slightly exhibit the anisotropic characteristics of the magnetoresistance effect.

To compensate for the anisotropic characteristics, the orientation of the circumferential direction of the double-spiral pattern 130 of the second magnetoresistance element 130a and that of the second magnetoresistance element 130b are different from each other. Accordingly, the anisotropic characteristics of the magnetoresistance effect of the second magnetoresistance element 130a and that of the second magnetoresistance element 130b are able to be offset from each other and be reduced to a smaller level.

If the orientation of the circumferential direction of the double-spiral pattern 130 of the second magnetoresistance element 130a and that of the second magnetoresistance element 130b differ from each other by about 90°, the anisotropic characteristics of the magnetoresistance effect of each of the second magnetoresistance elements 130a and 130b are able to be significantly reduced.

Accordingly, the direction in which the second magnetoresistance element 130a becomes most sensitive coincides with that in which the second magnetoresistance element 130b becomes least sensitive, and the direction in which the second magnetoresistance element 130a becomes least sensitive coincides with that in which the second magnetoresistance element 130b becomes most sensitive. As a result, the potential difference generated between the nodes 140 and 141 when an external magnetic field is applied to the magnetic sensor 1 is less likely to vary depending on the application direction of the external magnetic field.

The double-spiral pattern 130 includes a shape with a high density per unit area. With such a double-spiral pattern 130, the pattern of each of the second magnetoresistance elements 130a and 130b provided within the imaginary circle $C_1$ is able to be elongated to increase the resistance of the second magnetoresistance elements 130a and 130b. As the electrical resistance of the second magnetoresistance elements 130a and 130b is higher, the current consumed in the magnetic sensor 1 is able to be reduced by a greater amount.

As stated above, as a result of distributing the orientation of the current flowing through the double-spiral pattern 130 in the horizontal direction, the anisotropic characteristics of the magnetoresistance effect of each of the second magnetoresistance elements 130a and 130b is reduced. Thus, output variations of the magnetic sensor 1 when the external magnetic field is 0, which would be caused by the influence of residual magnetization, are able to be significantly reduced.

The double-spiral pattern 130 may be wound in the opposite direction, in which case, the central portion of the double-spiral pattern 130 is an S-shaped pattern defined only by curved portions. That is, the two spiral patterns are connected with each other by the S-shaped pattern.

In the magnetic sensor 1 according to the first preferred embodiment, the second magnetoresistance elements 130a and 130b are provided inward of the first magnetoresistance elements 120a and 120b, respectively, and thus the size of the magnetic sensor is able to be significantly reduced. Additionally, in the magnetic sensor 1, it is not necessary to three-dimensionally lay the wiring to connect the first magnetoresistance elements 120a and 120b and the second magnetoresistance elements 130a and 130b. Thus, the circuit substrate 100 is able to be manufactured with a simple manufacturing process.

In the magnetic sensor 1 according to the first preferred embodiment, the two first magnets 40 are provided above the insulating layer 30 and are provided side by side in the Y-axis direction. The thickness x of each first magnet 40 is preferably about 10 µm or greater, for example, and more preferably, about 20 µm to about 150 µm, for example. If the thickness x of the first magnet 40 is about 10 µm or greater, a vertical magnetic field deflected substantially in the horizontal direction by the first magnet 40 is able to be detected by each of the first magnetoresistance elements 120a and 120b. This will be discussed later. If the thickness x of the first magnet 40 is about 20 µm or greater, a vertical magnetic field is able to be more effectively deflected substantially in the horizontal direction by the first magnet 40, so that the first magnetoresistance elements 120a and 120b are able to each detect a weaker vertical magnetic field. If the thickness x of the first magnet 40 is about 150 µm or smaller, the time needed to form the first magnet 40 is able to be reduced, and thus the mass-production of the magnetic sensors 1 is able to be maintained.

As shown in FIG. 4, as viewed from the direction perpendicular or substantially perpendicular to the insulating layer 30, the first magnets 40 have an externally circular or substantially circular shape and are located in the regions farther inward than the outer peripheral edges of the first magnetoresistance elements 120a and 120b. The regions farther inward than the outer peripheral edges of the first magnetoresistance elements 120a and 120b are regions surrounded by the outer peripheral edges of the first magnetoresistance elements 120a and 120b when both ends of the outer peripheral edge of each of the first magnetoresistance elements 120a and 120b are connected with each other by an imaginary line, as viewed from the direction perpendicular or substantially perpendicular to the insulating layer 30. Preferably, for example, at least about one half, and more preferably, for example, at least about ⅔, of the region farther inward than the outer peripheral edge of each of the first magnetoresistance elements 120a and 120b overlaps the corresponding first magnet 40, as viewed from the direction perpendicular or substantially perpendicular to the insulating layer 30.

In the first preferred embodiment, as viewed from the direction perpendicular or substantially perpendicular to the insulating layer 30, the first magnets 40 are located in the regions farther inward than the inner peripheral edges of the first magnetoresistance elements 120a and 120b. The regions farther inward than the inner peripheral edges of the first magnetoresistance elements 120a and 120b are regions surrounded by the inner peripheral edges of the first magnetoresistance elements 120a and 120b when both ends of the inner peripheral edge of each of the first magnetoresistance elements 120a and 120b are connected with each other by an imaginary line, as viewed from the direction perpendicular or substantially perpendicular to the insulating layer 30. The first magnets 40 may be each located in a region including the inner peripheral edge of the corresponding one of the first magnetoresistance elements 120a and 120b and the area inward of the inner peripheral edge, as viewed from the direction perpendicular or substantially perpendicular to the insulating layer 30. Preferably, for example, at least about one half, and more preferably, for example, at least about ⅔, of the region farther inward than the inner peripheral edge of each of the first magnetoresistance elements 120a and 120b overlaps the corresponding first magnet 40, as viewed from the direction perpendicular or substantially perpendicular to the insulating layer 30.

In the first preferred embodiment, the first magnets 40 are positioned concentrically with the outer peripheral edges of the first magnetoresistance elements 120a and 120b, as viewed from the direction perpendicular or substantially perpendicular to the insulating layer 30.

In the first preferred embodiment, the first magnets 40 do not cover the first magnetoresistance elements 120a and 120b, but cover the second magnetoresistance elements 130a and 130b, as viewed from the direction perpendicular or substantially perpendicular to the insulating layer 30. The first magnets 40 are thus surrounded by the first magnetoresistance elements 120a and 120b, as viewed from the direction perpendicular or substantially perpendicular to the insulating layer 30. The first magnets 40 are made of a magnetic material having a high permeability and a high saturation magnetic flux density, for example, electromagnetic steel, mild steel, silicon steel, permalloy, supermalloy, a nickel alloy, an iron alloy, or ferrite. These magnetic materials preferably have low magnetic coercivity, for example.

If a magnetic material whose permeability increases at high temperatures and decreases at low temperatures, for example, an Fe-78Ni alloy, is preferably used as the magnetic material for the first magnets 40, the temperature dependence of the resistance change rate of the first magnetoresistance elements 120a and 120b is able to be reduced.

The first magnets 40 are formed by plating, for example. A thin layer may be provided between the insulating layer 30 and the first magnets 40.

A description will be provided of a first example in which the influence of the first magnet 40 on the distribution of a vertical magnetic field and that of a horizontal magnetic field is verified by simulations. In the first example, the exterior surface of the first magnet 40 was a cylinder having a diameter of about 140 µm and a thickness x of about 100 µm. The first magnet 40 included permalloy. The first magnets 40 were provided over the second magnetoresistance elements 130a and 130b and did not cover the first magnetoresistance elements 120a and 120b, but did cover the second magnetoresistance elements 130a and 130b. As viewed from the direction perpendicular or substantially perpendicular to the insulating layer 30, the inner peripheral edges of the first magnetoresistance elements 120a and 120b were located adjacent to and outward of the outer peripheral edges of the first magnets 40. The strength of a vertical magnetic field or a horizontal magnetic field to be applied to the magnetic sensor 1 was about 30 mT.

Figure 9:
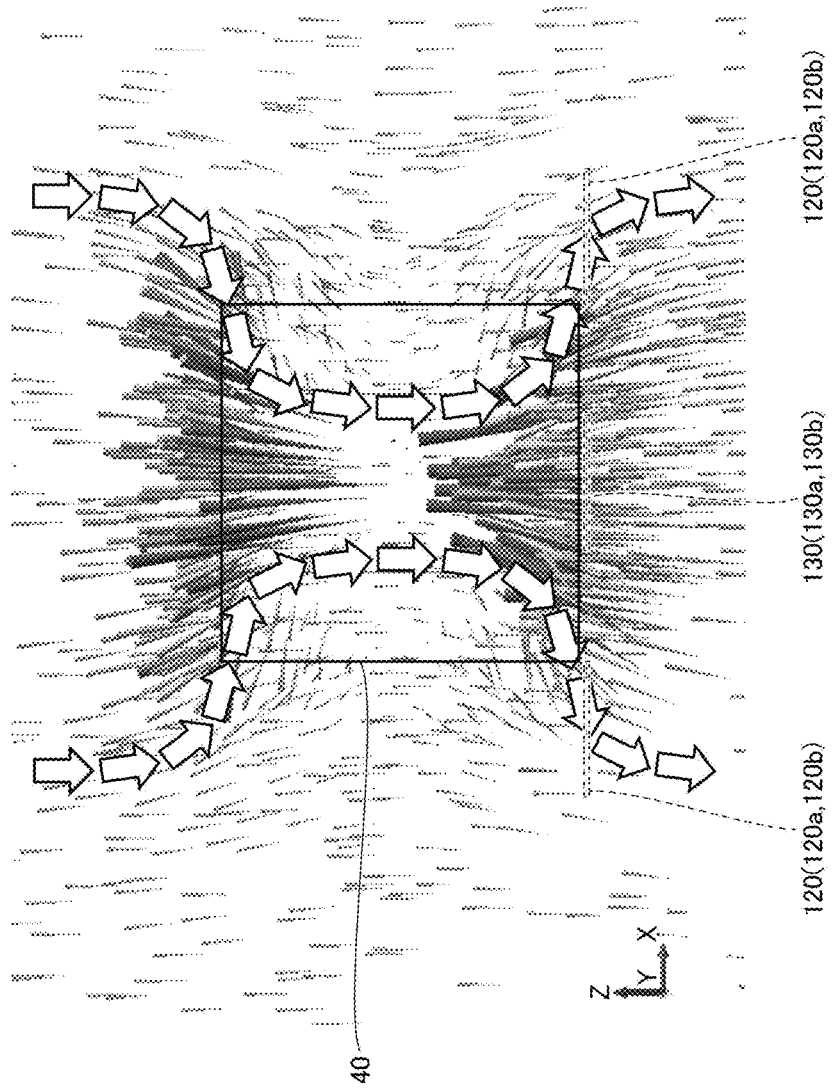
FIG. 9 is a magnetic flux diagram showing a distribution of the magnetic flux density when a vertical magnetic field is applied to a magnetic sensor according to a first example.
Figure 10:
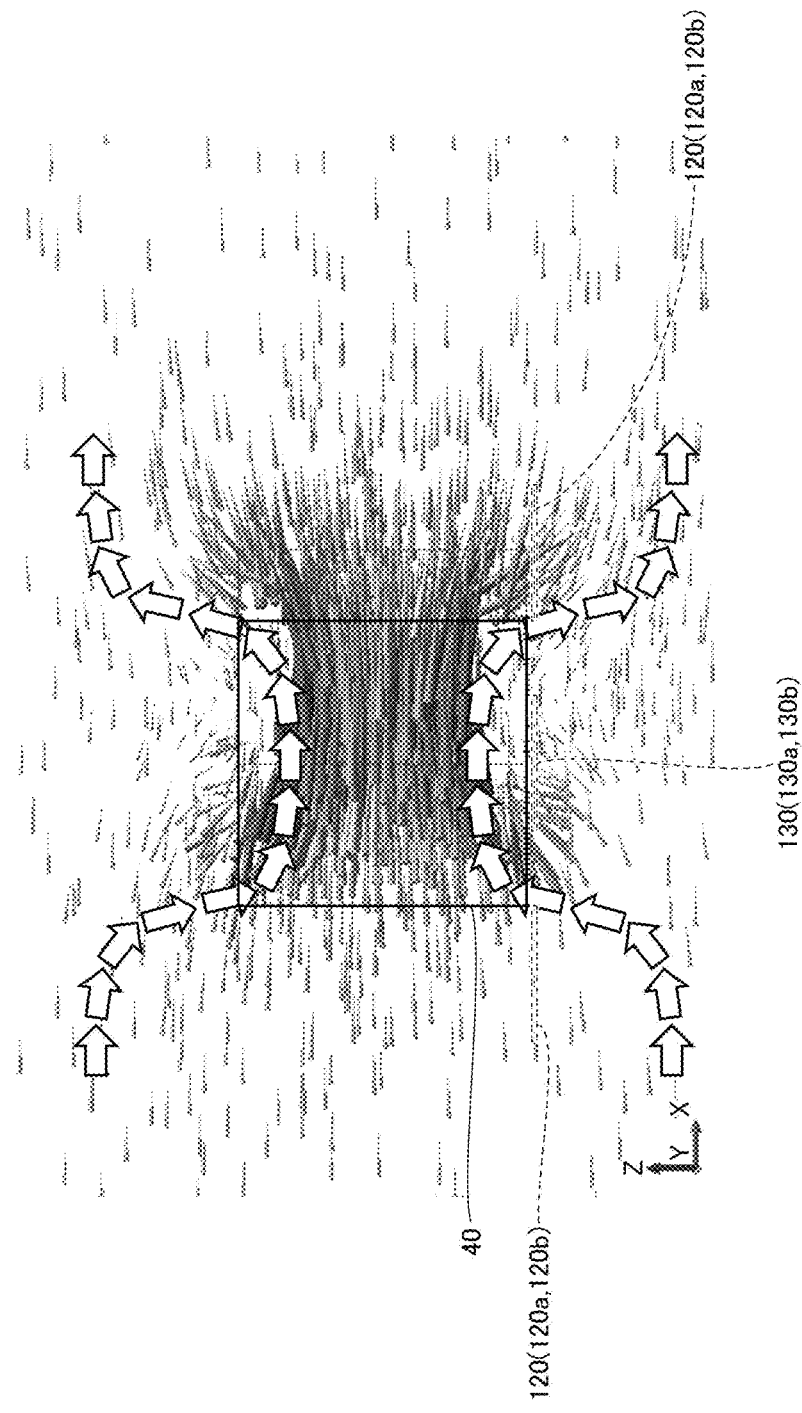
FIG. 10 is a magnetic flux diagram showing a distribution of the magnetic flux density when a horizontal magnetic field is applied to the magnetic sensor according to the first example.
Figure 11:
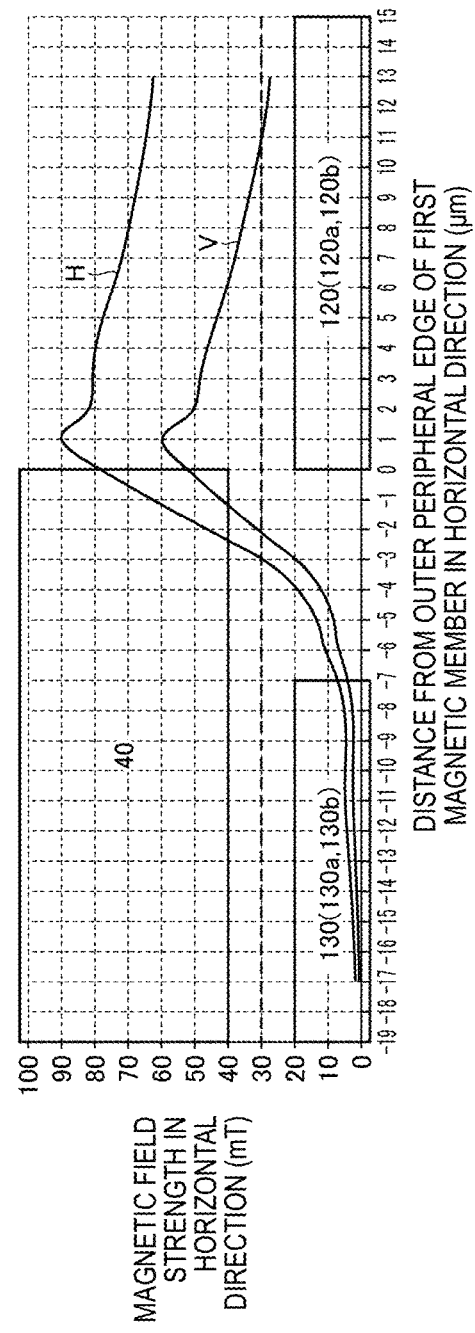
FIG. 11 is a graph showing a relationship between the distance from the outer peripheral edge of a first magnet in the horizontal direction and the horizontal-direction magnetic field strength when a vertical magnetic field or a horizontal magnetic field is applied to the magnetic sensor according to the first example.

FIG. 9 is a magnetic flux diagram showing a distribution of the magnetic flux density when a vertical magnetic field is applied to the magnetic sensor according to the first example. FIG. 10 is a magnetic flux diagram showing a distribution of the magnetic flux density when a horizontal magnetic field is applied to the magnetic sensor according to the first example. FIG. 11 is a graph showing a relationship between the distance from the outer peripheral edge of the first magnet in the horizontal direction and the magnetic field strength in the horizontal direction when a vertical magnetic field or a horizontal magnetic field is applied to the magnetic sensor according to the first example. FIGS. 9 and 10 show the magnetic sensor 1 as viewed from the horizontal direction and show only the first magnet 40, the first magnetoresistance elements 120a and 120b, and the second magnetoresistance elements 130a and 130b.

In FIG. 11, the vertical axis indicates the magnetic field strength (mT) in the horizontal direction, while the horizontal axis indicates the distance (μm) from the outer peripheral edge of the first magnet in the horizontal direction. Regarding the distance from the outer peripheral edge of the first magnet in the horizontal direction, the distance outward from the outer peripheral edge of the first magnet 40 is represented by a positive value, while the distance inward from the outer peripheral edge of the first magnet 40 is represented by a negative value. The distribution of the magnetic field strength in the horizontal direction when a vertical magnetic field is applied is indicated by the solid line V, while that when a horizontal magnetic field is applied is indicated by the solid line H.

As shown in FIG. 9, when a vertical magnetic field heading from upward to downward was applied to the magnetic sensor of the first example, the magnetic flux was attracted and concentrated toward the first magnet 40 having a high permeability on its top surface. The magnetic flux entering the first magnet 40 passed through the first magnet 40 in the vertical direction and was output from its bottom surface while diffusing.

Accordingly, the magnetic field was applied substantially in the vertical direction to each of the second magnetoresistance elements 130a and 130b positioned immediately under the first magnet 40. The second magnetoresistance elements 130a and 130b hardly detected the vertical magnetic field. In contrast, the magnetic field deflected substantially in the horizontal direction, as indicated by the arrows in FIG. 9, was applied to each of the first magnetoresistance elements 120a and 120b positioned downward from the outer peripheral edge of the first magnet 40. The first magnetoresistance elements 120a and 120b were thus able to detect the vertical magnetic field as a magnetic field deflected substantially in the horizontal direction.

As shown in FIG. 10, when a horizontal magnetic field heading from left to right was applied to the magnetic sensor of the first example, the magnetic flux was attracted and concentrated toward the first magnet 40 on its left surface. The magnetic flux entering the first magnet 40 passed through the first magnet 40 in the horizontal direction and was output from its right surface while diffusing.

Accordingly, the horizontal-direction magnetic field was hardly applied to each of the second magnetoresistance elements 130a and 130b positioned immediately under the first magnet 40, as indicated by the arrow in FIG. 10. The second magnetoresistance elements 130a and 130b thus hardly detected the horizontal magnetic field. In contrast, the horizontal-direction magnetic field was applied to each of the first magnetoresistance elements 120a and 120b positioned downward from the outer peripheral edge of the first magnet 40. The first magnetoresistance elements 120a and 120b were thus able to detect the horizontal magnetic field.

FIG. 11 shows that, in a certain area of positions outward of the outer peripheral edge of the first magnet 40, the horizontal-direction magnetic field strength exceeds about 30 mT, which is the strength of the vertical magnetic field or the horizontal magnetic field applied to the magnetic sensor 1. More specifically, in the case of the application of the vertical magnetic field, the horizontal-direction magnetic field strength exceeds about 30 mT, which is the strength of the applied vertical magnetic field, in the area from the position separated inward from the outer peripheral edge of the first magnet 40 by about 2 μm to the position separated outward from the outer peripheral edge of the first magnet 40 by about 10 μm. In the case of the application of the horizontal magnetic field, too, the horizontal-direction magnetic field strength exceeds about 30 mT, which is the strength of the applied horizontal magnetic field, at positions separated outward from the outer peripheral edge of the first magnet 40. The magnetic field attracted and concentrated toward the first magnet 40 was output from the first magnet 40 in the horizontal direction at a high magnetic field strength. This horizontal-direction magnetic field having a high magnetic field strength was applied to the first magnetoresistance elements 120a and 120b.

FIG. 11 shows that the horizontal-direction magnetic field strength is about ⅓ or lower of the strength of the applied vertical magnetic field or horizontal magnetic field, which is about 30 mT, at positions separated inward from the outer peripheral edge of the first magnet 40 by about 7 μm or greater. Thus, the second magnetoresistance elements 130a and 130b are preferably provided at positions separated inward from the outer peripheral edge of the first magnet 40 by about 7 μm or greater, for example.

As described above, the horizontal-direction magnetic field strength exceeds about 30 mT, which is the strength of the applied vertical magnetic field or horizontal magnetic field, in the area from the position separated inward from the outer peripheral edge of the first magnet 40 by about 2 μm to the position separated outward from the outer peripheral edge of the first magnet 40 by about 10 μm. At least a portion of each of the first magnetoresistance elements 120a and 120b is preferably provided in at least a portion of this area, for example. As viewed from the direction perpendicular or substantially perpendicular to the insulating layer 30, each of the first magnetoresistance elements 120a and 120b provided in this area surrounds preferably, for example, at least about ½, and more preferably, for example, at least about ⅔, of the entirety of the outer peripheral portion of the first magnet 40.

As viewed from the direction perpendicular or substantially perpendicular to the insulating layer 30, the first magnets 40 are located concentrically with the outer peripheral edges of the first magnetoresistance elements 120a and 120b and are surrounded by the first magnetoresistance elements 120a and 120b. Accordingly, the horizontal-direction magnetic field output outward from the outer peripheral edge of the first magnet 40 was applied to each of the first magnetoresistance elements 120a and 120b substantially equally in the circumferential direction.

The results of the first example show that the magnetic sensor 1 of the first preferred embodiment of the present invention is able to significantly increase the detection sensitivity of the first magnetoresistance elements 120a and 120b for a vertical magnetic field while reducing a change in the resistance of the second magnetoresistance elements 130a and 130b in response to a vertical magnetic field. That is, the first magnetoresistance elements 120a and 120b is able to detect a weak vertical magnetic field. The results of the first example also show that the magnetic sensor 1 of the first preferred embodiment of the present invention is able to significantly increase the detection sensitivity of the first magnetoresistance elements 120a and 120b for a horizontal magnetic field while reducing a change in the resistance of the second magnetoresistance elements 130a and 130b in response to a horizontal magnetic field. That is, the first magnetoresistance elements 120a and 120b are able to detect a weak horizontal magnetic field.

A description will now be provided of a second example. In the second example, the influence of the thickness of the first magnet on the relationship between the distance from the outer peripheral edge of the first magnet in the horizontal direction and the horizontal-direction magnetic field strength when a vertical magnetic field was applied to a magnetic sensor was verified by simulations.

Figure 12:
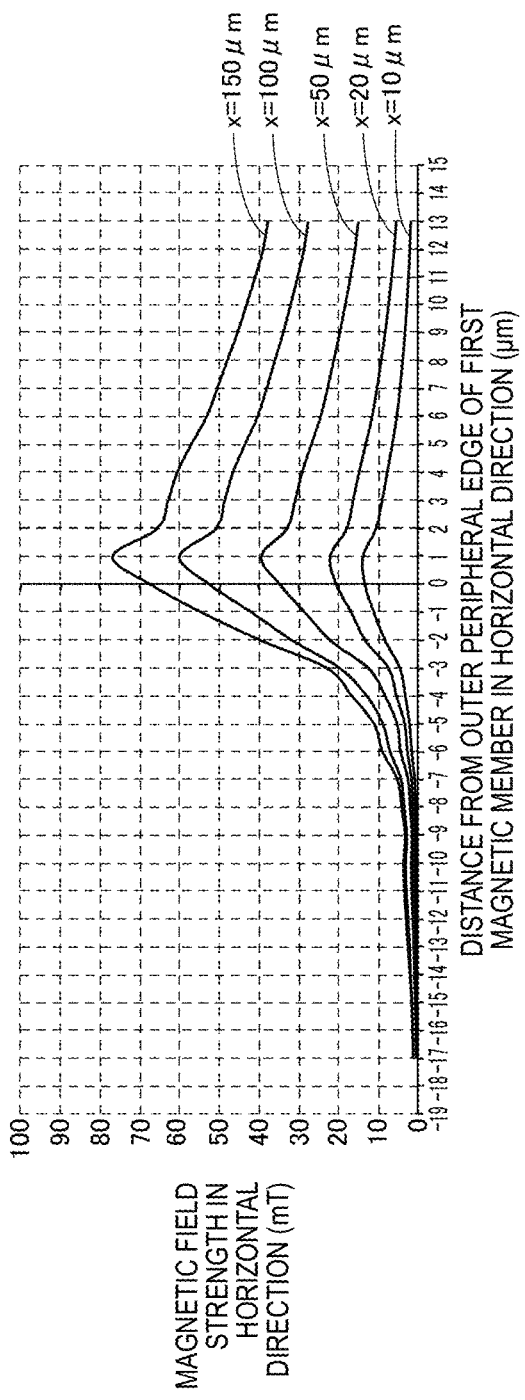
FIG. 12 is a graph showing the influence of the thickness of a first magnet on the relationship between the distance from the outer peripheral edge of the first magnet in the horizontal direction and the horizontal-direction magnetic field strength when a vertical magnetic field is applied to a magnetic sensor according to a second example.
Figure 13:
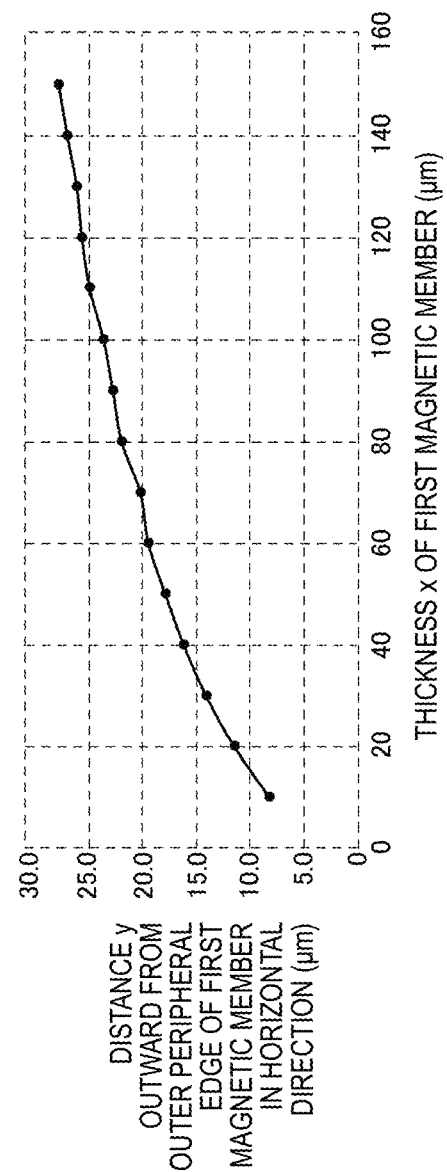
FIG. 13 is a graph showing a relationship between the thickness of the first magnet and the distance outward from the outer peripheral edge of the first magnet in the horizontal direction at which the horizontal-direction magnetic field strength reaches about ⅓ of its peak value.

FIG. 12 is a graph showing the influence of the thickness of the first magnet on the relationship between the distance from the outer peripheral edge of the first magnet in the horizontal direction and the horizontal-direction magnetic field strength when a vertical magnetic field is applied to the magnetic sensor according to the second example. In FIG. 12, the vertical axis indicates the magnetic field strength (mT) in the horizontal direction, while the horizontal axis indicates the distance (μm) from the outer peripheral edge of the first magnet in the horizontal direction. FIG. 13 is a graph showing a relationship between the thickness of the first magnet and the distance outward from the outer peripheral edge of the first magnet in the horizontal direction at which the horizontal-direction magnetic field strength reaches about ⅓ of its peak value. In FIGS. 12 and 13, regarding the distance from the outer peripheral edge of the first magnet in the horizontal direction, the distance outward from the outer peripheral edge of the first magnet 40 is represented by a positive value, while the distance inward from the outer peripheral edge of the first magnet 40 is represented by a negative value.

In the second example, the exterior surface of the first magnet 40 was a cylinder having a diameter of about 140 μm. As the thickness x of the first magnet 40, five values were set, for example, about 10 μm, about 20 μm, about 50 μm, about 100 μm, and about 150 μm. The first magnet 40 was made of permalloy. The first magnet 40 was provided similarly to the first example. The strength of a vertical magnetic field to be applied to the magnetic sensor was about 30 mT.

As shown in FIG. 12, as the thickness x of the first magnet 40 becomes greater, the peak value of the horizontal-direction magnetic field strength becomes higher. As long as the permeability of permalloy is in a range of about 10000 to about 100000, the result shown in the graph of FIG. 12 is not considerably influenced by the permeability of the first magnet 40 and remains substantially the same even when the permeability of the first magnets 40 is changed.

To provide stable output from the bridge circuit of the magnetic sensor 1, the strength of a horizontal-direction magnetic field applied to the first magnetoresistance elements 120a and 120b is preferably, for example, about ⅓ or higher of its peak value, while the strength of a horizontal-direction magnetic field applied to the second magnetoresistance elements 130a and 130b is preferably, for example, about 1/10 or lower of its peak value.

As shown in FIG. 12, regardless of the thickness x of the first magnet 40, the horizontal-direction magnetic field strength is about ⅓ or higher of its peak value in the area of the positions separated inward from the outer peripheral edge of the first magnet 40 by about 2 μm or smaller.

As shown in FIG. 13, as the thickness x of the first magnet 40 becomes thicker, the distance y outward from the outer peripheral edge of the first magnet 40 in the horizontal direction at which the horizontal-direction magnetic field strength reaches about ⅓ of its peak value is greater. The relationship between the thickness x and the distance y is represented by the following approximate expression (I).

$$y = -0.0008x^2 + 0.2495x + 6.6506 \quad (I)$$

That is, in the area within y μm outward from the outer peripheral edge of the first magnet 40 in the horizontal direction, the horizontal-direction magnetic field strength becomes about ⅓ or higher of its peak value. Thus, as viewed from the direction perpendicular or substantially perpendicular to the insulating layer 30, the horizontal-direction magnetic field strength becomes about ⅓ or higher of its peak value in the area from the position separated inward from the outer peripheral edge of the first magnet 40 by about 2 μm to the position separated outward from the outer peripheral edge of the first magnet 40 by y μm indicated in the above-described expression (I).

As shown in FIG. 12, regardless of the thickness x of the first magnet 40, the horizontal-direction magnetic field strength is about 1/10 or lower of its peak value in the area inward from the outer peripheral edge of the first magnet 40 by about 7 μm or greater. That is, as viewed from the direction perpendicular or substantially perpendicular to the insulating layer 30, the horizontal-direction magnetic field strength becomes about 1/10 or lower of its peak value in the area from the center of the first magnet 40 to the position separated inward from the outer peripheral edge of the first magnet 40 by about 7 μm.

As viewed from the direction perpendicular or substantially perpendicular to the insulating layer 30, at least a portion of each of the first magnetoresistance elements 120a and 120b is preferably located, for example, in at least a portion of the area from the position separated inward from the outer peripheral edge of the first magnet 40 by about 2 μm to the position separated outward from the outer peripheral edge of the first magnet 40 by y μm defined by the above-described expression (I).

As viewed from the direction perpendicular or substantially perpendicular to the insulating layer 30, each of the second magnetoresistance elements 130a and 130b is preferably located, for example, in the area from the center of the first magnet 40 to the position separated inward from the outer peripheral edge of the first magnet 40 by about 7 μm.

As described above, the magnetic sensor 1 according to the first preferred embodiment of the present invention is able to detect a vertical magnetic field and a horizontal magnetic field with high sensitivity. In the magnetic sensor 1 according to the first preferred embodiment of the present invention, each of the first magnetoresistance elements 120a and 120b includes concentrically provided multiple first patterns, thus improving the isotropic characteristics in detecting a horizontal magnetic field.

In the first preferred embodiment, the double-spiral patterns 130 of the second magnetoresistance elements 130a and 130b are formed with the same or substantially the same thickness as the patterns 120 of the first magnetoresistance elements 120a and 120b. Accordingly, even if the first magnetoresistance elements 120a and 120b and the second magnetoresistance elements 130a and 130b are formed in the same step, variations in the processing precision of the first magnetoresistance elements 120a and 120b and the second magnetoresistance elements 130a and 130b are reduced. Thus, the output characteristics of the magnetic sensor 1 are able to be stabilized.

However, the double-spiral patterns 130 may be narrower than the patterns 120. Accordingly, the magnetoresistance effect of the second magnetoresistance elements 130a and 130b becomes even smaller than that of the first magnetoresistance elements 120a and 120b. As a result, the magnetoresistance effect of the second magnetoresistance elements 130a and 130b is lessened, thus considerably decreasing the resistance change rate of the second magnetoresistance elements 130a and 130b.

Accordingly, the potential difference generated between the nodes 140 and 141 when an external magnetic field is applied to the magnetic sensor 1 is able to be significantly increased, thus improving the detection sensitivity of the magnetic sensor 1. Additionally, since the electrical resistance of the second magnetoresistance elements 130a and 130b is high, there is only a relatively small decrease in the potential difference generated between the nodes 140 and 141 when an external magnetic field having a high magnetic field strength is applied to the magnetic sensor 1, thus stabilizing the output characteristics of the magnetic sensor 1.

In the present preferred embodiment, the second magnetoresistance elements 130a and 130b are magnetically shielded by the first magnets 40 and hardly detect vertical magnetic fields and horizontal magnetic fields. The resistance change rate of the second magnetoresistance elements 130a and 130b may not necessarily be smaller than that of the first magnetoresistance elements 120a and 120b.

In the magnetic sensor 1 according to the first preferred embodiment of the present invention, the first conductor 60 and the first stress relaxer 80 are provided between the first magnet 40 and the circuit substrate 100. The first conductor 60 includes the first base section 61 and the first narrow section 62, and the first narrow section 62 contacts the circuit substrate 100. More specifically, the first narrow section 62 contacts the insulating layer 30 provided on the front layer of the circuit substrate 100. The first stress relaxer 80 is provided in a gap between the first base section 61 and the insulating layer 30. The first stress relaxer 80 is made of a material different from that of the first conductor 60. The first stress relaxer 80 is preferably made of at least one of, for example, a material having a lower adhesiveness, a material having a lower elastic modulus, and a material having a lower tensile strength than the material of the first conductor 60.

Accordingly, the contact area between the first conductor 60 and the circuit substrate 100 is able to be significantly reduced, thus decreasing a stress applied from the first magnet 40 to each of the first magnetoresistance elements 120a and 120b and the second magnetoresistance elements 130a and 130b via the first conductor 60. The first stress relaxer 80 is provided immediately under the outer peripheral portion of the first base section 61. The first stress relaxer 80 is able to thus relax a stress caused by a distortion produced at the outer peripheral portion of the first magnet 40 to be applied to the circuit substrate 100.

More specifically, if the first stress relaxer 80 is made of a material having a lower adhesiveness than the material of the first conductor 60, when the first stress relaxer 80 is subjected to a stress caused by a distortion produced at the outer peripheral portion of the first magnet 40, it separates from a component or element adjacent to the first stress relaxer 80. Accordingly, transmission of the stress to the adjacent component or element via the first stress relaxer 80 is significantly reduced or prevented.

If the first stress relaxer 80 is made of a material having a lower elastic modulus than the material of the first conductor 60, when the first stress relaxer 80 is subjected to a stress caused by a distortion produced at the outer peripheral portion of the first magnet 40, it elastically deforms to absorb the stress. Accordingly, transmission of the stress to a component or element adjacent to the first stress relaxer 80 via the first stress relaxer 80 is significantly reduced or prevented.

If the first stress relaxer 80 is made of a material having a lower tensile strength than the material of the first conductor 60, when the first stress relaxer 80 is subjected to a stress caused by a distortion produced at the outer peripheral portion of the first magnet 40, it cracks and separates from a component or element adjacent to the first stress relaxer 80. Accordingly, transmission of the stress to the adjacent component or element via the first stress relaxer 80 is significantly reduced or prevented.

Thus, the first stress relaxer 80 relaxes a stress caused by a distortion produced at the outer peripheral portion of the first magnet 40 to be applied from the first magnet 40 to each of the first magnetoresistance elements 120a and 120b and the second magnetoresistance elements 130a and 130b via the first conductor 60. Accordingly, a decrease in the output accuracy of the magnetic sensor 1 is able to be regulated. It is also less likely that the insulating layer 30 cracks due to a stress applied from the first magnet 40 to the insulating layer 30 via the first conductor 60. Thus, the reliability of the magnetic sensor 1 is able to be maintained.

In the first preferred embodiment, a gap is provided between the first base section 61 and the insulating layer 30 all around the outer peripheral portion of the first conductor 60, and the first stress relaxer 80 is provided in the entirety or substantially the entirety of this gap. Accordingly, the application of a stress caused by a distortion produced at the outer peripheral portion of the first magnet 40 to the circuit substrate 100 via the first conductor 60 is able to be significantly reduced.

As described above, the magnetic sensor 1 according to the first preferred embodiment of the present invention provides high isotropic characteristics in detecting a horizontal magnetic field and is also able to detect a weak vertical magnetic field by using magnetoresistance elements. The magnetic sensor 1 is able to also regulate a decrease in the output accuracy, which would be caused by a stress applied to the magnetoresistance elements from a structure provided above the magnetoresistance elements. According to the thickness x of the first magnet 40 for a portion of the first magnet 40 positioned on the first conductor 60, the verification results based on the first and second examples are able to be utilized.

Second Preferred Embodiment

A magnetic sensor according to a second preferred embodiment of the present invention will be described below with reference to the drawing. The magnetic sensor according to the second preferred embodiment of the present invention is different from the magnetic sensor 1 of the first preferred embodiment of the present invention mainly in the first conductor and the arrangement of the stress relaxer. An explanation of elements similar to those of the magnetic sensor 1 of the first preferred embodiment of the present invention will not be repeated.

Figure 14:
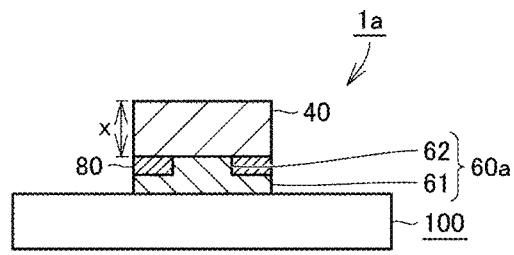
FIG. 14 is a sectional view showing a magnetic sensor according to a second preferred embodiment of the present invention.

FIG. 14 is a sectional view showing the magnetic sensor according to the second preferred embodiment of the present invention. In FIG. 14, the magnetic sensor as viewed from the same or substantially the same direction as that in FIG. 2 is shown.

As shown in FIG. 14, in a magnetic sensor 1a according to the second preferred embodiment of the present invention, a first conductor 60a is provided on the circuit substrate 100. The first conductor 60a includes a first base section 61 and a first narrow section 62. In the first conductor 60a, the first base section 61 and the first narrow section 62 are provided side by side in the direction perpendicular or substantially perpendicular to the insulating layer 30. In the second preferred embodiment, the first narrow section 62 of the first conductor 60a is positioned at the end portion of the first conductor 60a closer to the first magnet 40 in the direction perpendicular or substantially perpendicular to the insulating layer 30. That is, the first narrow section 62 of the first conductor 60a contacts the first magnet 40.

The first narrow section 62 in the first conductor 60a provides a gap partially between the first base section 61 and the first magnet 40. In the second preferred embodiment, the gap is provided between the first base section 61 and the first magnet 40 all around the outer peripheral portion of the first conductor 60a. The first stress relaxer 80 is provided in this gap.

The first stress relaxer 80 is provided in a region which is surrounded by the exterior surface of the first narrow section 62 and also by the exterior surface of the first base section 61, as viewed from the direction perpendicular or substantially perpendicular to the insulating layer 30. In the second preferred embodiment, the first stress relaxer 80 is sandwiched between the first base section 61 and the first magnet 40. The first stress relaxer 80 is located immediately under the outer peripheral portion of the first magnet 40. As viewed from the direction perpendicular or substantially perpendicular to the insulating layer 30, the first stress relaxer 80 has a ring shape.

In the magnetic sensor 1a according to the second preferred embodiment of the present invention, the first conductor 60a and the first stress relaxer 80 are provided between the first magnet 40 and the circuit substrate 100. The first conductor 60a includes the first base section 61 and the first narrow section 62, and the first narrow section 62 contacts the first magnet 40. The first stress relaxer 80 is provided in a gap between the first base section 61 and the first magnet 40. The first stress relaxer 80 is a component or element including a material different from that of the first conductor 60a. The first stress relaxer 80 is preferably made of, for example, at least one of a material having a lower adhesiveness, a material having a lower elastic modulus, and a material having a lower tensile strength than the material of the first conductor 60a.

Accordingly, the contact area between the first conductor 60a and the first magnet 40 is able to be significantly reduced, thus decreasing a stress applied from the first magnet 40 to each of the first magnetoresistance elements 120a and 120b and the second magnetoresistance elements 130a and 130b via the first conductor 60a. The first stress relaxer 80 is provided immediately under the outer peripheral portion of the first magnet 40. The first stress relaxer 80 is able to thus relax a stress caused by a distortion produced at the outer peripheral portion of the first magnet 40 to be applied to the circuit substrate 100.

Thus, the first stress relaxer 80 is able to relax a stress caused by a distortion produced at the outer peripheral portion of the first magnet 40 to be applied from the first magnet 40 to each of the first magnetoresistance elements 120a and 120b and the second magnetoresistance elements 130a and 130b via the first conductor 60a. Accordingly, a decrease in the output accuracy of the magnetic sensor 1a is able to be regulated. It is also less likely that the insulating layer 30 cracks due to a stress applied from the first magnet 40 to the insulating layer 30 via the first conductor 60a. Thus, the reliability of the magnetic sensor 1a is able to be maintained.

In the second preferred embodiment, a gap is provided between the first base section 61 and the first magnet 40 all around the outer peripheral portion of the first conductor 60a, and the first stress relaxer 80 is provided in the entirety or substantially the entirety of the gap. Thus, the application of a stress caused by a distortion produced at the outer peripheral portion of the first magnet 40 to the circuit substrate 100 via the first conductor 60a is able to be significantly reduced.

Third Preferred Embodiment

A magnetic sensor according to a third preferred embodiment of the present invention will be described below with reference to the drawing. The magnetic sensor according to the third preferred embodiment of the present invention is different from the magnetic sensor 1 of the first preferred embodiment of the present invention mainly in the first conductor and the structure and location of the stress relaxer. An explanation of elements similar to those of the magnetic sensor 1 of the first preferred embodiment of the present invention will not be repeated.

Figure 15:
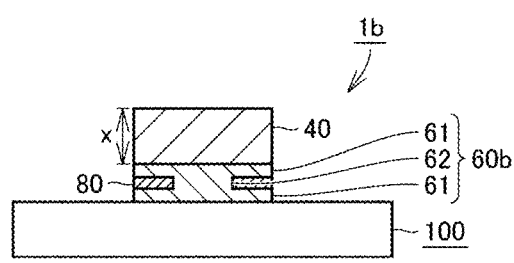
FIG. 15 is a front view showing a magnetic sensor according to a third preferred embodiment of the present invention.

FIG. 15 is a front view showing the magnetic sensor according to the third preferred embodiment of the present invention. In FIG. 15, the magnetic sensor as viewed from the same or substantially the same direction as that in FIG. 2 is shown.

As shown in FIG. 15, in a magnetic sensor 1b according to the third preferred embodiment of the present invention, a first conductor 60b is provided on the circuit substrate 100. The first conductor 60b includes first base sections 61 and a first narrow section 62. In the first conductor 60b, the first base sections 61 and the first narrow section 62 are provided side by side in the direction perpendicular or substantially perpendicular to the insulating layer 30. In the third preferred embodiment, the first base section 61 of the first conductor 60b is located at the end portion of the first conductor 60b closer to the insulating layer and that closer to the first magnet 40 in the direction perpendicular or substantially perpendicular to the insulating layer 30. The first narrow section 62 of the first conductor 60b is sandwiched between the first base sections 61 of the first conductor 60b in the direction perpendicular or substantially perpendicular to the insulating layer 30.

The provision of the first narrow section 62 in the first conductor 60b provides a gap partially between the first base sections 61. In the third preferred embodiment, the gap is provided between the first base sections 61 all around the outer peripheral portion of the first conductor 60b. The first stress relaxer 80 is provided in the gap.

The first stress relaxer 80 is provided in a region which is surrounded by the exterior surface of the first narrow section 62 and also by the exterior surface of the first base section 61, as viewed from the direction perpendicular or substantially perpendicular to the insulating layer 30. In the third preferred embodiment, the first stress relaxer 80 is sandwiched between the first base sections 61. The first stress relaxer 80 is located immediately under the outer peripheral portion of the first base section 61 positioned at the end portion of the first base sections 61 closer to the first magnet 40. As viewed from the direction perpendicular or substantially perpendicular to the insulating layer 30, the first stress relaxer 80 has a ring shape.

In the magnetic sensor 1b according to the third preferred embodiment of the present invention, the first conductor 60b and the first stress relaxer 80 are provided between the first magnet 40 and the circuit substrate 100. The first conductor 60b includes the first narrow section 62 between the first base sections 61. The first stress relaxer 80 is provided in a gap between the first base sections 61. The first stress relaxer 80 includes a material different from that of the first conductor 60b. The first stress relaxer 80 is preferably made of, for example, at least one of a material having a lower adhesiveness, a material having a lower elastic modulus, and a material having a lower tensile strength than the material of the first conductor 60b.

Accordingly, the first stress relaxer 80 is able to relax a stress within the first conductor 60b, thus decreasing a stress applied from the first magnet 40 to each of the first magnetoresistance elements 120a and 120b and the second magnetoresistance elements 130a and 130b via the first conductor 60b. The first stress relaxer 80 is provided immediately under the outer peripheral portion of the first base section 61 positioned at the end portion of the first conductor 60b closer to the first magnet 40. Thus, the first stress relaxer 80 relaxes a stress caused by a distortion produced at the outer peripheral portion of the first magnet 40 to be applied to the circuit substrate 100.

Thus, the first stress relaxer 80 relaxes a stress caused by a distortion produced at the outer peripheral portion of the first magnet 40 to be applied from the first magnet 40 to each of the first magnetoresistance elements 120a and 120b and the second magnetoresistance elements 130a and 130b via the first conductor 60b. Accordingly, a decrease in the output accuracy of the magnetic sensor 1b is able to be regulated. It is also less likely that the insulating layer 30 cracks due to a stress applied from the first magnet 40 to the insulating layer 30 via the first conductor 60b. Thus, the reliability of the magnetic sensor 1b is able to be maintained.

In the third preferred embodiment, a gap is provided between the first base sections 61 all around the outer peripheral portion of the first conductor 60b, and the first stress relaxer 80 is provided in the entirety or substantially the entirety of this gap. Thus, the application of a stress caused by a distortion produced at the outer peripheral portion of the first magnet 40 to the circuit substrate 100 via the first conductor 60b is able to be significantly reduced.

Fourth Preferred Embodiment

A magnetic sensor according to a fourth preferred embodiment of the present invention will be described below with reference to the drawing. The magnetic sensor according to the fourth preferred embodiment of the present invention is different from the magnetic sensor 1 of the first preferred embodiment of the present invention mainly in the first magnet and the omission of the first conductor. An explanation of elements similar to those of the magnetic sensor 1 of the first preferred embodiment of the present invention will not be repeated.

Figure 16:
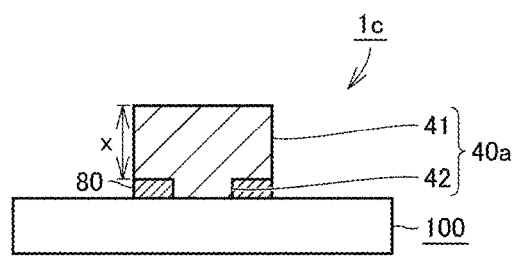
FIG. 16 is a sectional view showing a magnetic sensor according to a fourth preferred embodiment of the present invention.

FIG. 16 is a sectional view showing the magnetic sensor according to the fourth preferred embodiment of the present invention. In FIG. 16, the magnetic sensor as viewed from the same or substantially the same direction as that in FIG. 2 is shown.

As shown in FIG. 16, in a magnetic sensor 1c according to the fourth preferred embodiment of the present invention, a first magnet 40a is provided on the circuit substrate 100. The first magnet 40a includes a first base section 41 and a first narrow section 42. The area of the exterior surface of the first narrow section 42 is smaller than that of the first base section 41, as viewed from the direction perpendicular or substantially perpendicular to the insulating layer 30. In the first magnet 40a, the first base section 41 and the first narrow section 42 are provided side by side in the direction perpendicular or substantially perpendicular to the insulating layer 30. In the fourth preferred embodiment, the first narrow section 42 of the first magnet 40a is positioned at the end portion of the first magnet 40a closer to the insulating layer 30 in the direction perpendicular or substantially perpendicular to the insulating layer 30. That is, the first narrow section 42 of the first magnet 40a contacts the circuit substrate 100.

As viewed from the direction perpendicular or substantially perpendicular to the insulating layer 30, the exterior surface of each of the first base section 41 and the first narrow section 42 is circular. The diameter of the exterior surface of the first narrow section 42 is smaller than that of the first base section 41. The first base section 41 and the first narrow section 42 are provided substantially coaxially. The first base section 41 is not restricted to the above-described shape and may have an elliptical or polygonal shape, for example. The first narrow section 42 is not restricted to the above-described shape and may have any shape as long as the area of the exterior surface as viewed from the direction perpendicular or substantially perpendicular to the insulating layer 30 is smaller than that of the first base section 41.

The first narrow section 42 in the first magnet 40a provides a gap partially between the first base section 41 and the circuit substrate 100. In the fourth preferred embodiment, the gap is provided between the first base section 41 and the circuit substrate 100 all around the outer peripheral portion of the first magnet 40a. The first stress relaxer 80 is provided in the gap.

With a view to decreasing the distance between the first magnet 40a and the circuit substrate 100, the thickness of the first narrow section 42 in the Z-axis direction is preferably about 2.0 μm or smaller, for example. As the distance between the first base section 41 of the first magnet 40a and the circuit substrate 100 is smaller, the magnetic shielding function of the first magnet 40a is able to be provided more effectively.

To form the first narrow section 42, patterning with a resist or etching with a sacrificial layer, for example, may be utilized.

The first stress relaxer 80 is provided in a region which is surrounded by the exterior surface of the first narrow section 42 and also by the exterior surface of the first base section 41, as viewed from the direction perpendicular or substantially perpendicular to the insulating layer 30. In the fourth preferred embodiment, the first stress relaxer 80 is sandwiched between the first base section 41 and the insulating layer 30. The first stress relaxer 80 is located immediately under the outer peripheral portion of the first base section 41. As viewed from the direction perpendicular or substantially perpendicular to the insulating layer 30, the first stress relaxer 80 has a ring shape.

The first stress relaxer 80 includes a material different from that of the first magnet 40a. The first stress relaxer 80 is preferably made of, for example, at least one of a material having a lower adhesiveness, a material having a lower elastic modulus, and a material having a lower tensile strength than the material of the first magnet 40a.

In the magnetic sensor 1c according to the fourth preferred embodiment of the present invention, the first narrow section 42 of the first magnet 40a contacts the circuit substrate 100. Thus, the contact area between the first magnet 40a and the circuit substrate 100 is able to be reduced, thus decreasing a stress applied from the first magnet 40a to each of the first magnetoresistance elements 120a and 120b and the second magnetoresistance elements 130a and 130b. The first stress relaxer 80 is provided immediately under the outer peripheral portion of the first base section 41. Thus, the first stress relaxer 80 thus relaxes a stress caused by a distortion produced at the outer peripheral portion of the first magnet 40a to be applied to the circuit substrate 100.

Thus, the first stress relaxer 80 relaxes a stress caused by a distortion produced at the outer peripheral portion of the first magnet 40a to be applied from the first magnet 40a to each of the first magnetoresistance elements 120a and 120b and the second magnetoresistance elements 130a and 130b. Accordingly, a decrease in the output accuracy of the magnetic sensor 1c is able to accordingly be regulated. It is also less likely that the insulating layer 30 cracks due to a stress applied from the first magnet 40a to the insulating layer 30. Thus, the reliability of the magnetic sensor 1c is able to be maintained.

In the fourth preferred embodiment, a gap is provided between the first base section 41 of the first magnet 40a and the circuit substrate 100 all around the outer peripheral portion of the first magnet 40a, and the first stress relaxer 80 is provided in the entirety or substantially the entirety of the gap. Thus, the application of a stress caused by a distortion produced at the outer peripheral portion of the first magnet 40a to the circuit substrate 100 is able to be significantly reduced. According to the thickness x of the first magnet 40a for the first base section 41, the verification results based on the first and second examples are able to be utilized.

Fifth Preferred Embodiment

A magnetic sensor according to a fifth preferred embodiment of the present invention will be described below with reference to the drawings. The magnetic sensor according to the fifth preferred embodiment of the present invention is different from the magnetic sensor 1 of the first preferred embodiment of the present invention mainly in the pattern of second magnetoresistance elements. An explanation of elements similar to those of the magnetic sensor 1 of the first preferred embodiment of the present invention will not be repeated.

Figure 17:
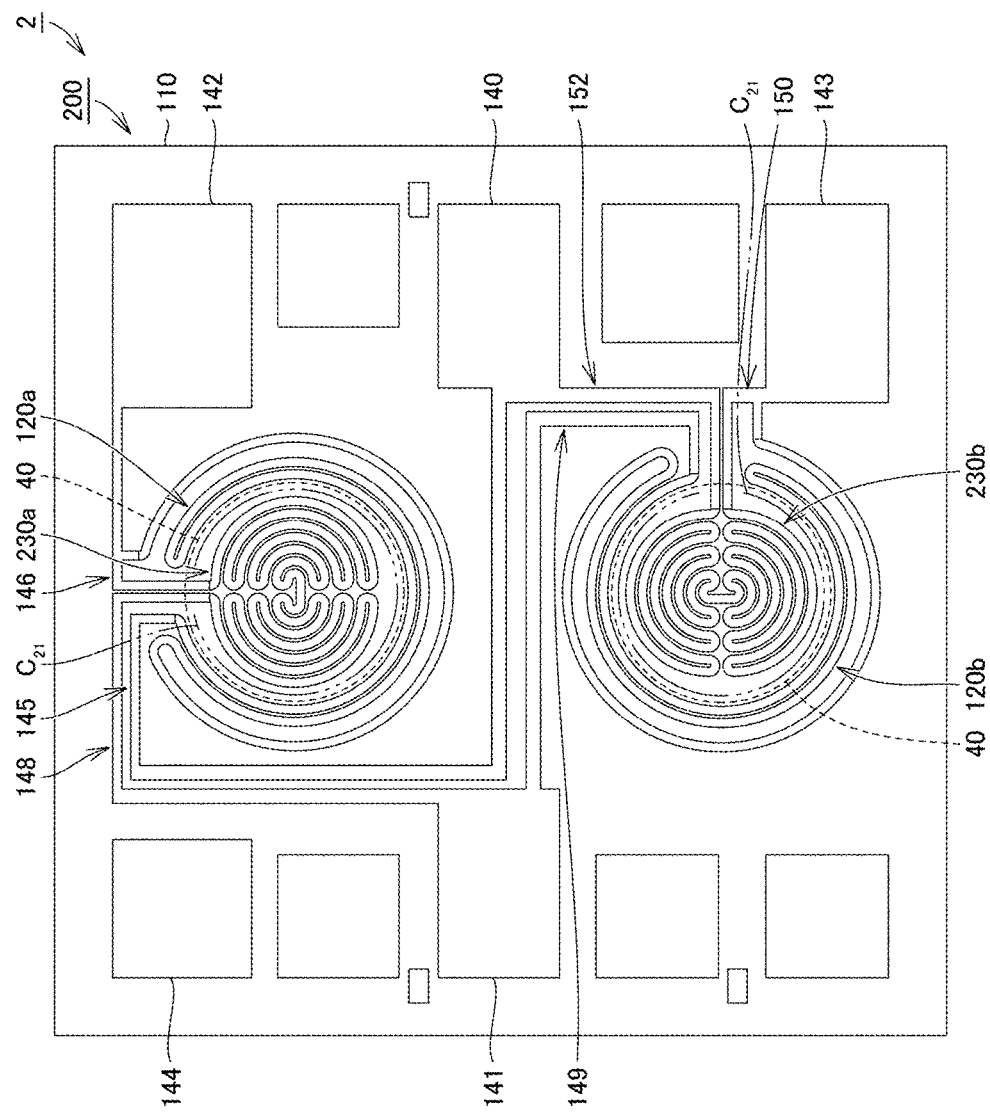
FIG. 17 is a plan view of a magnetic sensor according to a fifth preferred embodiment of the present invention.
Figure 18:
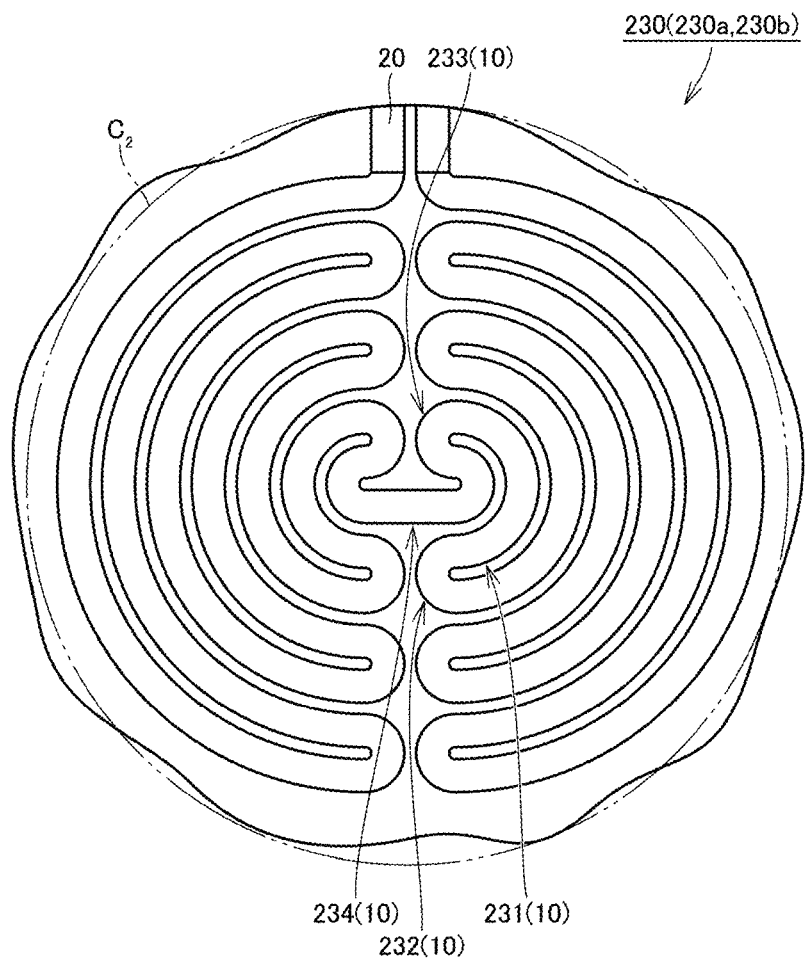
FIG. 18 is a plan view showing a pattern of a second magnetoresistance element of the magnetic sensor according to the fifth preferred embodiment of the present invention.

FIG. 17 is a plan view of the magnetic sensor according to the fifth preferred embodiment of the present invention. FIG. 18 is a plan view showing a pattern of a second magnetoresistance element of the magnetic sensor according to the fifth preferred embodiment of the present invention. As shown in FIG. 17, a magnetic sensor 2 according to the fifth preferred embodiment of the present invention includes a circuit substrate 200 and two first magnets 40 provided above the circuit substrate 200. In the magnetic sensor 2 according to the fifth preferred embodiment of the present invention, on the circuit substrate 200, two first conductors are provided. A first stress relaxer is provided along a portion of each of the first conductors. The first magnets 40 cover the associated first conductors, as viewed from the direction perpendicular or substantially perpendicular to the insulating layer 30.

As shown in FIGS. 17 and 18, a pattern of each of first magnetoresistance elements 120a and 120b of the magnetic sensor 2 according to the fifth preferred embodiment of the present invention includes three first patterns. The three first patterns are provided along the circumference of an imaginary circle $C_2$ and side by side one another in the radial direction of the imaginary circle $C_2$ and are connected with each other, as viewed from the direction perpendicular or substantially perpendicular to the insulating layer 30. The three first patterns are located along an imaginary C-shaped feature $C_{21}$, which is opened at a portion where wiring 146, 148, 150, and 152 is positioned, on the circumference of the imaginary circle $C_2$. The three first patterns are C-shaped patterns provided along the imaginary C-shaped feature $C_{21}$ and side by side one another in the radial direction of the imaginary circle $C_2$.

As shown in FIG. 17, the orientation of the circumferential direction of the first magnetoresistance element 120a and that of the first magnetoresistance element 120b are different from each other so that the orientations of the two imaginary C-shaped features $C_{21}$ become different. That is, the orientation of the circumferential direction of the pattern of the first magnetoresistance element 120a and that of the first magnetoresistance element 120b are different from each other so that the orientation of the circumferential direction of the C-shaped patterns of the first magnetoresistance element 120a and that of the first magnetoresistance element 120b become different.

In the fifth preferred embodiment, the orientation of the circumferential direction of the pattern of the first magnetoresistance element 120a and that of the first magnetoresistance element 120b differ from each other by about 90°, for example, so that the orientation of the C-shaped patterns of the first magnetoresistance element 120a and that of the first magnetoresistance element 120b become different from each other by about 90°.

As shown in FIGS. 17 and 18, as viewed from the direction perpendicular or substantially perpendicular to the insulating layer 30, a second magnetoresistance element 230a is positioned at the central side of the imaginary circle $C_2$ and is surrounded by the first magnetoresistance element 120a, while a second magnetoresistance element 230b is positioned at the central side of the imaginary circle $C_2$ and is surrounded by the first magnetoresistance element 120b. That is, as viewed from the direction perpendicular or substantially perpendicular to the insulating layer 30, the second magnetoresistance element 230a is located farther inward than the inner peripheral edge of the first magnetoresistance element 120a, while the second magnetoresistance element 230b is located farther inward than the inner peripheral edge of the first magnetoresistance element 120b.

Each of the second magnetoresistance elements 230a and 230b includes a pattern 230. The pattern 230 includes fourteen semi-circular patterns 231, which are second patterns, provided along the circumference of the imaginary circle $C_2$ line-symmetrically to each other and side by side one another in the radial direction of the imaginary circle $C_2$. The pattern 230 preferably has the same or substantially the same thickness as that of the pattern 120 of each of the first magnetoresistance elements 120a and 120b. However, the pattern 230 may be thinner than the pattern 120.

The fourteen semi-circular patterns 231 are connected with each other alternately at one end and at the other end starting from inward. The semi-circular patterns 231 connected with each other at one end are connected with each other by a semi-circular pattern 232. The semi-circular patterns 231 connected with each other at the other end are connected with each other by a semi-circular pattern 233. The semi-circular patterns 231 positioned at the innermost side line-symmetrically to each other are connected with each other at one end by a linearly extending portion 234. The length of the linearly extending portion 234 is preferably shorter than about 10 µm, for example.

The pattern 230 of each of the second magnetoresistance elements 230a and 230b includes the six semi-circular patterns 232, the six semi-circular patterns 233, and the linearly extending portion 234. Accordingly, the fourteen semi-circular patterns 231 are connected in series with each other. The semi-circular patterns 232 and 233 do not have any linearly extending portions and are defined only by curved portions.

In the magnetic sensor 2 according to the fifth preferred embodiment, each of the second magnetoresistance elements 230a and 230b includes the semi-circular patterns 231. The semi-circular patterns 231 are formed of arcs. The two adjacent semi-circular patterns 231 are connected with each other by the semi-circular pattern 232 or 233. Each of the second magnetoresistance elements 230a and 230b includes the linearly extending portion 234 preferably having a length shorter than about 10 µm, for example. Thus, the anisotropic characteristics in detecting a magnetic field are able to be significantly reduced.

The orientation of the circumferential direction of the pattern 230 of the second magnetoresistance element 230a and that of the second magnetoresistance element 230b are different from each other. In the fifth preferred embodiment, the orientation of the circumferential direction of the pattern 230 of the second magnetoresistance element 230a and that of the second magnetoresistance element 230b are different from each other by about 90°, for example. Accordingly, the anisotropic characteristics of the magnetoresistance effect of the second magnetoresistance element 230a and that of the second magnetoresistance element 230b are able to be offset from each other and be reduced to a smaller level.

In the magnetic sensor 2 according to the fifth preferred embodiment, the second magnetoresistance elements 230a and 230b are provided inward of the first magnetoresistance elements 120a and 120b, respectively, and thus the size of the magnetic sensor is able to be significantly reduced. Additionally, in the magnetic sensor 2, too, it is not necessary to three-dimensionally lay the wiring to connect the first magnetoresistance elements 120a and 120b and the second magnetoresistance elements 230a and 230b. Hence, the circuit substrate 200 is able to be manufactured with a simple manufacturing process.

As shown in FIG. 17, the first magnets 40 do not cover the first magnetoresistance elements 120a and 120b, but cover the second magnetoresistance elements 230a and 230b, as viewed from the direction perpendicular or substantially perpendicular to the insulating layer 30.

The magnetic sensor 2 according to the fifth preferred embodiment is also able to detect a vertical magnetic field and a horizontal magnetic field with high sensitivity. In the magnetic sensor 2 according to the fifth preferred embodiment of the present invention, each of the first magnetoresistance elements 120a and 120b includes concentrically provided multiple first patterns, thus improving the isotropic characteristics in detecting a horizontal magnetic field.

In the fifth preferred embodiment, the second magnetoresistance elements 230a and 230b are magnetically shielded by the first magnets 40 and hardly detect vertical magnetic fields and horizontal magnetic fields. The resistance change rate of the second magnetoresistance elements 230a and 230b may not necessarily be smaller than that of the first magnetoresistance elements 120a and 120b.

The magnetic sensor 2 according to the fifth preferred embodiment of the present invention also provides high isotropic characteristics in detecting a horizontal magnetic field and is also able to detect a weak vertical magnetic field by using magnetoresistance elements. The magnetic sensor 2 is able to also regulate a decrease in the output accuracy, which would be caused by a stress applied to the magnetoresistance elements from a structure provided above the magnetoresistance elements.

Sixth Preferred Embodiment

A magnetic sensor according to a sixth preferred embodiment of the present invention will be described below with reference to the drawings. The magnetic sensor according to the sixth preferred embodiment of the present invention is different from the magnetic sensor 1 of the first preferred embodiment of the present invention mainly in the patterns of the first and second magnetoresistance elements, the structure and location of the second magnetoresistance elements, and the addition of second conductors. An explanation of elements similar to those of the magnetic sensor 1 of the first preferred embodiment of the present invention will not be repeated.

Figure 19:
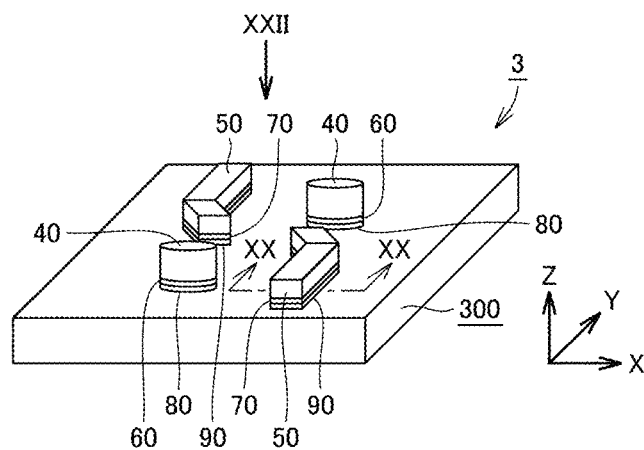
FIG. 19 is a perspective view showing a magnetic sensor according to a sixth preferred embodiment of the present invention.
Figure 20:
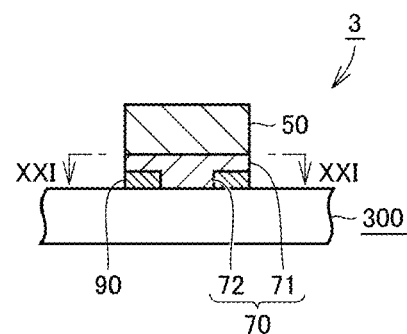
FIG. 20 is a sectional view of the magnetic sensor in FIG. 19, as viewed from the direction indicated by the arrow of line XX-XX in FIG. 19.
Figure 21:
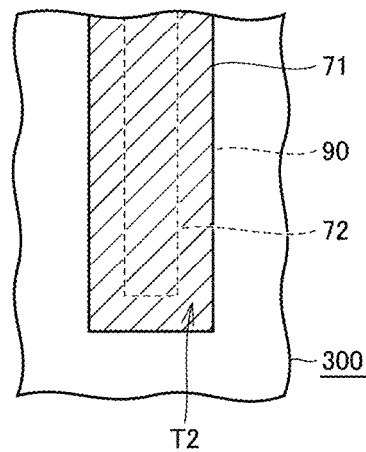
FIG. 21 is a sectional view of the magnetic sensor in FIG. 20, as viewed from the direction indicated by the arrow of line XXI-XXI in FIG. 20.
Figure 22:
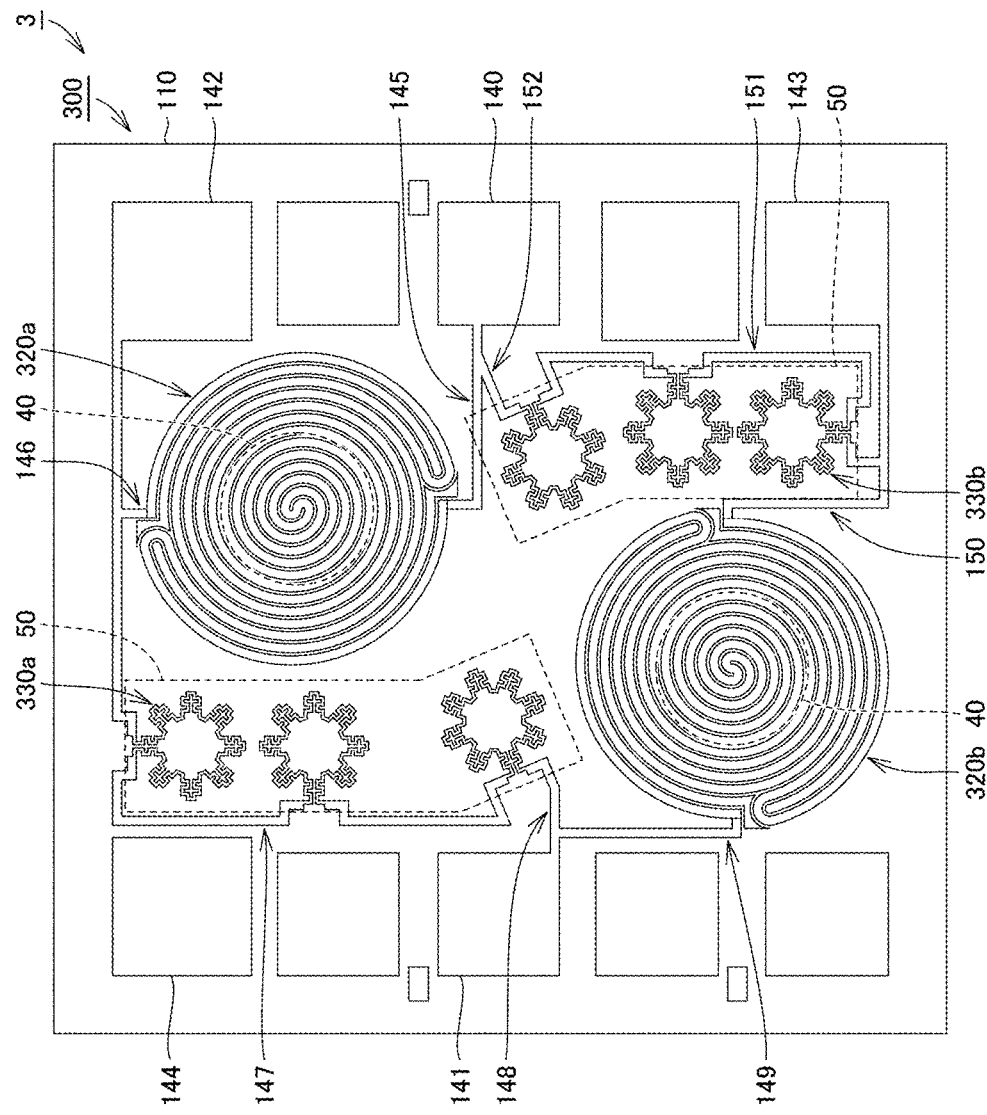
FIG. 22 is a plan view of the magnetic sensor in FIG. 19, as viewed from the direction indicated by the arrow XXII in FIG. 19.

FIG. 19 is a perspective view showing the magnetic sensor according to the sixth preferred embodiment of the present invention. FIG. 20 is a sectional view of the magnetic sensor in FIG. 19, as viewed from the direction indicated by the arrow of line XX-XX in FIG. 19. FIG. 21 is a sectional view of the magnetic sensor in FIG. 20, as viewed from the direction indicated by the arrow of line XXI-XXI in FIG. 20. FIG. 22 is a plan view of the magnetic sensor in FIG. 19, as viewed from the direction indicated by the arrow XXII in FIG. 19.

As shown in FIGS. 19 through 22, a magnetic sensor 3 according to the sixth preferred embodiment of the present invention includes a circuit substrate 300, and two first magnets 40 and two second magnets 50 provided above the circuit substrate 300. In the magnetic sensor 3 according to the sixth preferred embodiment of the present invention, on the circuit substrate 300, two first conductors 60 and two second conductors 70 are provided. A first stress relaxer 80 is provided along a portion of each of the first conductors 60. A second stress relaxer 90 is provided along a portion of each of the second conductors 70. An insulating layer 30 is provided on the front layer of the circuit substrate 300, and the two first conductors 60, the two second conductors 70, the first stress relaxers 80, and the second stress relaxers 90 are located on the insulating layer 30.

Each of the second conductors 70 includes a second base section 71 and a second narrow section 72. The area of the exterior surface of the second narrow section 72 as viewed from the Z-axis direction, which is perpendicular or substantially perpendicular to the insulating layer 30, is smaller than that of the second base section 71. In the second conductor 70, the second base section 71 and the second narrow section 72 are provided side by side in the Z-axis direction, which is perpendicular or substantially perpendicular to the insulating layer 30. In the sixth preferred embodiment, the second narrow section 72 of the second conductor 70 is positioned at the end portion of the second conductor 70 closer to the insulating layer 30 in the Z-axis direction, which is perpendicular or substantially perpendicular to the insulating layer 30. That is, the second narrow section 72 of the second conductor 70 contacts the insulating layer 30 on the circuit substrate 300.

As viewed from the Z-axis direction, which is perpendicular or substantially perpendicular to the insulating layer 30, the exterior surface of each of the second base section 71 and the second narrow section 72 is a rectangle or substantially a rectangle having bending corners. The width of the exterior surface of the second narrow section 72 is smaller than that of the second base section 71. The second base section 71 and the second narrow section 72 are provided coaxially or substantially coaxially. The second base section 71 is not restricted to the above-described shape and may have a circular or polygonal shape, for example. The second narrow section 72 is not restricted to the above-described shape and may have any shape if the area of the exterior surface as viewed from the Z-axis direction, which is perpendicular or substantially perpendicular to the insulating layer 30, is smaller than that of the second base section 71.

The second narrow section 72 in the second conductor 70 provides a gap partially between the second base section 71 and the insulating layer 30. In the sixth preferred embodiment, the gap is provided between the second base section 71 and the insulating layer 30 all around the outer peripheral portion of the second conductor 70. The second stress relaxer 90 is provided in the gap.

The two second magnets 50 are located on the two second conductors 70 in a one-on-one relationship. The second magnets 50 cover the associated second conductors 70, as viewed from the Z-axis direction, which is perpendicular or substantially perpendicular to the insulating layer 30.

With a view to decreasing the distance between each second magnet 50 and the circuit substrate 300, the thickness of the second conductor 70 in the Z-axis direction, that is, the total thickness of the second base section 71 and the second narrow section 72 in the Z-axis direction, is preferably about 2.0 µm or smaller, for example. As the distance between the second magnet 50 and the circuit substrate 300 is smaller, the magnetic shielding function of the second magnet 50 is able to be provided more effectively. To form the second conductor 70, patterning with a resist, for example, may be utilized.

In the sixth preferred embodiment, the second conductor is positioned on the insulating layer 30 and is preferably defined by, for example, a layer including titanium (Ti) and a layer including gold (Au) in this order from the bottom. The layer including titanium (Ti) is a contact layer. If the second magnet 50 is formed with electrolytic plating, the layer including gold (Au) defines and functions as an electrode reaction layer, that is, a seed layer. The second conductor 70 is not limited to the above-described features, and may include a layer made of at least one of iron (Fe), molybdenum (Mo), tantalum (Ta), platinum (Pt), and copper (Cu), which are materials defining and functioning as a plating seed layer. If the second magnet 50 is formed by a method other than plating, for example, by vapor-deposition, the second conductor 70 may be defined by a conductor including at least one of a metal or a resin.

Each of the second stress relaxers 90 is provided in a region T2 which is surrounded by the exterior surface of the second narrow section 72 and also by the exterior surface of the second base section 71, as viewed from the Z-axis direction, which is perpendicular or substantially perpendicular to the insulating layer 30. In the sixth preferred embodiment, the second stress relaxer 90 is sandwiched between the second base section 71 and the insulating layer 30. The second stress relaxer 90 is located immediately under the outer peripheral portion of the second base section 71. As viewed from the Z-axis direction, which is perpendicular or substantially perpendicular to the insulating layer 30, the second stress relaxer 90 has a polygonal angular-ring shape in horizontal cross section. The second stress relaxer 90 is not limited to this shape. To form the second stress relaxer 90, patterning with a resist, for example, may be utilized.

The second stress relaxer 90 is made of a material different from that of the second conductor 70. As the material for the second stress relaxer 90, at least one of a material having a lower adhesiveness, a material having a lower elastic modulus, and a material having a lower tensile strength than the material of the second conductor 70 may preferably be used.

If the second stress relaxer 90 includes a material having a low adhesiveness, a layer including a low-adhesiveness material is provided in contact with the insulating layer 30. The material of the second stress relaxer 90 having a lower adhesiveness than that of the second conductor 70 is preferably, for example, gold (Au) or polyimide. For example, the second conductor 70 is preferably defined by a layer including titanium (Ti) on the insulating layer 30 and a layer including gold (Au) on the layer including titanium (Ti). The second stress relaxer 90 is defined only by a layer including gold (Au).

The material of the second stress relaxer 90 having an elastic modulus lower than that of the second conductor 70 is preferably a resin, for example, polyimide. The material of the second stress relaxer 90 having a tensile strength lower than that of the second conductor 70 is preferably, for example, $SiO_2$ or a low-density resin. To form the second stress relaxer 90 including $SiO_2$, SOG (Spin-on Glass) may be applied onto the insulating layer 30.

As shown in FIG. 22, four magnetoresistance elements electrically connected with each other by wiring to define a Wheatstone bridge circuit are provided on the circuit substrate 300 of the magnetic sensor 3 according to the sixth preferred embodiment of the present invention. The four magnetoresistance elements are defined by two pairs of first magnetoresistance elements and second magnetoresistance elements. More specifically, the magnetic sensor 3 includes first and second magnetoresistance elements 320a and 330a and first and second magnetoresistance elements 320b and 330b. The first and second magnetoresistance elements 320a and 330a define one pair. The first and second magnetoresistance elements 320b and 330b define the other pair.

Figure 23:
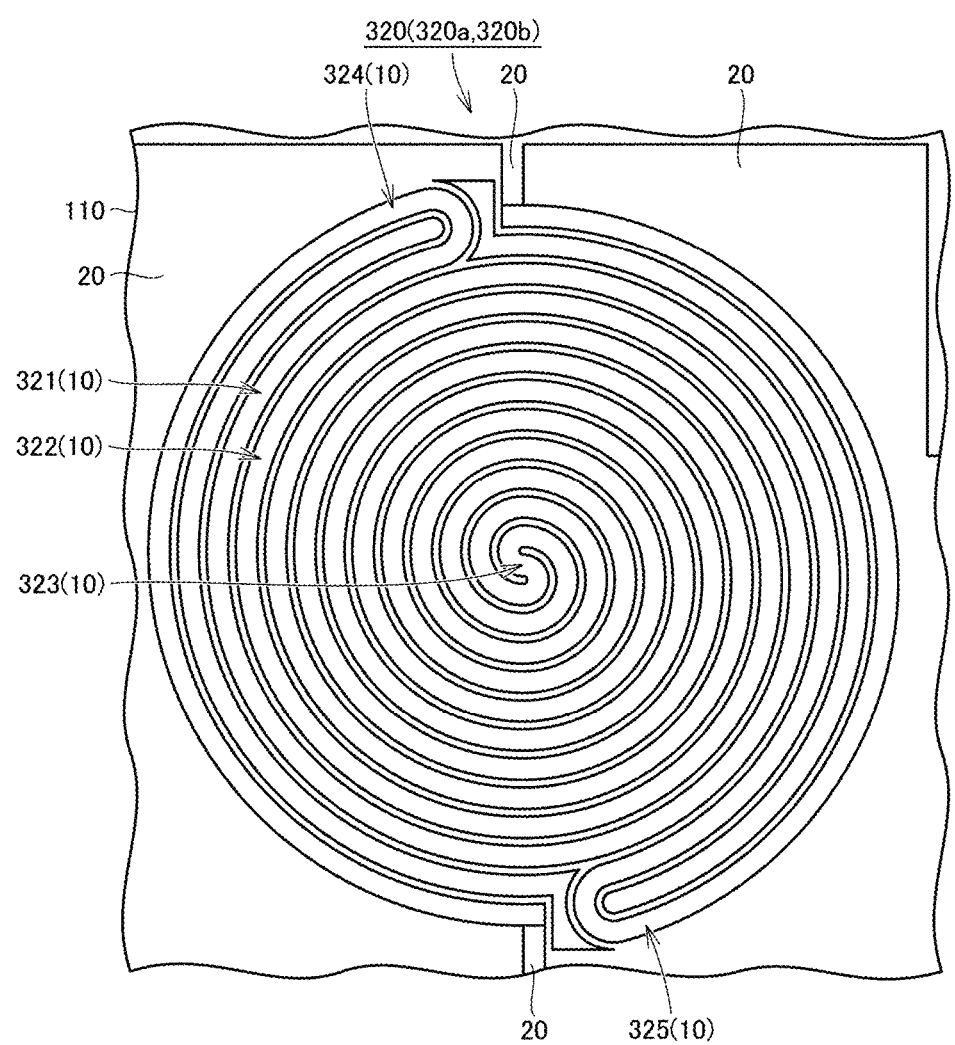
FIG. 23 is a plan view showing a pattern of a first magnetoresistance element of the magnetic sensor according to the sixth preferred embodiment of the present invention.

FIG. 23 is a plan view showing a pattern of each of the first magnetoresistance elements of the magnetic sensor according to the sixth preferred embodiment of the present invention. As shown in FIGS. 22 and 23, each of the first magnetoresistance elements 320a and 320b has a double-spiral pattern 320, as viewed from the direction perpendicular or substantially perpendicular to the insulating layer 30. The double-spiral pattern 320 includes two first patterns. The two first patterns are concentrically provided along the circumference of an imaginary circle and side by side one another in the radial direction of the imaginary circle and are connected with each other, as viewed from the direction perpendicular or substantially perpendicular to the insulating layer 30.

The double-spiral pattern 320 includes spiral patterns 321 and 322 and an S-shaped pattern 323. The spiral pattern 321 is one of the two first patterns, while the spiral pattern 322 is the other one of the two first patterns. The S-shaped pattern 323 connects the spiral patterns 321 and 322 at the central portion of the double-spiral pattern 320. The S-shaped pattern 323 does not have any linearly extending portions and are defined only by curved portions.

The double-spiral pattern 320 includes a length-adjusting surplus section 324 at one end of the spiral pattern 321 and a length-adjusting surplus section 325 at one end of the spiral pattern 322. The length-adjusting surplus sections 324 and 325 adjust the length of the double-spiral pattern 320. The end of the spiral pattern 321 is curved and bends back at its end to define the length-adjusting surplus section 324. The end of the spiral pattern 322 is curved and bends back at its end to define the length-adjusting surplus section 325. The length-adjusting surplus section 324 provided at the spiral pattern 321 and the length-adjusting surplus section 325 provided at the spiral pattern 322 are located at the opposite sides in the radial direction of the double-spiral pattern 320. Each of the length-adjusting surplus sections 324 and 325 does not have any linearly extending portions and is defined only by curved portions.

The double-spiral pattern 320 is connected at its length-adjusting surplus sections 324 and 325 to the conductive layer 20 forming the wiring. The connecting positions between the length-adjusting surplus sections 324 and 325 and the conductive layer 20 are able to be changed to adjust the electrical resistance of the first magnetoresistance elements 320a and 320b.

More specifically, at the connecting portion between the region R defining and functioning as the magnetoresistance elements and the region L defining and functioning as the wiring shown in FIG. 6, the conductive layer 20 extends toward the region R to increase the region L. Thus, the electrical resistance of the first magnetoresistance elements 320a and 320b is able to be reduced. Conversely, at the connecting portion between the region R defining and functioning as the magnetoresistance elements and the region L defining and functioning as the wiring, the conductive layer 20 retreats toward the region L to decrease the region L. Thus, the electrical resistance of the first magnetoresistance elements 320a and 320b is able to be increased.

The above-described adjustment of the electrical resistance of the first magnetoresistance elements 320a and 320b is performed by partially removing or adding the conductive layer 20, and is thus preferably done before the insulating layer 30 is formed, for example.

As shown in FIG. 23, the double-spiral pattern 320 is substantially point-symmetrical with respect to the center of the double-spiral pattern 320. That is, the double-spiral pattern 320 is rotationally symmetrical with respect to the center of the double-spiral pattern 320 by about 180°.

As shown in FIG. 22, the orientation of the circumferential direction of the double-spiral pattern 320 of the first magnetoresistance element 320a and that of the first magnetoresistance element 320b are different from each other so that the orientation of the S-shaped pattern 323 of the first magnetoresistance element 320a and that of the first magnetoresistance element 320b become different.

In the sixth preferred embodiment, the orientation of the circumferential direction of the double-spiral pattern 320 of the first magnetoresistance element 320a and that of the first magnetoresistance element 320b are different from each other by about 90°, for example, so that the orientation of the S-shaped pattern 323 of the first magnetoresistance element 320a and that of the first magnetoresistance element 320b become different from each other by about 90°, for example.

The double-spiral pattern 320 may be wound in the opposite direction, in which case, the central portion of the double-spiral pattern 320 is a reversed-S-shaped pattern defined only by curved portions. That is, one spiral pattern 321 and the other spiral pattern 322 are connected with each other by the reversed-S-shaped pattern.

Figure 24:
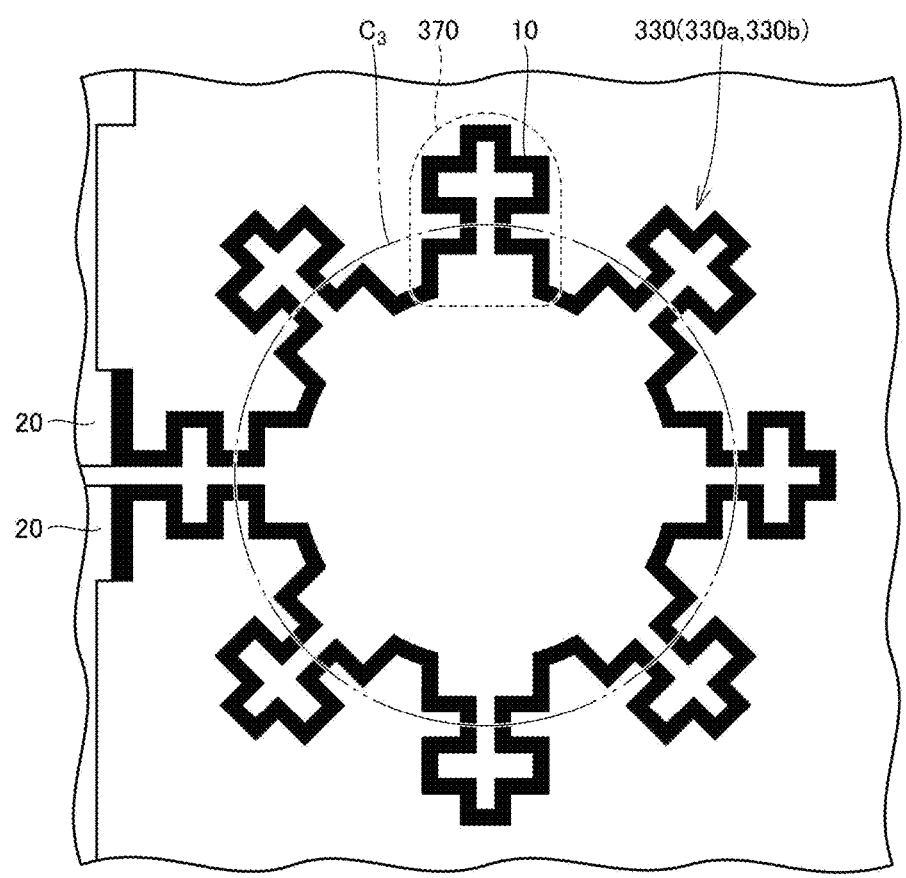
FIG. 24 is a plan view showing a pattern of a second magnetoresistance element of the magnetic sensor according to the sixth preferred embodiment of the present invention.
Figure 25:
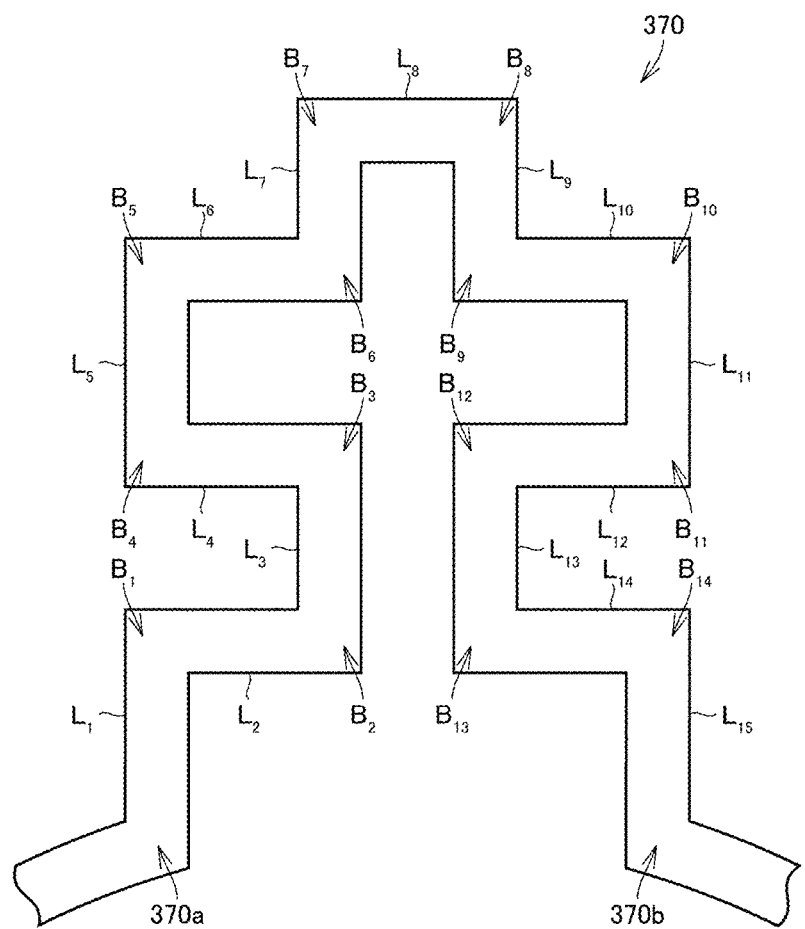
FIG. 25 is a plan view showing a second pattern included in the pattern of the second magnetoresistance element of the magnetic sensor according to the sixth preferred embodiment of the present invention.

FIG. 24 is a plan view showing a pattern of each second magnetoresistance element of the magnetic sensor according to the sixth preferred embodiment of the present invention. FIG. 25 is a plan view showing a second pattern included in the pattern of each second magnetoresistance element of the magnetic sensor according to the sixth preferred embodiment of the present invention. In FIG. 24, among three patterns 330 having the same or substantially the same shape included in each of the second magnetoresistance elements 330a and 330b, only one pattern 330 is shown.

As shown in FIGS. 22 and 24, the second magnetoresistance elements 330a and 330b are located farther outward than the outer peripheral edges of the first magnetoresistance elements 320a and 320b, as viewed from the direction perpendicular or substantially perpendicular to the insulating layer 30.

In each of the second magnetoresistance elements 330a and 330b, the three patterns 330 having the same or substantially the same shape and each including eight second patterns 370 are connected in series with each other. Each second pattern 370 includes bending portions. In the second magnetoresistance element 330a, the three patterns 330 having the same or substantially the same shape are connected with each other by wiring 147. In the second magnetoresistance element 330b, the three patterns 330 having the same or substantially the same shape are connected with each other by wiring 151. The patterns 330 are formed thinner than the double-spiral patterns 320. Accordingly, a predetermined electrical resistance in the second magnetoresistance elements 330a and 330b is able to be provided. As the electrical resistance of the second magnetoresistance elements 330a and 330b is higher, the current consumed in the magnetic sensor 3 is able to be reduced by a greater amount.

As shown in FIG. 24, the eight second patterns 370 are provided on an imaginary circle $C_3$ and are connected with each other. As shown in FIG. 25, each second pattern 370 has fourteen bending portions $B_1$ through $B_{14}$ and fifteen linearly extending portions $L_1$ through $L_{15}$ in a region from a starting portion 370a to a terminating portion 370b so that it bends back at the corners. The second pattern 370 has a bag shape using the starting portion 370a and the terminating portion 370b to form the mouth portion of the bag.

In the sixth preferred embodiment, the second pattern 370 bends at a right angle at each of the fourteen bending portions $B_1$ through $B_{14}$. The second pattern 370 does not include any linearly extending portions having a length of about 10 μm or longer. That is, each of the fifteen linearly extending portions $L_1$ through $L_{15}$ preferably has a length shorter than about 10 μm, for example.

However, the second magnetoresistance elements 330a and 330b are not limited to the above-described pattern and may any pattern if they each include at least one second pattern defined by plural bending portions without having any linearly extending portion of a length of about 10 μm or longer.

With the above-described pattern, the magnetoresistance effect of the second magnetoresistance elements 330a and 330b is reduced to significantly decrease their resistance change rate. As a result, the resistance change rate of the second magnetoresistance elements 330a and 330b becomes smaller than that of the first magnetoresistance elements 320a and 320b.

In the magnetic sensor 3 according to the sixth preferred embodiment, each of the first magnetoresistance elements 320a and 320b has the double-spiral pattern 320. The double-spiral pattern 320 is provided principally by winding substantially circular-arc curved portions. The shape of a circular arc approximates to a shape having an infinite number of corners of a polygon. Thus, the direction of a current flowing through the double-spiral pattern 320 covers about 360° in the horizontal direction. The first magnetoresistance elements 320a and 320b are thus able to detect an external magnetic field at about 360° in the horizontal direction.

In the magnetic sensor 3 according to the sixth preferred embodiment, the center of the double-spiral pattern 320 is the S-shaped pattern 323 defined only by curved portions, and the peripheral portions are the length-adjusting surplus sections 324 and 325 defined by curved portions. Accordingly, the first magnetoresistance elements 320a and 320b do not have any linearly extending portions, thus reducing the anisotropic characteristics in detecting a magnetic field.

In the magnetic sensor 3 according to the sixth preferred embodiment, the orientation of the circumferential direction of the double-spiral pattern 320 of the first magnetoresistance element 320a and that of the first magnetoresistance element 320b are different from each other so that the orientation of the S-shaped pattern 323 of the first magnetoresistance element 320a and that of the first magnetoresistance element 320b become different, thus improving the isotropic characteristics in detecting a magnetic field.

In the magnetic sensor 3 according to the sixth preferred embodiment, each of the second magnetoresistance elements 330a and 330b includes the following second patterns 370. The second pattern 370 bends at a right angle at each of the fourteen bending portions $B_1$ through $B_{14}$ without having any linearly extending portion having a length of about 10 μm or longer to define a bag shape using the starting portion 370a and the terminating portion 370b to form the mouth portion of the bag.

Accordingly, the orientation of the current flowing through the second pattern 370 is able to be distributed in the horizontal direction, thus reducing the anisotropic characteristics of the magnetoresistance effect of each of the second magnetoresistance elements 330a and 330b. Thus, output variations of the magnetic sensor 3 when the external magnetic field is 0, which would be caused by the influence of residual magnetization, are able to be significantly reduced.

Additionally, the plural second patterns 370 are provided on the imaginary circle $C_3$ to distribute the orientation of the current flowing through the pattern 330 in the horizontal direction, thus reducing the anisotropic characteristics of the magnetoresistance effect of each of the second magnetoresistance elements 330a and 330b.

In the magnetic sensor 3 according to the sixth preferred embodiment, it is not necessary to three-dimensionally lay the wiring to connect the first magnetoresistance elements 320a and 320b and the second magnetoresistance elements 330a and 330b. Thus, the circuit substrate 300 is able to be manufactured with a simple manufacturing process.

The pattern 330 is thinner than the double-spiral pattern 320. Accordingly, the magnetoresistance effect of the second magnetoresistance elements 330a and 330b is able to be significantly reduced, to thus significantly decrease their resistance change rate.

Therefore, the potential difference generated between the nodes 140 and 141 may be increased when an external magnetic field is applied to the magnetic sensor 3, thus improving the detection sensitivity of the magnetic sensor 3. Additionally, since the electrical resistance of the second magnetoresistance elements 330a and 330b is high, there is only a relatively small decrease in the potential difference generated between the nodes 140 and 141 when an external magnetic field having a high magnetic field strength is applied to the magnetic sensor 3, thus stabilizing the output characteristics of the magnetic sensor 3.

In the magnetic sensor 3 according to the sixth preferred embodiment, the two first magnets 40 and the two second magnets 50 are provided on the insulating layer 30. The thickness of each of the first magnets 40 and the second magnets 50 is preferably about 10 μm or greater, for example, and more preferably, for example, about 20 μm to about 150 μm. The thicknesses of the first and second magnets 40 and 50 may be different from each other. However, if the two first magnets 40 and the two second magnets 50 have the same or substantially the same thickness, they may be formed in the same step, thus facilitating the formation of the two first magnets 40 and the two second magnets 50.

As shown in FIG. 22, as viewed from the direction perpendicular or substantially perpendicular to the insulating layer 30, the first magnets 40 have an externally circular or substantially circular shape and are located in the regions farther inward than the outer peripheral edges of the first magnetoresistance elements 320a and 320b. In the sixth preferred embodiment, the first magnets 40 are located concentrically with the outer peripheral edges of the first magnetoresistance elements 320a and 320b, as viewed from the direction perpendicular or substantially perpendicular to the insulating layer 30.

In the sixth preferred embodiment, as viewed from the direction perpendicular or substantially perpendicular to the insulating layer 30, the first magnets 40 cover only the central portions of the first magnetoresistance elements 320a and 320b among the first magnetoresistance elements 320a and 320b and the second magnetoresistance elements 330a and 330b. The first magnets 40 are thus surrounded by the outer peripheral portions of the first magnetoresistance elements 320a and 320b, as viewed from the direction perpendicular or substantially perpendicular to the insulating layer 30.

As viewed from the direction perpendicular or substantially perpendicular to the insulating layer 30, the second magnets 50 do not cover the first magnetoresistance elements 320a and 320b, but cover the second magnetoresistance elements 330a and 330b. As viewed from the direction perpendicular or substantially perpendicular to the insulating layer 30, each of the second magnetoresistance elements 330a and 330b is preferably positioned, for example, in the area from the center of the second magnet 50 to the position separated inward from the outer peripheral edge of the second magnet 50 by about 7 μm. The second magnets 50 are preferably made of a magnetic material having a high permeability and a high saturation magnetic flux density, for example, electromagnetic steel, mild steel, silicon steel, permalloy, supermalloy, a nickel alloy, an iron alloy, or ferrite. These magnetic materials preferably have low magnetic coercivity, for example.

The magnetic sensor 3 of the sixth preferred embodiment of the present invention is able to significantly improve the detection sensitivity of the first magnetoresistance elements 320a and 320b for a vertical magnetic field by using the first magnets while reducing a change in the resistance of the second magnetoresistance elements 330a and 330b in response to a vertical magnetic field.

The magnetic sensor 3 of the sixth preferred embodiment of the present invention is able to also significantly improve the detection sensitivity of the first magnetoresistance elements 320a and 320b for a horizontal magnetic field by using the first magnets while reducing a change in the resistance of the second magnetoresistance elements 330a and 330b in response to a horizontal magnetic field by using the second magnets 50.

The significant improvement in detection sensitivity of the first magnetoresistance elements 320a and 320b for a horizontal magnetic field by the first magnets 40 is described below. The strength of a horizontal magnetic field applied to the central portion of each of the first magnetoresistance elements 320a and 320b is low because the central portion thereof is covered by the first magnet 40. Yet, a horizontal-direction magnetic field output from the first magnet 40 at a high magnetic field strength is applied to the outer peripheral portion of each of the first magnetoresistance elements 320a and 320b, which has a longer circumference and has a higher resistance ratio to that of the entire pattern than the central portion. As a whole, the strength of the horizontal magnetic field applied from the first magnets 40 to the first magnetoresistance elements 320a and 320b becomes high.

The magnetic sensor 3 according to the sixth preferred embodiment is also able to detect a vertical magnetic field and a horizontal magnetic field with high sensitivity. In the magnetic sensor 3 according to the sixth preferred embodiment of the present invention, each of the first magnetoresistance elements 320a and 320b includes concentrically provided multiple first patterns, thus improving the isotropic characteristics in detecting a horizontal magnetic field.

In the present preferred embodiment, the second magnetoresistance elements 330a and 330b are magnetically shielded by the second magnets 50 and hardly detect vertical magnetic fields and horizontal magnetic fields. The resistance change rate of the second magnetoresistance elements 330a and 330b may not necessarily be smaller than that of the first magnetoresistance elements 320a and 320b.

In the magnetic sensor 3 according to the sixth preferred embodiment of the present invention, the second conductors 70 and the second stress relaxers 90 are provided between the second magnets 50 and the circuit substrate 300. Each second conductor includes the second base section 71 and the second narrow section 72, and the second narrow section 72 of the second conductor 70 contacts the circuit substrate 300. The second stress relaxer 90 is provided in a gap between the second base section 71 and the insulating layer 30. The second stress relaxer 90 is a component or element including a material different from the second conductor 70. The second stress relaxer 90 includes at least one of a material having a lower adhesiveness, a material having a lower elastic modulus, and a material having a lower tensile strength than the material of the second conductor 70.

Accordingly the contact area between the second conductor 70 and the circuit substrate 300 is able to be significantly increased, thus decreasing a stress applied from the second magnet 50 to each of the second magnetoresistance elements 330a and 330b via the second conductor 70. Additionally, the second stress relaxer 90 is provided immediately under the outer peripheral portion of the second base section 71. The second stress relaxer 90 is able to thus relax a stress caused by a distortion produced at the outer peripheral portion of the second magnet 50 to be applied to the circuit substrate 300.

More specifically, if the second stress relaxer 90 is made of a material having a lower adhesiveness than the material of the second conductor 70, when the second stress relaxer 90 is subjected to a stress caused by a distortion produced at the outer peripheral portion of the second magnet 50, it separates from a component or element adjacent to the second stress relaxer 90. Accordingly, transmission of the stress to the adjacent component or element via the second stress relaxer 90 is significantly reduced or prevented.

If the second stress relaxer 90 is made of a material having a lower elastic modulus than the material of the second conductor 70, when the second stress relaxer 90 is subjected to a stress caused by a distortion produced at the outer peripheral portion of the second magnet 50, it elastically deforms to absorb the stress. Accordingly, transmission of the stress to a component or element adjacent to the second stress relaxer 90 via the second stress relaxer 90 is significantly reduced or prevented.

If the second stress relaxer 90 is made of a material having a lower tensile strength than the material of the second conductor 70, when the second stress relaxer 90 is subjected to a stress caused by a distortion produced at the outer peripheral portion of the second magnet 50, it cracks and separates from a component or element adjacent to the second stress relaxer 90. Accordingly, transmission of the stress to the adjacent component or element via the second stress relaxer 90 is significantly reduced or prevented.

Thus, the second stress relaxer 90 is able to relax a stress caused by a distortion produced at the outer peripheral portion of the second magnet 50 to be applied from the second magnet 50 to each of the second magnetoresistance elements 130a and 130b via the second conductor 70. Accordingly, a decrease in the output accuracy of the magnetic sensor 3 is able to be regulated. It is also less likely that the insulating layer 30 cracks due to a stress applied from the second magnet 50 to the insulating layer 30 via the second conductor 70. Thus, the reliability of the magnetic sensor 3 is able to be maintained.

In the sixth preferred embodiment, a gap is provided between the second base section 71 and the insulating layer 30 all around the outer peripheral portion of the second conductor 70. Thus, the application of a stress caused by a distortion produced at the outer peripheral portion of the second magnet 50 to the circuit substrate 300 via the second conductor 70 is able to be significantly reduced.

The magnetic sensor 3 according to the sixth preferred embodiment of the present invention also provides high isotropic characteristics in detecting a horizontal magnetic field and is also able to detect a weak vertical magnetic field by using magnetoresistance elements. The magnetic sensor 3 is also able to regulate a decrease in the output accuracy, which would be caused by a stress applied to the magnetoresistance elements from a structure provided above the magnetoresistance elements.

Features, components, and elements of the first conductor 60a according to the second preferred embodiment may be applied to the second conductor 70. Accordingly, the second narrow section of the second conductor is located at the end portion of the second conductor closer to the second magnet 50 in the direction perpendicular or substantially perpendicular to the insulating layer 30.

The second stress relaxer 90 is provided in a region which is surrounded by the exterior surface of the second narrow section 72 and also by the exterior surface of the second base section 71 of the second conductor, as viewed from the direction perpendicular or substantially perpendicular to the insulating layer 30. The second stress relaxer 90 is sandwiched between the second base section 71 and the second magnet 50. The second stress relaxer 90 is located immediately under the outer peripheral portion of the second magnet 50.

Alternatively, the features, components, and elements of the first conductor 60b according to the third preferred embodiment may be applied to the second conductor 70. Accordingly, the second base section 71 of the second conductor 70 is located at the end portion of the second conductor 70 closer to the insulating layer and that closer to the second magnet 50 in the direction perpendicular or substantially perpendicular to the insulating layer 30. The second narrow section 72 of the second conductor is sandwiched between the second base sections 71 of the second conductor in the direction perpendicular or substantially perpendicular to the insulating layer 30.

The second stress relaxer 90 is provided in a region which is surrounded by the exterior surface of the second narrow section 72 and also by the exterior surface of the second base section 71 of the second conductor, as viewed from the direction perpendicular or substantially perpendicular to the insulating layer 30. The second stress relaxer 90 is sandwiched between the second base sections 71. The second stress relaxer 90 is located immediately under the outer peripheral portion of the second base section 71 positioned at the end portion of the second conductor closer to the second magnet 50.

Alternatively, the features, components, and elements of the first magnet 40a according to the fourth preferred embodiment may be applied to the second magnet 50. Accordingly, the magnetic sensor 3 does not include the second conductor 70. The second magnet includes a second base section and a second narrow section. The area of the exterior surface of the second narrow section is smaller than that of the second base section, as viewed from the direction perpendicular or substantially perpendicular to the insulating layer 30. In the second magnet, the second base section and the second narrow section are provided side by side in the direction perpendicular or substantially perpendicular to the insulating layer 30. The second narrow section of the second magnet is positioned at the end portion of the second magnet closer to the insulating layer 30 in the direction perpendicular or substantially perpendicular to the insulating layer 30.

The second stress relaxer 90 is provided in a region which is surrounded by the exterior surface of the second narrow section and also by the exterior surface of the second base section of the second magnet, as viewed from the direction perpendicular or substantially perpendicular to the insulating layer 30. The second stress relaxer 90 is sandwiched between the second base section of the second magnet and the insulating layer 30. The second stress relaxer 90 is located immediately under the outer peripheral portion of the second base section of the second magnet. The second stress relaxer 90 is made of a material different from the second magnet. The second stress relaxer 90 is preferably made of, for example, at least one of a material having a lower adhesiveness, a material having a lower elastic modulus, and a material having a lower tensile strength than the material of the second magnet.

Seventh Preferred Embodiment

A magnetic sensor according to a seventh preferred embodiment of the present invention will be described below with reference to the drawings. The magnetic sensor according to the seventh preferred embodiment of the present invention is different from the magnetic sensor 3 of the sixth preferred embodiment of the present invention mainly in the patterns of first and second magnetoresistance elements. An explanation of elements similar to those of the magnetic sensor 3 of the sixth preferred embodiment of the present invention will not be repeated.

Figure 26:
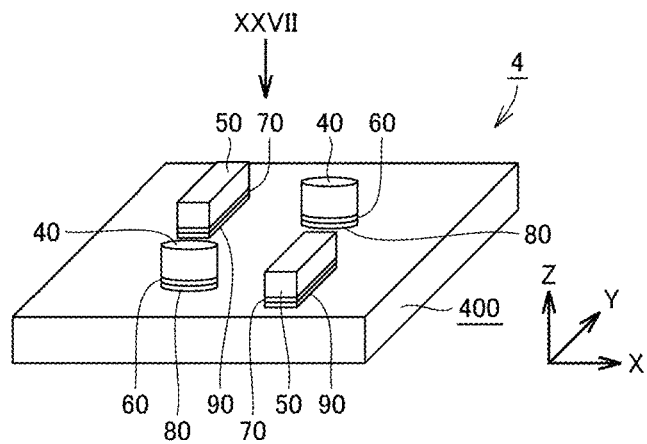
FIG. 26 is a perspective view showing a magnetic sensor according to a seventh preferred embodiment of the present invention.
Figure 27:
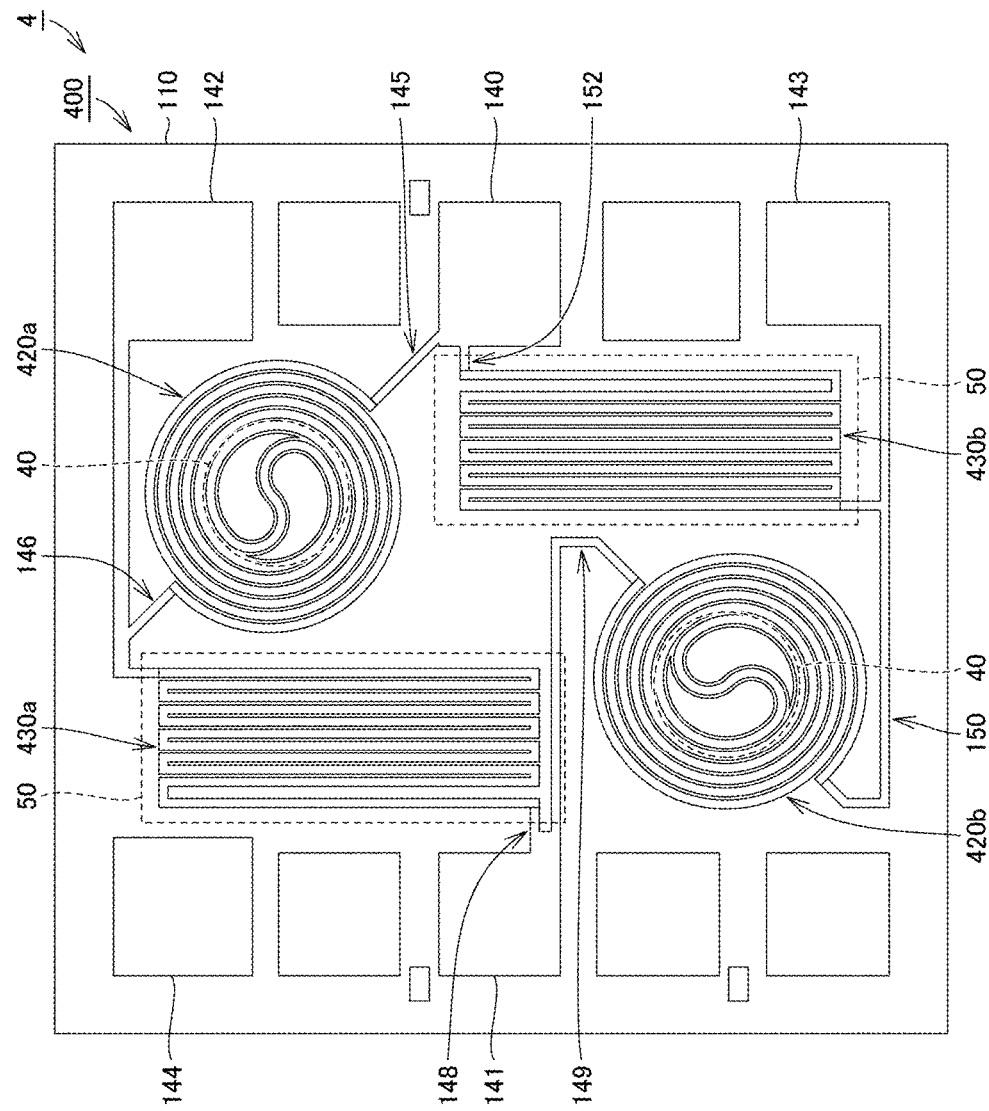
FIG. 27 is a plan view of the magnetic sensor in FIG. 26, as viewed from the direction indicated by the arrow XXVII in FIG. 26.

FIG. 26 is a perspective view showing the magnetic sensor according to the seventh preferred embodiment of the present invention. FIG. 27 is a plan view of the magnetic sensor in FIG. 26, as viewed from the direction indicated by the arrow XXVII in FIG. 26. As shown in FIGS. 26 and 27, a magnetic sensor 4 according to the seventh preferred embodiment of the present invention includes a circuit substrate 400 and two first magnets 40 and two second magnets 50 provided above the circuit substrate 400. In the magnetic sensor 4 according to the seventh preferred embodiment of the present invention, on the circuit substrate 400, two first conductors 60 and two second conductors 70 are provided. A first stress relaxer 80 is provided along a portion of each of the first conductors 60. A second stress relaxer 90 is provided along a portion of each of the second conductors 70. An insulating layer 30 is provided on the front layer of the circuit substrate 400, and the two first conductors 60, the two second conductors 70, the first stress relaxers 80, and the second stress relaxers 90 are located on the insulating layer 30. The first magnets 40 cover the associated first conductors 60, as viewed from the Z-axis direction, which is perpendicular or substantially perpendicular to the insulating layer 30. The second magnets 50 cover the associated second conductors 70, as viewed from the Z-axis direction, which is perpendicular or substantially perpendicular to the insulating layer 30.

Four magnetoresistance elements electrically connected with each other by wiring to define a Wheatstone bridge circuit are provided on the circuit substrate 400 of the magnetic sensor 4 according to the seventh preferred embodiment of the present invention. The four magnetoresistance elements are defined by two pairs of first magnetoresistance elements and second magnetoresistance elements. More specifically, the magnetic sensor 4 includes first and second magnetoresistance elements 420a and 430a and first and second magnetoresistance elements 420b and 430b.

Each of the first magnetoresistance elements 420a and 420b has a double-spiral pattern, as viewed from the direction perpendicular or substantially perpendicular to the insulating layer 30. The double-spiral pattern includes two first patterns. The two first patterns are concentrically provided along the circumference of an imaginary circle and side by side one another in the radial direction of the imaginary circle and are connected with each other, as viewed from the direction perpendicular or substantially perpendicular to the insulating layer 30.

The double-spiral pattern includes two spiral patterns, which are the two first patterns, and an S-shaped pattern. The S-shaped pattern connects the two spiral patterns at the central portion of the double-spiral pattern. The S-shaped pattern does not have any linearly extending portions and are defined only by curved portions.

The orientation of the circumferential direction of the double-spiral pattern of the first magnetoresistance element 420a and that of the first magnetoresistance element 420b are different from each other so that the orientation of the S-shaped pattern of the first magnetoresistance element 420a and that of the first magnetoresistance element 420b become different.

In the seventh preferred embodiment, the orientation of the circumferential direction of the double-spiral pattern of the first magnetoresistance element 420a and that of the first magnetoresistance element 420b are different from each other by about 90° so that the orientation of the S-shaped pattern of the first magnetoresistance element 420a and that of the first magnetoresistance element 420b become different from each other by about 90°, for example.

The double-spiral pattern may be wound in the opposite direction, in which case, the central portion of the double-spiral pattern is a reversed-S-shaped pattern defined only by curved portions. That is, one spiral pattern and the other spiral pattern are connected with each other by the reversed-S-shaped pattern.

As shown in FIG. 27, the second magnetoresistance elements 430a and 430b are located farther outward than the outer peripheral edges of the first magnetoresistance elements 420a and 420b, respectively, as viewed from the direction perpendicular or substantially perpendicular to the insulating layer 30. The second magnetoresistance elements 430a and 430b each have a meandering pattern, as viewed from the direction perpendicular or substantially perpendicular to the insulating layer 30. The meandering patterns of the second magnetoresistance elements 430a and 430b preferably have the same or substantially the same thickness as the double-spiral patterns of the first magnetoresistance elements 420a and 420b. However, these meandering patterns may be thinner than the double-spiral patterns of the first magnetoresistance elements 420a and 420b.

As shown in FIG. 27, as viewed from the direction perpendicular or substantially perpendicular to the insulating layer 30, the first magnets 40 have an externally circular shape and are located in the regions farther inward than the outer peripheral edges of the first magnetoresistance elements 420a and 420b. In the seventh preferred embodiment, the first magnets 40 are located concentrically with the outer peripheral edges of the first magnetoresistance elements 420a and 420b, as viewed from the direction perpendicular or substantially perpendicular to the insulating layer 30.

In the seventh preferred embodiment, as viewed from the direction perpendicular or substantially perpendicular to the insulating layer 30, the first magnets 40 cover only the central portions of the first magnetoresistance elements 420a and 420b among the first magnetoresistance elements 420a and 420b and the second magnetoresistance elements 430a and 430b. The first magnets 40 are thus surrounded by the outer peripheral portions of the first magnetoresistance elements 420a and 420b, as viewed from the direction perpendicular or substantially perpendicular to the insulating layer 30.

As viewed from the direction perpendicular or substantially perpendicular to the insulating layer 30, the second magnets 50 do not cover the first magnetoresistance elements 420a and 420b, but cover the second magnetoresistance elements 430a and 430b.

The magnetic sensor 4 of the seventh preferred embodiment of the present invention is able to significantly improve the detection sensitivity of the first magnetoresistance elements 420a and 420b for a vertical magnetic field by using the first magnets 40 while reducing a change in the resistance of the second magnetoresistance elements 430a and 430b in response to a vertical magnetic field.

The magnetic sensor 4 of the seventh preferred embodiment of the present invention is also able to significantly improve the detection sensitivity of the first magnetoresistance elements 420a and 420b for a horizontal magnetic field by using the first magnets 40 while reducing a change in the resistance of the second magnetoresistance elements 430a and 430b in response to a horizontal magnetic field by using the second magnets 50.

The magnetic sensor 4 according to the seventh preferred embodiment is also able to detect a vertical magnetic field and a horizontal magnetic field with high sensitivity. In the magnetic sensor 4 according to the seventh preferred embodiment of the present invention, each of the first magnetoresistance elements 420a and 420b includes concentrically provided multiple first patterns, thus improving the isotropic characteristics in detecting a horizontal magnetic field.

In the present preferred embodiment, the second magnetoresistance elements 430a and 430b are magnetically shielded by the second magnets 50 and hardly detect vertical magnetic fields and horizontal magnetic fields. The resistance change rate of the second magnetoresistance elements 430a and 430b may not necessarily be smaller than that of the first magnetoresistance elements 420a and 420b.

The magnetic sensor 4 according to the seventh preferred embodiment of the present invention also provides high isotropic characteristics in detecting a horizontal magnetic field and is also able to detect a weak vertical magnetic field by using magnetoresistance elements. The magnetic sensor 4 is also able to regulate a decrease in the output accuracy, which would be caused by a stress applied to the magnetoresistance elements from a structure provided above the magnetoresistance elements.

Eighth Preferred Embodiment

A magnetic sensor according to an eighth preferred embodiment of the present invention will be described below with reference to the drawings. The magnetic sensor according to the eighth preferred embodiment of the present invention is different from the magnetic sensor 1 of the first preferred embodiment of the present invention mainly in the patterns of the first and second magnetoresistance elements and the first magnets. An explanation of elements similar to those of the magnetic sensor 1 of the first preferred embodiment of the present invention will not be repeated.

Figure 28:
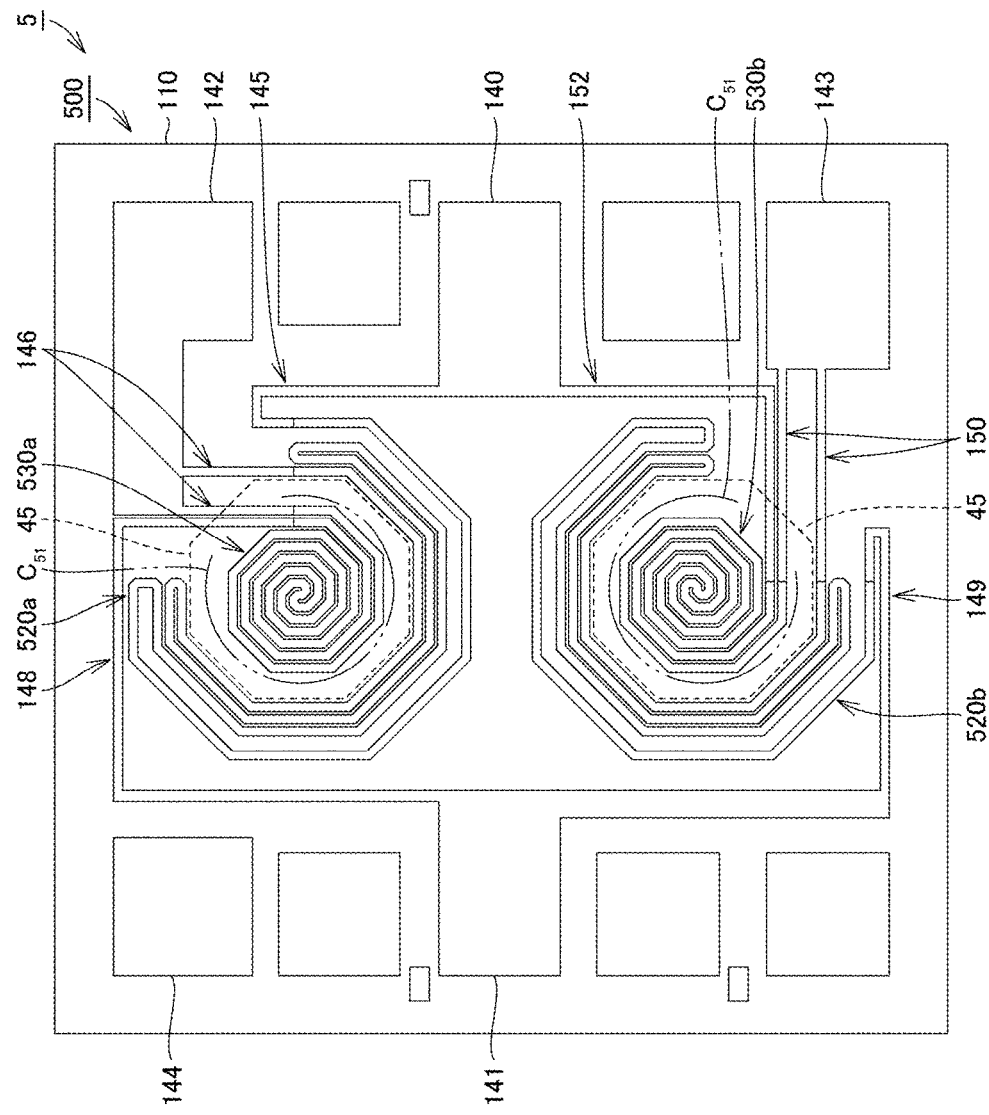
FIG. 28 is a plan view showing a magnetic sensor according to an eighth preferred embodiment of the present invention.
Figure 29:
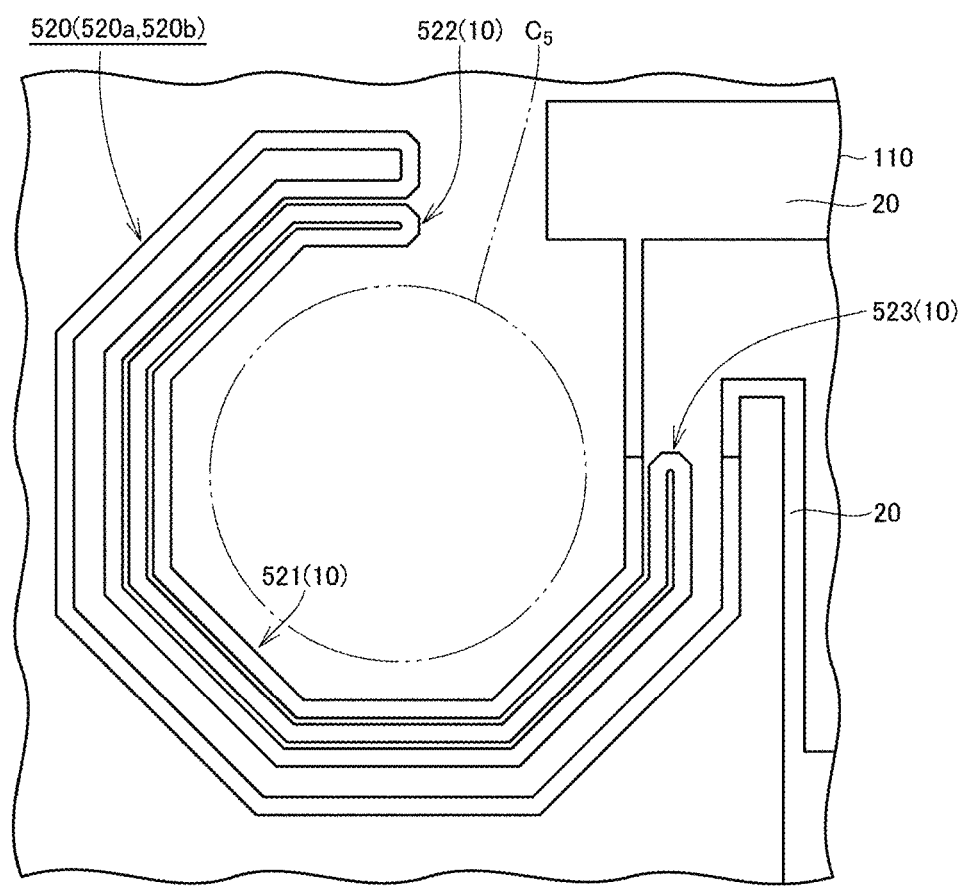
FIG. 29 is a plan view showing a pattern of a first magnetoresistance element of the magnetic sensor according to the eighth preferred embodiment of the present invention.
Figure 30:
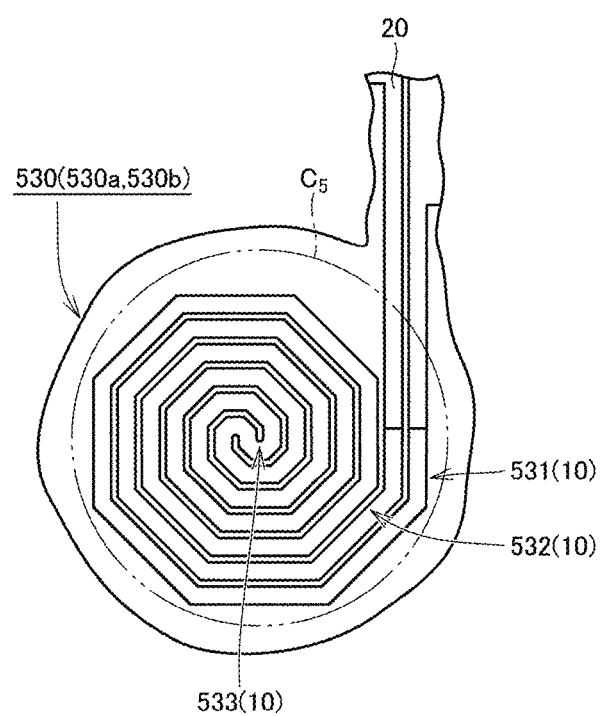
FIG. 30 is a plan view showing a pattern of a second magnetoresistance element of the magnetic sensor according to the eighth preferred embodiment of the present invention.

FIG. 28 is a plan view showing the magnetic sensor according to the eighth preferred embodiment of the present invention. FIG. 29 is a plan view showing a pattern of a first magnetoresistance element of the magnetic sensor according to the eighth preferred embodiment of the present invention. FIG. 30 is a plan view showing a pattern of a second magnetoresistance element of the magnetic sensor according to the eighth preferred embodiment of the present invention.

As shown in FIG. 28, a magnetic sensor 5 of the eighth preferred embodiment of the present invention includes a circuit substrate 500 and two first magnets 45 provided above the circuit substrate 500. In the magnetic sensor 5 according to the eighth preferred embodiment of the present invention, on the circuit substrate 500, two first conductors are provided. A first stress relaxer is provided along a portion of each of first conductors 60. The first magnets 45 cover the associated first conductors, as viewed from the direction perpendicular or substantially perpendicular to the insulating layer 30.

As shown in FIGS. 28 and 29, a pattern of each of first magnetoresistance elements 520a and 520b of the magnetic sensor 5 of the eighth preferred embodiment of the present invention includes four first patterns. The four first patterns are provided along the circumference of an imaginary circle $C_5$ and side by side one another in the radial direction of the imaginary circle $C_5$ and are connected with each other, as viewed from the direction perpendicular or substantially perpendicular to the insulating layer 30. The four first patterns are located along an imaginary C-shaped feature $C_{51}$, which is opened at a portion where wiring 146, 148, 150, and 152 is positioned, on the circumference of the imaginary circle $C_5$. The four first patterns are C-shaped patterns 521 concentrically provided along the imaginary C-shaped feature $C_{S1}$ and side by side one another in the radial direction of the imaginary circle $C_5$.

The four C-shaped patterns 521 are connected with each other alternately at one end and at the other end starting from inward. The C-shaped patterns 521 connected with each other at one end are connected with each other by a linear pattern 522 extending in the radial direction of the imaginary circle $C_5$. The C-shaped patterns 521 connected with each other at the other end are connected with each other by a linear pattern 523 extending in the radial direction of the imaginary circle $C_5$.

The pattern 520 of each of the first magnetoresistance elements 520a and 520b includes two linear patterns 522 and one linear pattern 523. Accordingly, the four C-shaped patterns 521 are connected in series with each other.

The outer peripheral edge of the C-shaped pattern 521 positioned at the outermost side is the outer peripheral edge of each of the first magnetoresistance elements 520a and 520b. The inner peripheral edge of the C-shaped pattern 521 positioned at the innermost side is the inner peripheral edge of each of the first magnetoresistance elements 520a and 520b.

As shown in FIG. 28, the orientation of the circumferential direction of the first magnetoresistance element 520a and that of the first magnetoresistance element 520b are different from each other so that the orientations of the imaginary C-shaped features $C_{S1}$ become different. That is, the orientation of the circumferential direction of the pattern 520 of the first magnetoresistance element 520a and that of the first magnetoresistance element 520b are different from each other so that the orientation of the C-shaped patterns 521 of the first magnetoresistance element 520a and that of the first magnetoresistance element 520b become different.

In the eighth preferred embodiment, the orientation of the circumferential direction of the pattern 520 of the first magnetoresistance element 520a and that of the first magnetoresistance element 520b differ from each other by about 90°, for example, so that the orientation of the C-shaped patterns 521 of the first magnetoresistance element 520a and that of the first magnetoresistance element 520b become different from each other by about 90°.

As shown in FIGS. 28 and 30, as viewed from the direction perpendicular or substantially perpendicular to the insulating layer 30, a second magnetoresistance element 530a is positioned at the central side of the imaginary circle $C_5$ and is surrounded by the first magnetoresistance element 520a, while a second magnetoresistance element 530b is positioned at the central side of the imaginary circle $C_5$ and is surrounded by the first magnetoresistance element 520b. That is, as viewed from the direction perpendicular or substantially perpendicular to the insulating layer 30, the second magnetoresistance element 530a is located farther inward than the inner peripheral edge of the first magnetoresistance element 520a, while the second magnetoresistance element 530b is located farther inward than the inner peripheral edge of the first magnetoresistance element 520b.

The second magnetoresistance element 530a is connected to the wiring 146 and 148 provided from the central side of the imaginary circle $C_5$ to the outer side of the imaginary circle $C_5$. The second magnetoresistance element 530b is connected to the wiring 150 and 152 provided from the central side of the imaginary circle $C_5$ to the outer side of the imaginary circle $C_5$.

Each of the second magnetoresistance elements 530a and 530b has a double-spiral pattern 530, as viewed from the direction perpendicular or substantially perpendicular to the insulating layer 30. The double-spiral pattern 530 includes spiral patterns 531 and 532 and a reversed-S-shaped pattern 533. The spiral pattern 531 is one of two second patterns, while the spiral pattern 532 is the other one of the two second patterns. The reversed-S-shaped pattern 533 connects the spiral patterns 531 and 532 at the central portion of the double-spiral pattern 530. The reversed-S-shaped pattern 533 is defined by multiple linearly extending portions having a length shorter than about 10 μm.

The double-spiral pattern 530 has the same or substantially the same thickness as the pattern 520. The spiral patterns 531 and 532 accordingly have the same or substantially the same thickness as each of the four C-shaped patterns 521. However, the double-spiral pattern 530 may be thinner than the pattern 520.

As shown in FIG. 30, the double-spiral pattern 530 is substantially point-symmetrical with respect to the center of the imaginary circle $C_5$. That is, the double-spiral pattern 530 is rotationally symmetrical with respect to the center of the imaginary circle $C_5$ by about 180°.

As shown in FIG. 28, the orientation of the circumferential direction of the double-spiral pattern 530 of the second magnetoresistance element 530a and that of the second magnetoresistance element 530b are different from each other so that the orientation of the reversed-S-shaped pattern 533 of the second magnetoresistance element 530a and that of the second magnetoresistance element 530b become different.

In the eighth preferred embodiment, the orientation of the circumferential direction of the double-spiral pattern 530 of the second magnetoresistance element 530a and that of the second magnetoresistance element 530b are different from each other by about 90°, for example, so that the orientation of the reversed-S-shaped pattern 533 of the second magnetoresistance element 530a and that of the second magnetoresistance element 530b become different from each other by about 90°, for example.

In the magnetic sensor 5 according to the eighth preferred embodiment, each of the first magnetoresistance elements 520a and 520b has the C-shaped patterns 521. The C-shaped patterns 521 are each defined by almost seven sides among the eight sides of a substantially regular octagon. Accordingly, the first magnetoresistance elements 520a and 520b are defined by most of the sides of a polygon, thus reducing the anisotropic characteristics in detecting a magnetic field.

Additionally, in the magnetic sensor 5 according to the eighth preferred embodiment, the orientation of the circumferential direction of the pattern 520 of the first magnetoresistance element 520a and that of the first magnetoresistance element 520b are different from each other so that the orientation of the C-shaped patterns 521 of the first magnetoresistance element 520a and that of the first magnetoresistance element 520b become different, thus improving the isotropic characteristics in detecting a magnetic field.

In the magnetic sensor 5 according to the eighth preferred embodiment, each of the second magnetoresistance elements 530a and 530b has the double-spiral pattern 530. The double-spiral pattern 530 is formed principally by winding the sides forming a substantially regular octagon.

In the magnetic sensor 5 according to the eighth preferred embodiment, the orientation of the circumferential direction of the double-spiral pattern 530 of the second magnetoresistance element 530a and that of the second magnetoresistance element 530b are different from each other so that the orientation of the reversed-S-shaped pattern 533 of the second magnetoresistance element 530a and that of the second magnetoresistance element 530b become different, thus improving the isotropic characteristics of the magnetoresistance effect.

In the magnetic sensor 5 according to the eighth preferred embodiment, the second magnetoresistance elements 530a and 530b are provided inward of the first magnetoresistance elements 520a and 520b, respectively, and thus the size of the magnetic sensor 5 is able to be significantly reduced.

Additionally, in the magnetic sensor 5, it is not necessary to three-dimensionally lay the wiring to connect the first magnetoresistance elements 520a and 520b and the second magnetoresistance elements 530a and 530b. Thus, the circuit substrate 500 is able to be manufactured with a simple manufacturing process.

In the magnetic sensor 5 according to the eighth preferred embodiment, the two first magnets 45 are provided above the insulating layer 30. As shown in FIG. 28, as viewed from the direction perpendicular or substantially perpendicular to the insulating layer 30, the first magnets 45 each have an externally regular-octagonal shape and are located in the regions farther inward than the outer peripheral edges of the first magnetoresistance elements 520a and 520b. The regions farther inward than the outer peripheral edges of the first magnetoresistance elements 520a and 520b are regions surrounded by the outer peripheral edges of the first magnetoresistance elements 520a and 520b when both ends of the outer peripheral edge of each of the first magnetoresistance elements 520a and 520b are connected with each other by an imaginary line, as viewed from the direction perpendicular or substantially perpendicular to the insulating layer 30. Preferably, for example, at least about one half, and more preferably, for example, at least about ⅔, of the region farther inward than the outer peripheral edge of each of the first magnetoresistance elements 520a and 520b overlaps the corresponding first magnet 45, as viewed from the direction perpendicular or substantially perpendicular to the insulating layer 30.

As viewed from the direction perpendicular or substantially perpendicular to the insulating layer 30, the first magnets 45 are located in the regions farther inward than the inner peripheral edges of the first magnetoresistance elements 520a and 520b. The first magnets 45 may be each located in a region including the inner peripheral edge of the corresponding one of the first magnetoresistance elements 520a and 520b and the area inward of the inner peripheral edge, as viewed from the direction perpendicular or substantially perpendicular to the insulating layer 30. The regions farther inward than the inner peripheral edges of the first magnetoresistance elements 520a and 520b are regions surrounded by the inner peripheral edges of the first magnetoresistance elements 520a and 520b when both ends of the inner peripheral edge of each of the first magnetoresistance elements 520a and 520b are connected with each other by an imaginary line, as viewed from the direction perpendicular or substantially perpendicular to the insulating layer 30. Preferably, for example, at least about one half, and more preferably, for example, at least about ⅔, of the region farther inward than the inner peripheral edge of each of the first magnetoresistance elements 520a and 520b overlaps the corresponding first magnet 45, as viewed from the direction perpendicular or substantially perpendicular to the insulating layer 30.

In the eighth preferred embodiment, the first magnets 45 are positioned concentrically with the outer peripheral edges of the first magnetoresistance elements 520a and 520b, as viewed from the direction perpendicular or substantially perpendicular to the insulating layer 30.

In the eighth preferred embodiment, the first magnets 45 do not cover the first magnetoresistance elements 520a and 520b, but cover the second magnetoresistance elements 530a and 530b, as viewed from the direction perpendicular or substantially perpendicular to the insulating layer 30. As viewed from the direction perpendicular or substantially perpendicular to the insulating layer 30, for example, at least about ½ of the entirety of the outer peripheral portion of each of the first magnet 45 is preferably surrounded by the corresponding first magnetoresistance elements 520a and 520b.

The magnetic sensor 5 according to the eighth preferred embodiment is also able to detect a vertical magnetic field and a horizontal magnetic field with high sensitivity. In the magnetic sensor 5 according to the eighth preferred embodiment of the present invention, each of the first magnetoresistance elements 520a and 520b includes multiple first patterns formed in a polygonal shape, thus improving the isotropic characteristics in detecting a horizontal magnetic field.

Although in the eighth preferred embodiment the first magnetoresistance elements 520a and 520b, the second magnetoresistance elements 530a and 530b, and the first magnets 45 have concentric regular-octagonal shapes, they may be have any concentric polygonal shape. With more corners of this polygonal shape, the isotropic characteristics of the first magnetoresistance elements 520a and 520b in detecting a horizontal magnetic field is able to be improved.

In the eighth preferred embodiment, the second magnetoresistance elements 530a and 530b are magnetically shielded by the first magnets 45 and hardly detect vertical magnetic fields and horizontal magnetic fields. The resistance change rate of the second magnetoresistance elements 530a and 530b may not necessarily be smaller than that of the first magnetoresistance elements 520a and 520b.

The magnetic sensor 5 according to the eighth preferred embodiment of the present invention also provides high isotropic characteristics in detecting a horizontal magnetic field and is also able to detect a weak vertical magnetic field by using magnetoresistance elements. The magnetic sensor 5 is also able to regulate a decrease in the output accuracy, which would be caused by a stress applied to the magnetoresistance elements from a structure provided above the magnetoresistance elements.

Ninth Preferred Embodiment

A magnetic sensor according to a ninth preferred embodiment of the present invention will be described below with reference to the drawings. The magnetic sensor according to the ninth preferred embodiment of the present invention is different from the magnetic sensor 1c of the fourth preferred embodiment of the present invention mainly in the patterns of the first and second magnetoresistance elements. An explanation of elements similar to those of the magnetic sensor 1c of the fourth preferred embodiment of the present invention will not be repeated.

Figure 31:
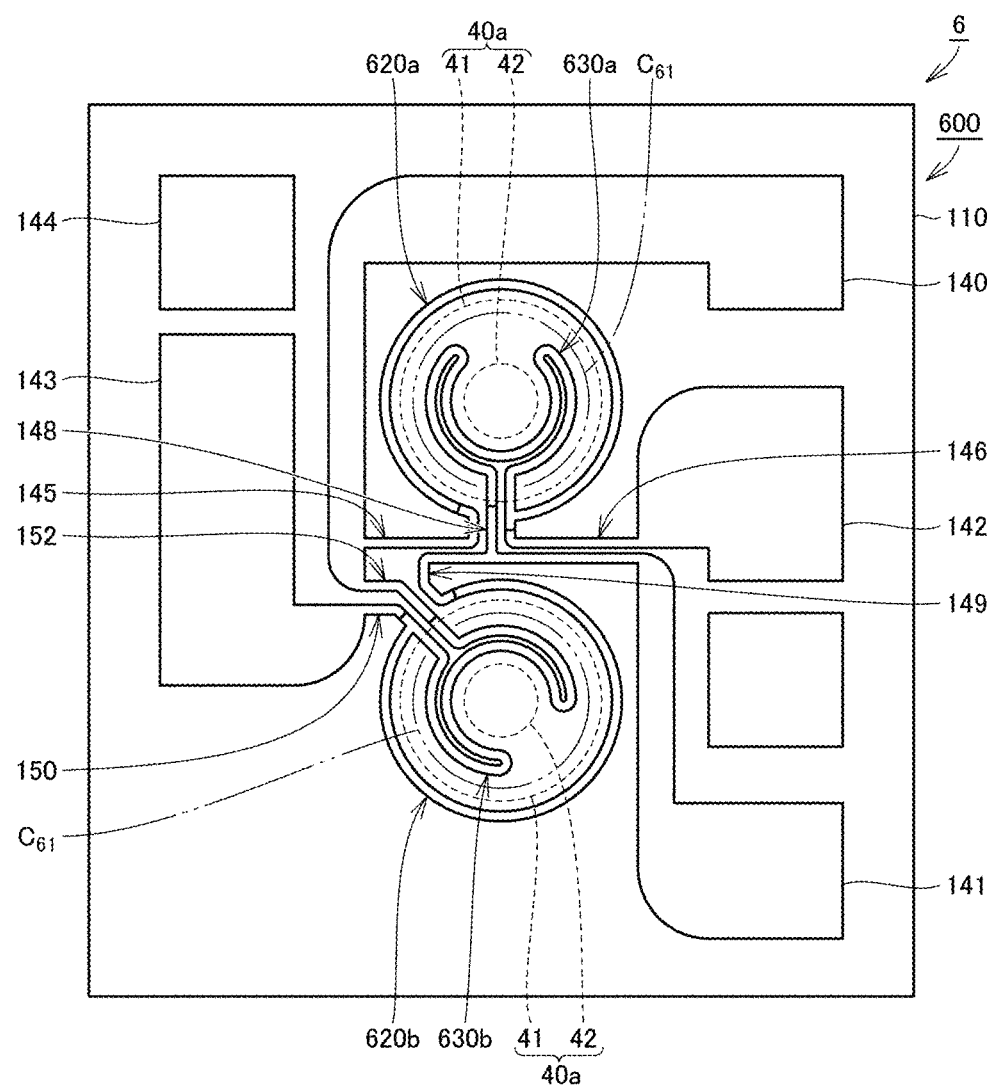
FIG. 31 is a plan view of a magnetic sensor according to a ninth preferred embodiment of the present invention.
Figure 32:
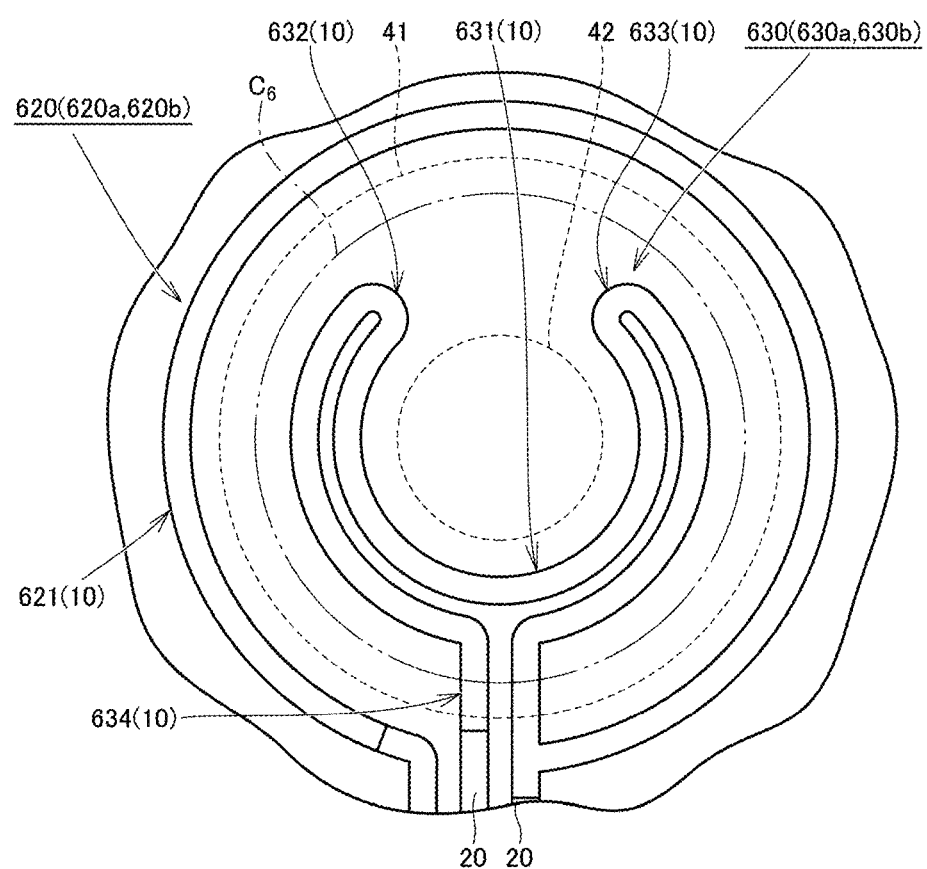
FIG. 32 is a plan view showing a pattern of a first magnetoresistance element and that of a second magnetoresistance element of the magnetic sensor according to the ninth preferred embodiment of the present invention.

FIG. 31 is a plan view of the magnetic sensor according to the ninth preferred embodiment of the present invention. FIG. 32 is a plan view showing a pattern of a first magnetoresistance element and that of a second magnetoresistance element of the magnetic sensor according to the ninth preferred embodiment of the present invention. In FIGS. 31 and 32, the inner peripheral edges and the outer peripheral edges of first magnets are indicated by the dotted lines.

As shown in FIG. 31, a magnetic sensor 6 according to the ninth preferred embodiment of the present invention includes a circuit substrate 600 and two first magnets 40a provided above the circuit substrate 600. In the magnetic sensor 6 according to the ninth preferred embodiment of the present invention, a gap is provided between a first base section 41 of the first magnet 40a and the circuit substrate 600 all around the outer peripheral portion of the first magnet 40a. A first stress relaxer is provided in the entirety of this gap.

As shown in FIGS. 31 and 32, a pattern 620 of each of first magnetoresistance elements 620a and 620b of the magnetic sensor 6 according to the ninth preferred embodiment of the present invention includes one first pattern. The first pattern is a C-shaped pattern 621 located along an imaginary C-shaped feature $C_{61}$, which is opened at a portion where wiring 146, 148, 150, and 152 is positioned, on the circumference of an imaginary circle $C_6$, as viewed from the direction perpendicular or substantially perpendicular to the insulating layer 30. As the distance between the inner peripheral edge of each of the first magnetoresistance elements 620a and 620b and the outer peripheral edge of the first base section 41 of the first magnet 40a, a sufficiently large distance is provided so that the first magnetoresistance elements 620a and 620b do not overlap the first magnets 40a even if the positions of the first magnets 40a when being formed by plating are varied.

As shown in FIG. 31, the orientation of the circumferential direction of the first magnetoresistance element 620a and that of the first magnetoresistance element 620b are different from each other so that the orientations of the imaginary C-shaped features $C_{61}$ become different. That is, the orientation of the circumferential direction of the pattern 620 of the first magnetoresistance element 620a and that of the first magnetoresistance element 620b are different from each other so that the orientation of the C-shaped pattern 621 of the first magnetoresistance element 620a and that of the first magnetoresistance element 620b become different.

In the ninth preferred embodiment, the orientation of the circumferential direction of the pattern 620 of the first magnetoresistance element 620a and that of the first magnetoresistance element 620b differ from each other by about 135°, for example, so that the orientation of the C-shaped pattern 621 of the first magnetoresistance element 620a and that of the first magnetoresistance element 620b become different from each other by about 135°, for example.

As shown in FIG. 31, as viewed from the direction perpendicular or substantially perpendicular to the insulating layer 30, a second magnetoresistance element 630a is positioned at the central side of the imaginary circle $C_6$ and is surrounded by the first magnetoresistance element 620a, while a second magnetoresistance element 630b is positioned at the central side of the imaginary circle $C_6$ and is surrounded by the first magnetoresistance element 620b. That is, as viewed from the direction perpendicular or substantially perpendicular to the insulating layer 30, the second magnetoresistance element 630a is located farther inward than the inner peripheral edge of the first magnetoresistance element 620a, while the second magnetoresistance element 630b is located farther inward than the inner peripheral edge of the first magnetoresistance element 620b.

Each of the second magnetoresistance elements 630a and 630b has a pattern 630. The pattern 630 includes two arc patterns 631, which are second patterns, provided along the circumference of the imaginary circle $C_6$ line-symmetrically to each other and side by side one another in the radial direction of the imaginary circle $C_6$. The two arc patterns 631 are connected with each other at one end by a semicircular pattern 632 and at the other end by a semi-circular pattern 633. In the second magnetoresistance element 630a, the arc pattern 631 positioned on the outermost side from the center of the imaginary circle $C_6$ is connected to the wiring 146 and 148 by a linearly extending portion 634 having a length shorter than about 10 µm, for example. In the second magnetoresistance element 630b, the arc pattern 631 positioned on the outermost side from the center of the imaginary circle $C_6$ is connected to the wiring 150 and 152 by a linearly extending portion 634 having a length shorter than about 10 µm, for example.

In the second magnetoresistance element 630a and 630b, as the distance between the inner peripheral edge of the arc pattern 631 positioned closer to the center of the imaginary circle $C_6$ and the outer peripheral edge of the first narrow section 42 of the first magnet 40a, a sufficiently large distance is provided so that the second magnetoresistance elements 630a and 630b do not overlap the first narrow sections 42 of the first magnets 40a even if the positions of the first magnets 40a when being formed by plating are varied.

The patterns 630 of the second magnetoresistance elements 630a and 630b have the same or substantially the same thickness as the patterns 620 of the first magnetoresistance elements 620a and 620b. However, the patterns 630 may be thinner than the patterns 620.

In the magnetic sensor 6 according to the ninth preferred embodiment, each of the second magnetoresistance elements 630a and 630b has the arc patterns 631. The arc patterns 631 are formed of arcs. The two adjacent arc patterns 631 are connected with each other by the semicircular patterns 632 and 633. Each of the second magnetoresistance elements 630a and 630b includes the linearly extending portion 634 merely having a length shorter than about 10 µm, for example. Thus, the anisotropic characteristics in detecting a magnetic field are able to be significantly reduced.

The orientation of the circumferential direction of the pattern 630 of the second magnetoresistance element 630a and that of the second magnetoresistance element 630b are different from each other. In the ninth preferred embodiment, the orientation of the circumferential direction of the pattern 630 of the second magnetoresistance element 630a and that of the second magnetoresistance element 630b are different from each other by about 135°. Accordingly, the anisotropic characteristics of the magnetoresistance effect of the second magnetoresistance element 630a and that of the second magnetoresistance element 630b are able to be offset from each other and be reduced to a smaller level.

In the magnetic sensor 6 according to the ninth preferred embodiment, too, the second magnetoresistance elements 630a and 630b are provided inward of the first magnetoresistance elements 620a and 620b, respectively, and thus the size of the magnetic sensor 6 is able to be significantly reduced. Additionally, in the magnetic sensor 6, too, it is not necessary to three-dimensionally lay the wiring to connect the first magnetoresistance elements 620a and 620b and the second magnetoresistance elements 630a and 630b. Thus, the circuit substrate 600 is able to be manufactured with a simple manufacturing process.

As shown in FIG. 31, the first magnets 40a do not cover the first magnetoresistance elements 620a and 620b, but cover the second magnetoresistance elements 630a and 630b, as viewed from the direction perpendicular or substantially perpendicular to the insulating layer 30.

The magnetic sensor 6 according to the ninth preferred embodiment is also able to detect a vertical magnetic field and a horizontal magnetic field with high sensitivity. In the magnetic sensor 6 according to the ninth preferred embodiment of the present invention, each of the first magnetoresistance elements 620a and 620b includes the first pattern provided along the circumference thereof, thus improving the isotropic characteristics in detecting a horizontal magnetic field.

In this preferred embodiment, the second magnetoresistance elements 630a and 630b are magnetically shielded by the first magnets 40a and hardly detect vertical magnetic fields and horizontal magnetic fields. The resistance change rate of the second magnetoresistance elements 630a and 630b may not necessarily be smaller than that of the first magnetoresistance elements 620a and 620b.

The magnetic sensor 6 according to the ninth preferred embodiment of the present invention also provides high isotropic characteristics in detecting a horizontal magnetic field and is also able to detect a weak vertical magnetic field by using magnetoresistance elements. The magnetic sensor 6 is also able to regulate a decrease in the output accuracy, which would be caused by a stress applied to the magnetoresistance elements from a structure provided above the magnetoresistance elements.

In the magnetic sensor 6 according to the ninth preferred embodiment, as the distance between the inner peripheral edge of each of the first magnetoresistance elements 620a and 620b and the outer peripheral edge of the first base section 41 of the first magnet 40a, a sufficiently large distance is provided so that the first magnetoresistance elements 620a and 620b do not overlap the first magnets 40a even if the positions of the first magnets 40a when being formed by plating are varied. Thus, a stress is less likely to be applied from the first magnets 40a to the first magnetoresistance elements 620a and 620b via the corresponding stress relaxers.

In the magnetic sensor 6 according to the ninth preferred embodiment, as the distance between the inner peripheral edge of the arc pattern 631 positioned closer to the center of the imaginary circle $C_6$ and the outer peripheral edge of the first narrow section 42 of the first magnet 40a, a sufficiently large distance is provided so that the second magnetoresistance elements 630a and 630b do not overlap the first narrow sections 42 of the first magnets 40a even if the positions of the first magnets 40a when being formed by plating are varied. Thus, a stress is less likely to be applied from the first narrow sections 42 of the first magnets 40a to the second magnetoresistance elements 630a and 630b.

Tenth Preferred Embodiment

A magnetic sensor according to a tenth preferred embodiment of the present invention will be described below with reference to the drawings. The magnetic sensor according to the tenth preferred embodiment of the present invention is different from the magnetic sensor 6 of the ninth preferred embodiment of the present invention mainly in the pattern of the first magnetoresistance elements and the first magnets. An explanation of elements similar to those of the magnetic sensor 6 of the ninth preferred embodiment of the present invention will not be repeated.

Figure 33:
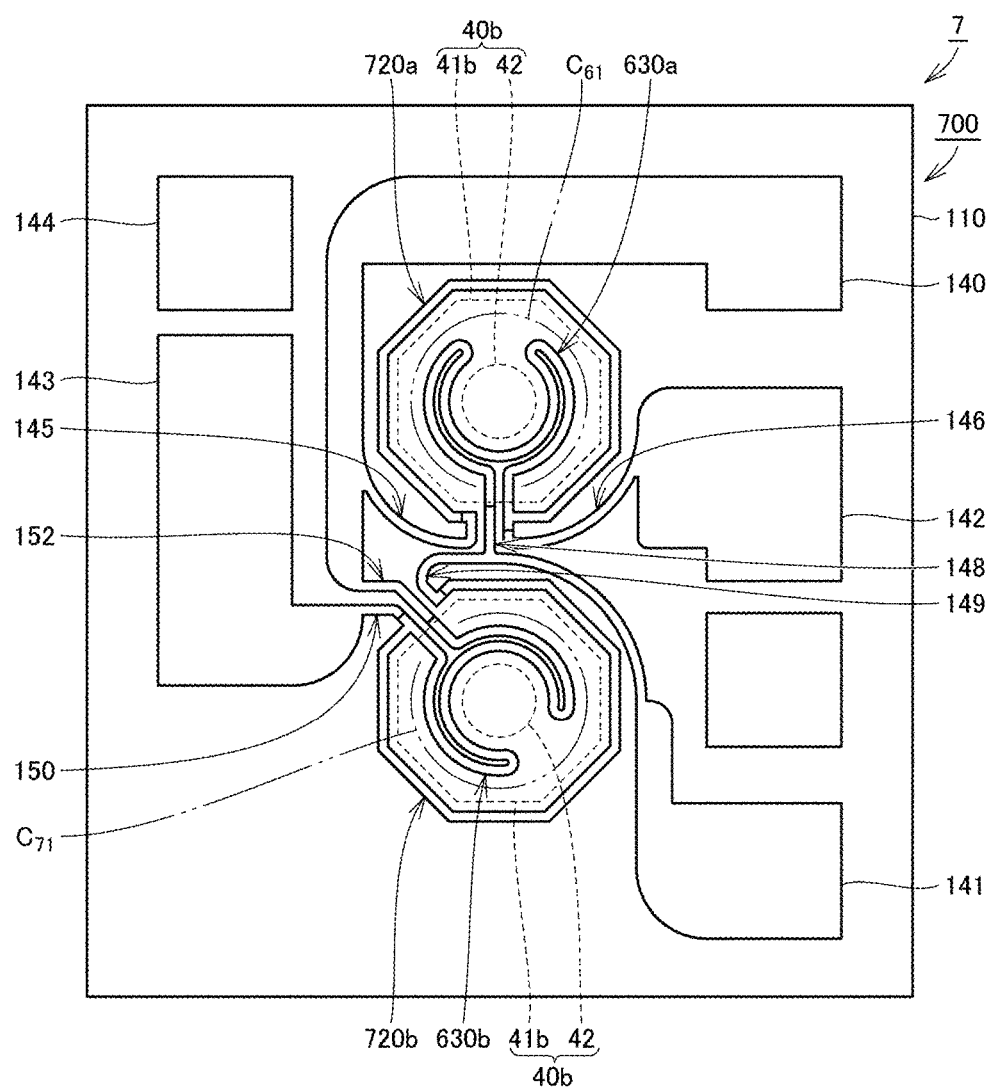
FIG. 33 is a plan view of a magnetic sensor according to a tenth preferred embodiment of the present invention.
Figure 34:
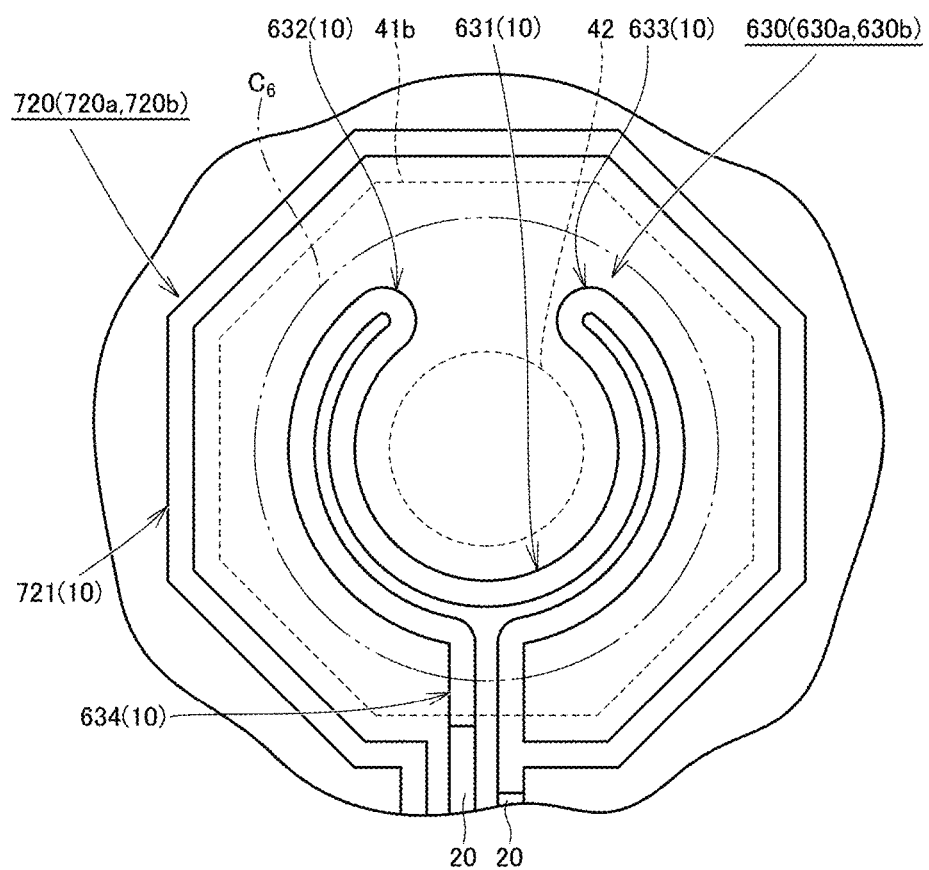
FIG. 34 is a plan view showing a pattern of a first magnetoresistance element and that of a second magnetoresistance element of the magnetic sensor according to the tenth preferred embodiment of the present invention.

FIG. 33 is a plan view of the magnetic sensor according to the tenth preferred embodiment of the present invention. FIG. 34 is a plan view showing a pattern of a first magnetoresistance element and that of a second magnetoresistance element of the magnetic sensor according to the tenth preferred embodiment of the present invention. In FIGS. 33 and 34, the inner peripheral edges and the outer peripheral edges of the first magnets are indicated by the dotted lines.

As shown in FIG. 33, a magnetic sensor 7 according to the tenth preferred embodiment of the present invention includes a circuit substrate 700 and two first magnets 40b provided above the circuit substrate 700. Each first magnet 40b includes a first base section 41b and a first narrow section 42. The area of the exterior surface of the first narrow section 42 as viewed from the direction perpendicular or substantially perpendicular to the insulating layer 30 is smaller than that of the first base section 41b. The first base section 41b as viewed from the direction perpendicular or substantially perpendicular to the insulating layer 30 preferably has an externally octagonal shape, for example. In the magnetic sensor 7 according to the tenth preferred embodiment of the present invention, a gap is provided between the first base section 41b of the first magnet 40b and the circuit substrate 700 all around the outer peripheral portion of the first magnet 40b. A first stress relaxer is provided in the entirety or substantially the entirety of the gap.

As shown in FIGS. 33 and 34, a pattern 720 of each of first magnetoresistance elements 720a and 720b of the magnetic sensor 7 according to the tenth preferred embodiment of the present invention includes one first pattern. The first pattern is a C-shaped pattern 721 located along an imaginary C-shaped feature $C_{61}$, which is opened at a portion where wiring 146, 148, 150, and 152 is positioned, on the circumference of an imaginary circle $C_6$, as viewed from the direction perpendicular or substantially perpendicular to the insulating layer 30. As the distance between the inner peripheral edge of each of the first magnetoresistance elements 720a and 720b and the outer peripheral edge of the first base section 41b of the first magnet 40b, a sufficiently large distance is provided so that the first magnetoresistance elements 720a and 720b do not overlap the first magnets 40b even if the positions of the first magnets 40b when being formed by plating are varied.

As shown in FIG. 33, the orientation of the circumferential direction of the first magnetoresistance element 720a and that of the first magnetoresistance element 720b are different from each other so that the orientations of the imaginary C-shaped features $C_{61}$ become different. That is, the orientation of the circumferential direction of the pattern 720 of the first magnetoresistance element 720a and that of the first magnetoresistance element 720b are different from each other so that the orientation of the C-shaped pattern 721 of the first magnetoresistance element 720a and that of the first magnetoresistance element 720b become different.

In the tenth preferred embodiment, the orientation of the circumferential direction of the pattern 720 of the first magnetoresistance element 720a and that of the first magnetoresistance element 720b differ from each other by about 135°, for example, so that the orientation of the C-shaped pattern 721 of the first magnetoresistance element 720a and that of the first magnetoresistance element 720b become different from each other by about 135°, for example.

The patterns 630 of the second magnetoresistance elements 630a and 630b preferably have the same or substantially the same thickness as the patterns 720 of the first magnetoresistance elements 720a and 720b. However, the patterns 630 may be thinner than the patterns 720.

In the magnetic sensor 7 according to the tenth preferred embodiment, the second magnetoresistance elements 630a and 630b are provided inward of the first magnetoresistance elements 720a and 720b, respectively, and thus the size of the magnetic sensor is able to be significantly reduced. Additionally, in the magnetic sensor 7, too, it is not necessary to three-dimensionally lay the wiring to connect the first magnetoresistance elements 720a and 720b and the second magnetoresistance elements 630a and 630b. Thus, the circuit substrate 700 is able to be manufactured with a simple manufacturing process.

As shown in FIG. 33, the first magnets 40b do not cover the first magnetoresistance elements 720a and 720b, but cover the second magnetoresistance elements 630a and 630b, as viewed from the direction perpendicular or substantially perpendicular to the insulating layer 30.

The magnetic sensor 7 according to the tenth preferred embodiment is also able to detect a vertical magnetic field and a horizontal magnetic field with high sensitivity. In the magnetic sensor 7 according to the tenth preferred embodiment of the present invention, each of the first magnetoresistance elements 720a and 720b includes the first pattern provided along the circumference thereof, thus improving the isotropic characteristics in detecting a horizontal magnetic field.

In the tenth preferred embodiment, the second magnetoresistance elements 630a and 630b are magnetically shielded by the first magnets 40b and hardly detect vertical magnetic fields and horizontal magnetic fields. The resistance change rate of the second magnetoresistance elements 630a and 630b may not necessarily be smaller than that of the first magnetoresistance elements 720a and 720b.

The magnetic sensor 7 according to the tenth preferred embodiment of the present invention also provides high isotropic characteristics in detecting a horizontal magnetic field and is also able to detect a weak vertical magnetic field by using magnetoresistance elements. The magnetic sensor 7 is also able to regulate a decrease in the output accuracy, which would be caused by a stress applied to the magnetoresistance elements from a structure provided above the magnetoresistance elements.

In the magnetic sensor 7 according to the tenth preferred embodiment, as the distance between the inner peripheral edge of each of the first magnetoresistance elements 720a and 720b and the outer peripheral edge of the first base section 41b of the first magnet 40b, a sufficiently large distance is provided so that the first magnetoresistance elements 720a and 720b do not overlap the first magnets 40b even if the positions of the first magnets 40b when being formed by plating are varied. Thus, a stress is less likely to be applied from the first magnets 40b to the first magnetoresistance elements 720a and 720b via the corresponding stress relaxers.

Eleventh Preferred Embodiment

A magnetic sensor according to an eleventh preferred embodiment of the present invention will be described below with reference to the drawings. The magnetic sensor according to the eleventh preferred embodiment of the present invention is different from the magnetic sensor 6 of the ninth preferred embodiment of the present invention mainly in the pattern of the second magnetoresistance elements and the first magnets. An explanation of elements similar to those of the magnetic sensor 6 of the ninth preferred embodiment of the present invention will not be repeated.

Figure 35:
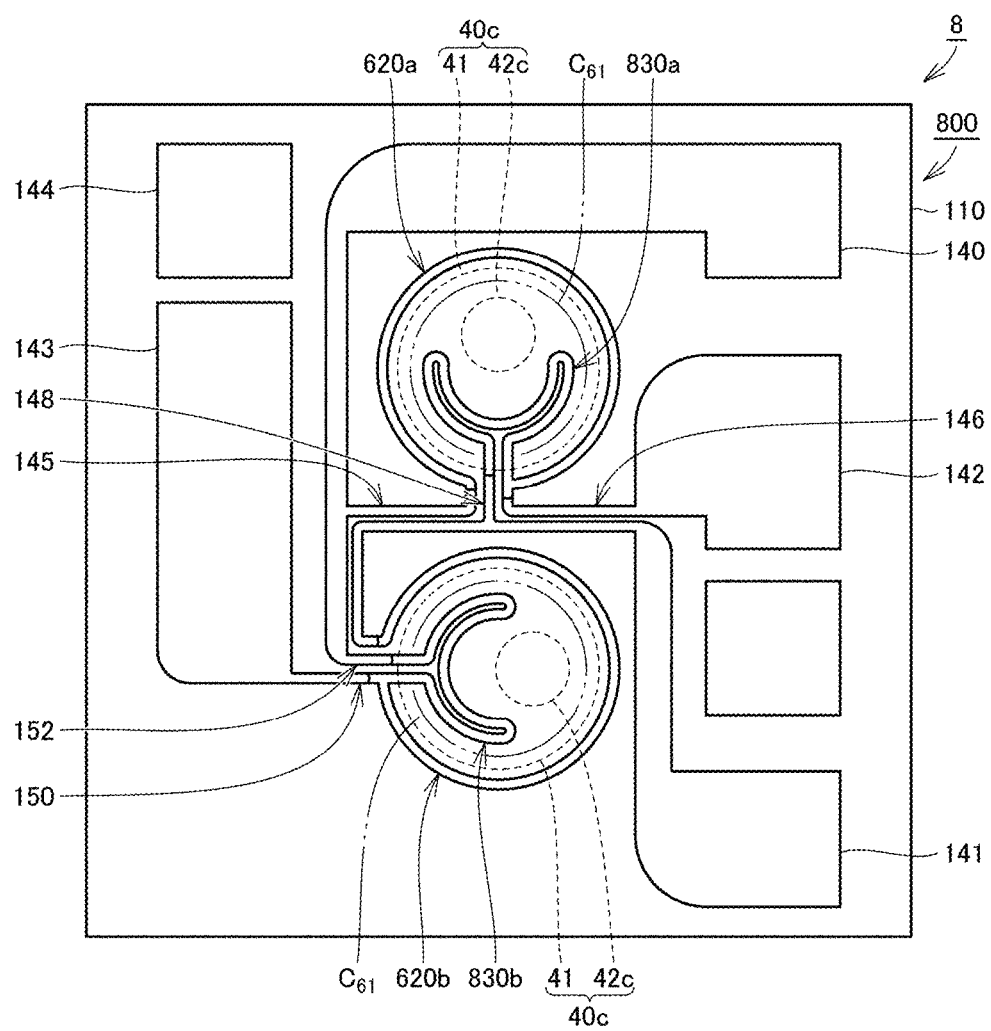
FIG. 35 is a plan view of a magnetic sensor according to an eleventh preferred embodiment of the present invention.
Figure 36:
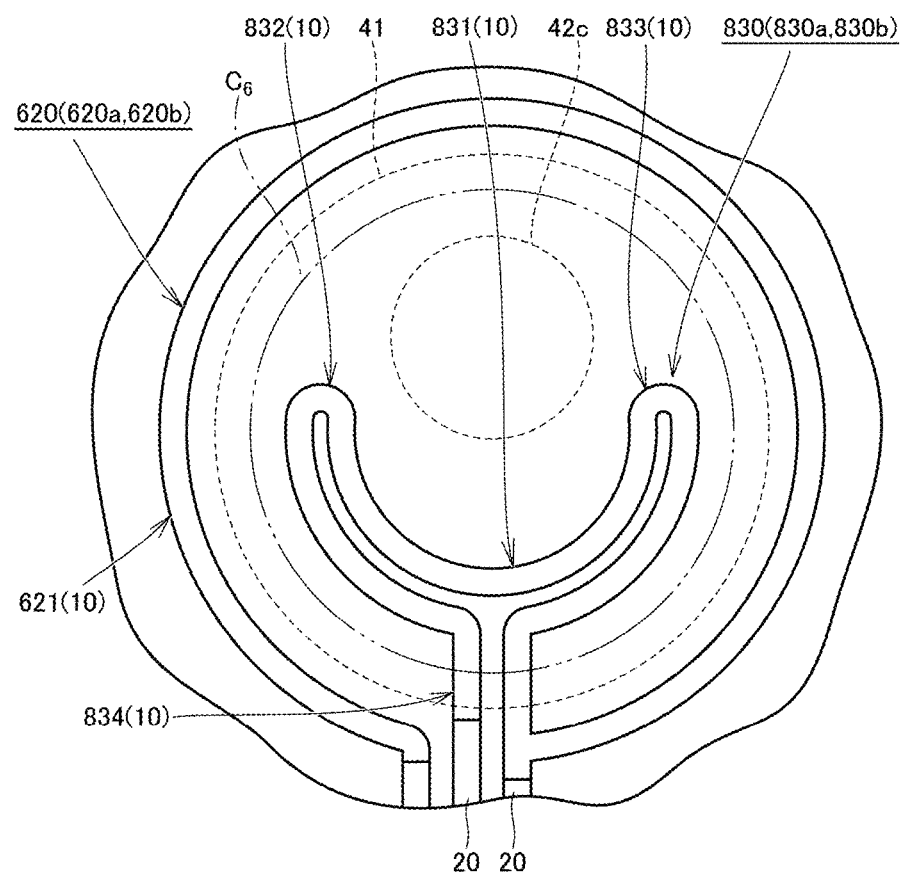
FIG. 36 is a plan view showing a pattern of a first magnetoresistance element and that of a second magnetoresistance element of the magnetic sensor according to the eleventh preferred embodiment of the present invention.

FIG. 35 is a plan view of the magnetic sensor according to the eleventh preferred embodiment of the present invention. FIG. 36 is a plan view showing a pattern of a first magnetoresistance element and that of a second magnetoresistance element of the magnetic sensor according to the eleventh preferred embodiment of the present invention. In FIGS. 35 and 36, the inner peripheral edges and the outer peripheral edges of the first magnets are indicated by the dotted lines.

As shown in FIG. 35, a magnetic sensor 8 according to the eleventh preferred embodiment of the present invention includes a circuit substrate 800 and two first magnets 40c provided above the circuit substrate 800. Each first magnet 40c includes a first base section 41 and a first narrow section 42c. The area of the exterior surface of the first narrow section 42c as viewed from the direction perpendicular or substantially perpendicular to the insulating layer 30 is smaller than that of the first base section 41. The first base section 41 and the first narrow section 42c as viewed from the direction perpendicular or substantially perpendicular to the insulating layer 30 each have an externally circular shape. The first narrow section 42c is eccentric from the first base section 41, as viewed from the direction perpendicular or substantially perpendicular to the insulating layer 30. In the magnetic sensor 8 according to the eleventh preferred embodiment of the present invention, a gap is provided between the first base section 41 of the first magnet 40c and the circuit substrate 800 all around the outer peripheral portion of the first magnet 40c. A first stress relaxer is provided in the entirety of this gap.

As shown in FIG. 36, as viewed from the direction perpendicular or substantially perpendicular to the insulating layer 30, a second magnetoresistance element 830a is positioned at the central side of the imaginary circle $C_6$ and is surrounded by a first magnetoresistance element 620a, while a second magnetoresistance element 830b is positioned at the central side of the imaginary circle $C_6$ and is surrounded by a first magnetoresistance element 620b. That is, as viewed from the direction perpendicular or substantially perpendicular to the insulating layer 30, the second magnetoresistance element 830a is located farther inward than the inner peripheral edge of the first magnetoresistance element 620a, while the second magnetoresistance element 830b is located farther inward than the inner peripheral edge of the first magnetoresistance element 620b.

Each of the second magnetoresistance elements 830a and 830b has a pattern 830. The pattern 830 includes two arc patterns 831, which are second patterns, provided along the circumference of the imaginary circle $C_6$ line-symmetrically to each other and side by side one another in the radial direction of the imaginary circle $C_6$. The two arc patterns 831 are connected with each other at one end by a semi-circular pattern 832 and at the other end by a semi-circular pattern 833. In the second magnetoresistance element 830a, the arc pattern 831 positioned on the outermost side from the center of the imaginary circle $C_6$ is connected to the wiring 146 and 148 by a linearly extending portion 834 having a length shorter than about 10 μm, for example. In the second magnetoresistance element 830b, the arc pattern 831 positioned on the outermost side from the center of the imaginary circle $C_6$ is connected to the wiring 150 and 152 by a linearly extending portion 834 having a length shorter than about 10 μm, for example.

In the second magnetoresistance element 830a, as the distance between the inner peripheral edge of the arc pattern 831 positioned closer to the center of the imaginary circle $C_6$ and the outer peripheral edge of the first narrow section 42c of the first magnet 40c, a sufficiently large distance is provided so that the second magnetoresistance elements 830a and 830b do not overlap the first narrow sections 42c of the first magnets 40c even if the positions of the first magnets 40c when being formed by plating are varied.

The patterns 830 of the second magnetoresistance elements 830a and 830b preferably have the same or substantially the same thickness as the patterns 620 of the first magnetoresistance elements 620a and 620b. However, the patterns 830 may be thinner than the patterns 620.

In the magnetic sensor 8 according to the eleventh preferred embodiment, each of the second magnetoresistance elements 830a and 830b has the arc patterns 831. The arc patterns 831 are formed of arcs. The two adjacent arc patterns 831 are connected with each other by the semicircular patterns 832 and 833. Each of the second magnetoresistance elements 830a and 830b includes the linearly extending portion 834 merely having a length shorter than about 10 μm. Accordingly, the anisotropic characteristics in detecting a magnetic field are able to be significantly reduced.

The orientation of the circumferential direction of the pattern 830 of the second magnetoresistance element 830a and that of the second magnetoresistance element 830b are different from each other. In the eleventh preferred embodiment, the orientation of the circumferential direction of the pattern 830 of the second magnetoresistance element 830a and that of the second magnetoresistance element 830b are different from each other by about 135°, for example. Accordingly, the anisotropic characteristics of the magnetoresistance effect of the second magnetoresistance element 830a and that of the second magnetoresistance element 830b are able to be offset from each other and be reduced to a smaller level.

In the magnetic sensor 8 according to the eleventh preferred embodiment, too, the second magnetoresistance elements 830a and 830b are provided inward of the first magnetoresistance elements 620a and 620b, respectively, and thus the size of the magnetic sensor 8 is able to be significantly reduced. Additionally, in the magnetic sensor 8, too, it is not necessary to three-dimensionally lay the wiring to connect the first magnetoresistance elements 620a and 620b and the second magnetoresistance elements 830a and 830b. Thus, the circuit substrate 800 is able to be manufactured with a simple manufacturing process.

As shown in FIG. 35, the first magnets 40c do not cover the first magnetoresistance elements 620a and 620b, but cover the second magnetoresistance elements 830a and 830b, as viewed from the direction perpendicular or substantially perpendicular to the insulating layer 30.

In the eleventh preferred embodiment, the second magnetoresistance elements 830a and 830b are magnetically shielded by the first magnets 40c and hardly detect vertical magnetic fields and horizontal magnetic fields. The resistance change rate of the second magnetoresistance elements 830a and 830b may not necessarily be smaller than that of the first magnetoresistance elements 620a and 620b.

The magnetic sensor 8 according to the eleventh preferred embodiment of the present invention also provides high isotropic characteristics in detecting a horizontal magnetic field and is also able to detect a weak vertical magnetic field by using magnetoresistance elements. The magnetic sensor 8 is also able to regulate a decrease in the output accuracy, which would be caused by a stress applied to the magnetoresistance elements from a structure provided above the magnetoresistance elements.

In the magnetic sensor 8 according to the eleventh preferred embodiment, as the distance between the inner peripheral edge of the arc pattern 831 positioned closer to the center of the imaginary circle $C_6$ and the outer peripheral edge of the first narrow section 42c of the first magnet 40c, a sufficiently large distance is provided so that the second magnetoresistance elements 830a and 830b do not overlap the first narrow sections 42c of the first magnets 40c even if the positions of the first magnets 40c when being formed by plating are varied. Thus, a stress is less likely to be applied from the first narrow sections 42c of the first magnets 40c to the second magnetoresistance elements 830a and 830b.

In the magnetic sensor 8 according to the eleventh preferred embodiment, the first narrow section 42c is eccentric from the first base section 41, as viewed from the direction perpendicular or substantially perpendicular to the insulating layer 30. Accordingly, as viewed from the direction perpendicular or substantially perpendicular to the insulating layer 30, the shortest distance between the center of the first narrow section 42c and the second magnetoresistance elements 830a and 830b is longer than that between the center of the first base section 41 and the second magnetoresistance elements 830a and 830b. Thus, the second magnetoresistance elements 830a and 830b are able to be located immediately under a vicinity of the center of the first base section 41 of the first magnet 40c which exhibits a high shielding effect, while a stress is even less likely to be applied from the first narrow section 42c of the first magnet 40c to the second magnetoresistance elements 830a and 830b.

In the above-described preferred embodiments, some of the features, components, and elements may be combined with each other within a technically possible range.

The preferred embodiments described herein are provided only for the purposes of illustration, but are not intended to be exhaustive or to limit the invention to the precise forms disclosed. It is intended that the scope of the invention be defined, not by the foregoing preferred embodiments, but by the following claims. The scope of the present invention is to be accorded the broadest interpretation to encompass all such modifications and equivalent structures and functions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
   a magneto-sensitive element;
   an insulating layer that covers the magneto-sensitive element;
   a first conductor that is provided on the insulating layer;
   a first magnet that is provided on the first conductor and covers the first conductor, as viewed from a direction perpendicular or substantially perpendicular to the insulating layer; and
   a member that is provided along a portion of the first conductor and is made of a material different from a material of the first conductor; wherein
   the first conductor includes a first base section and a first narrow section, an area of an exterior surface of the first narrow section as viewed from the direction perpendicular or substantially perpendicular to the insulating layer being smaller than an area of an exterior surface of the first base section;
   the first base section and the first narrow section are provided side by side in the direction perpendicular or substantially perpendicular to the insulating layer; and
   the member, which is made of a material different from the material of the first conductor, is provided in a region which is surrounded by the exterior surface of the first narrow section and also by the exterior surface of the first base section, as viewed from the direction perpendicular or substantially perpendicular to the insulating layer.

2. The magnetic sensor according to claim 1, wherein
in the direction perpendicular or substantially perpendicular to the insulating layer, the first narrow section of the first conductor is provided at an end portion of the first conductor closer to the insulating layer; and
the member is provided between the first base section and the insulating layer.

3. The magnetic sensor according to claim 1, wherein
in the direction perpendicular or substantially perpendicular to the insulating layer, the first narrow section of the first conductor is provided at an end portion of the first conductor closer to the first magnet; and
the member is provided between the first base section and the first magnet.

4. The magnetic sensor according to claim 1, wherein
in the direction perpendicular or substantially perpendicular to the insulating layer, the first base section of the first conductor is provided at an end portion of the first conductor closer to the insulating layer and is also provided at another end portion of the first conductor closer to the first magnet;
in the direction perpendicular or substantially perpendicular to the insulating layer, the first narrow section of the first conductor is sandwiched between the first base sections of the first conductor; and
the member is sandwiched between the first base sections.

5. The magnetic sensor according to claim 1, wherein the member is a stress relaxer.

6. The magnetic sensor according to claim 1, wherein
a first magnetoresistance element is provided as the magneto-sensitive element;
the magnetic sensor further includes a second magnetoresistance element that is electrically connected to the first magnetoresistance element to define a bridge circuit; and
the second magnetoresistance element is covered by the insulating layer.

7. The magnetic sensor according to claim 6, wherein
the first magnetoresistance element has an outer peripheral edge; and
the first magnet is provided in a region farther inward than the outer peripheral edge of the magneto-sensitive element, as viewed from the direction perpendicular or substantially perpendicular to the insulating layer.

8. The magnetic sensor according to claim 7, wherein
the first magnetoresistance element also has an inner peripheral edge; and
the second magnetoresistance element is provided in a second region farther inward than the inner peripheral edge of the first magnetoresistance element and is covered by the first magnet, as viewed from the direction perpendicular or substantially perpendicular to the insulating layer.

9. The magnetic sensor according to claim 7, further comprising:
a second conductor that is provided on the insulating layer, the second conductor being different from the first conductor, as viewed from the direction perpendicular or substantially perpendicular to the insulating layer; and
a second magnet that is provided on the second conductor and covers the second conductor, as viewed from the direction perpendicular or substantially perpendicular to the insulating layer, the second magnet being different from the first magnet; wherein
the second magnetoresistance element is provided in a region farther outward than the outer peripheral edge of the first magnetoresistance element and is covered by the second magnet.

10. The magnetic sensor according to claim 9, wherein
the second conductor includes a second base section and a second narrow section, an area of an exterior surface of the second narrow section as viewed from the direction perpendicular or substantially perpendicular to the insulating layer being smaller than an area of an exterior surface of the second base section; and
in the second conductor, the second base section and the second narrow section are provided side by side in the direction perpendicular or substantially perpendicular to the insulating layer.

11. The magnetic sensor according to claim 10, wherein, in the direction perpendicular or substantially perpendicular to the insulating layer, the second narrow section of the second conductor is provided at an end portion of the second conductor closer to the insulating layer.

12. The magnetic sensor according to claim 10, wherein, in the direction perpendicular or substantially perpendicular to the insulating layer, the second narrow section of the second conductor is provided at an end portion of the second conductor closer to the second magnet.

13. The magnetic sensor according to claim 10, wherein
in the direction perpendicular or substantially perpendicular to the insulating layer, the second base section of the second conductor is provided at an end portion of the second conductor closer to the insulating layer and is also provided at another end portion of the second conductor closer to the second magnet; and
in the direction perpendicular or substantially perpendicular to the insulating layer, the second narrow section of the second conductor is sandwiched between the second base sections of the second conductor.

14. A magnetic sensor comprising:
a magneto-sensitive element;
an insulating layer that covers the magneto-sensitive element;
a first magnet that is provided on the insulating layer; and
a stress relaxer that is provided along a portion of the first magnet and is made of a material different from a material of the first magnet; wherein
the magneto-sensitive element has an outer peripheral edge;
the first magnet is provided in a region farther inward than the outer peripheral edge of the magneto-sensitive element, as viewed from a direction perpendicular or substantially perpendicular to the insulating layer;
the first magnet includes a first base section and a first narrow section, an area of an exterior surface of the first narrow section as viewed from the direction perpendicular or substantially perpendicular to the insulating layer being smaller than an area of an exterior surface of the first base section;
in the first magnet, the first base section and the first narrow section are provided side by side in the direction perpendicular or substantially perpendicular to the insulating layer;
in the direction perpendicular or substantially perpendicular to the insulating layer, the first narrow section of the first magnet is provided at an end portion of the first magnet closer to the insulating layer; and as viewed from the direction perpendicular or substantially perpendicular to the insulating layer, the stress relaxer is provided in a region which is surrounded by the exterior surface of the first narrow section and also by the exterior surface of the first base section, and is provided between the first base section and the insulating layer.

15. The magnetic sensor according to claim 14, wherein
a first magnetoresistance element is provided as the magneto-sensitive element;
the magnetic sensor further includes a second magnetoresistance element that is electrically connected to the first magnetoresistance element to define a bridge circuit; and
the second magnetoresistance element is covered by the insulating layer.

16. The magnetic sensor according to claim 15, wherein
the first magnetoresistance element also has an inner peripheral edge; and
as viewed from the direction perpendicular or substantially perpendicular to the insulating layer, the second magnetoresistance element is provided in a region farther inward than the inner peripheral edge of the first magnetoresistance element and is covered by the first magnet.

17. The magnetic sensor according to claim 15, further comprising:
a second magnet that is provided on the insulating layer, the second magnet being different from the first magnet;
wherein the second magnetoresistance element is provided in a region farther outward than the outer peripheral edge of the first magnetoresistance element and is covered by the second magnet.

18. The magnetic sensor according to claim 1, wherein the member includes Au or polyimide.

19. The magnetic sensor according to claim 9, further comprising a second member that is provided along a portion of the second conductor and includes a second material different from a second material of the second conductor.

* * * * *